US012563932B2

(12) United States Patent　　　(10) Patent No.:　US 12,563,932 B2
Cho et al.　　　　　　　　　　　　(45) Date of Patent:　Feb. 24, 2026

(54) DISPLAY DEVICE

(71) Applicant: SAMSUNG DISPLAY CO., LTD.,
　　　　　　Yongin-si (KR)

(72) Inventors: Jaehyung Cho, Yongin-si (KR);
　　　　　　Seonyoung Choi, Yongin-si (KR);
　　　　　　Gyungsoon Park, Yongin-si (KR)

(73) Assignee: SAMSUNG DISPLAY CO., LTD.,
　　　　　　Gyeonggi-Do (KR)

( * ) Notice:　Subject to any disclaimer, the term of this
　　　　　　patent is extended or adjusted under 35
　　　　　　U.S.C. 154(b) by 465 days.

(21) Appl. No.: 18/159,325

(22) Filed:　　Jan. 25, 2023

(65)　　　　　Prior Publication Data

US 2023/0247879 A1　　Aug. 3, 2023

(30)　　　Foreign Application Priority Data

Jan. 28, 2022　(KR) ........................ 10-2022-0013612

(51) Int. Cl.
　　*H10K 59/131*　　　(2023.01)
　　*H10K 59/121*　　　(2023.01)
(52) U.S. Cl.
　　CPC ..... *H10K 59/1315* (2023.02); *H10K 59/1213*
　　　　　　(2023.02); *H10K 59/1216* (2023.02)
(58) Field of Classification Search
　　CPC ..................... H10K 59/131; G09G 2300/0426
　　See application file for complete search history.

(56)　　　　　References Cited

U.S. PATENT DOCUMENTS

| | | | |
|---|---|---|---|
| 9,773,466 | B2 | 9/2017 | Wang |
| 10,050,093 | B2 | 8/2018 | Jeong et al. |
| 11,108,005 | B2 | 8/2021 | Sun et al. |
| 2007/0176171 | A1* | 8/2007 | Kim .................... H10K 59/131 |
| | | | 257/40 |
| 2020/0343463 | A1 | 10/2020 | Lee et al. |
| 2021/0057659 | A1 | 2/2021 | Sun et al. |
| 2021/0343955 | A1 | 11/2021 | Kim et al. |

FOREIGN PATENT DOCUMENTS

| | | |
|---|---|---|
| CN | 112785962 A | 5/2021 |
| KR | 1020200038800 A | 4/2020 |
| KR | 1020200124852 A | 11/2020 |
| KR | 20210017145 A | 2/2021 |
| KR | 102224743 B1 | 3/2021 |

* cited by examiner

*Primary Examiner* — Kevin M Nguyen
(74) *Attorney, Agent, or Firm* — CANTOR COLBURN LLP

(57)　　　　　　ABSTRACT
A display device includes a substrate including a display area and a non-display area including a driving circuit area, and a wiring area, the wiring area including a first wiring area and a second wiring area respectively disposed on opposite sides of the driving circuit area in a first direction, and a circuit layer disposed on the substrate, the circuit layer including a driving circuit overlapping the driving circuit area and a wiring line overlapping the wiring area and electrically connected to the driving circuit. A first opening area is defined in the display area, and a second opening area is defined between the driving circuit area and the wiring area. A width of the driving circuit area and a width of the wiring area are equal to each other.

10 Claims, 36 Drawing Sheets

DISPLAY DEVICE

This application claims priority to Korean Patent Application No. 10-2022-0013612, filed on Jan. 28, 2022, and all the benefits accruing therefrom under 35 U.S.C. § 119, the content of which in its entirety is herein incorporated by reference.

BACKGROUND

1. Field

Embodiments relate to a display device.

2. Description of the Related Art

As display devices that visually display electrical signals develop, various display devices having excellent characteristics such as reduced thickness, less weight, and small power consumption are being introduced. Flexible display devices that may be folded or rolled into a roll shape have been introduced, for example. Recently, research and development on a stretchable display device that may be changed into various shapes is actively progressing.

A display device may include a display area in which a pixel circuit and a light-emitting element electrically connected to the pixel circuit are arranged, and a non-display area in which a driving circuit for applying an electrical signal to the pixel circuit is arranged.

SUMMARY

Embodiments include a display device that is capable of being deformed into various shapes in both a display area and a non-display area.

Additional features will be set forth in part in the description which follows and, in part, will be apparent from the description, or may be learned by practice of the presented embodiments of the invention.

According to an embodiment of the invention, a display device includes a substrate including a display area and a non-display area including a driving circuit area and a wiring area including a first wiring area and a second wiring area respectively disposed on opposite sides of the driving circuit area in a first direction, and a circuit layer disposed on the substrate. The circuit layer includes a driving circuit overlapping the driving circuit area and a wiring line overlapping the wiring area and electrically connected to the driving circuit. A first opening area is defined in the display area, and a second opening area is defined between the driving circuit area and the wiring area. A width of the driving circuit area and a width of the wiring area are equal to each other.

In an embodiment, the display device may further include a light-emitting element layer disposed on the circuit layer, the light-emitting element layer including a first light-emitting element and a second light-emitting element. The display area may further include a first pixel area, a second pixel area adjacent to the first pixel area in the first direction, and a first connection area extending from the first pixel area to the second pixel area, the circuit layer may further include a first pixel circuit overlapping the first pixel area and a second pixel circuit overlapping the second pixel area, the first light-emitting element may overlap the first pixel area and the second light-emitting element may overlap the second pixel area, the first opening area may be defined between the first pixel area and the second pixel area, and the non-display area may further include a second connection area extending from the driving circuit area to the wiring area. In a plan view, an edge of the first pixel area, an edge of the second pixel area, and an edge of the first connection area may define at least a portion of the first opening area, and in the plan view, an edge of the driving circuit area, an edge of the wiring area, and an edge of the second connection area may define at least a portion of the second opening area. A width of the first connection area and a width of the second connection area may be equal to each other.

In an embodiment, the driving circuit area may include a first driving circuit area and a second driving circuit area, arranged in a second direction crossing the first direction, the driving circuit may include a first driving circuit overlapping the first driving circuit area and a second driving circuit overlapping the second driving circuit area, and the wiring area may further include a third wiring area and a fourth wiring area. The first wiring area and the third wiring area may be arranged in the second direction, the second wiring area and the fourth wiring area may be arranged in the second direction, the first driving circuit area may be disposed between the first wiring area and the second wiring area, and the second driving circuit area may be disposed between the third wiring area and the fourth wiring area.

In an embodiment, the wiring line may include a first wiring line extending from the first wiring area to the third wiring area and a second wiring line extending from the second wiring area to the fourth wiring area. The first wiring line may include a first branch extending from the first wiring area to the first driving circuit area and electrically connected to the first driving circuit, and the second wiring line may include a second branch extending from the fourth wiring area to the second driving circuit area and electrically connected to the second driving circuit.

In an embodiment, the wiring line may further include a third wiring line extending from the first driving circuit area to the second driving circuit area. The first wiring line and the second wiring line may be voltage lines, and the third wiring line may be a clock signal line.

In an embodiment, the wiring line may further include a signal line electrically connected to the first driving circuit and extending from the first driving circuit area to the second wiring area. The signal line may further extend from the first driving circuit area to the second driving circuit area and may be electrically connected to the second driving circuit.

In an embodiment, the driving circuit area may further include a third driving circuit area arranged in the second direction together with the second driving circuit area, the driving circuit may further include a third driving circuit overlapping the third driving circuit area, and the wiring area may further include a fifth wiring area and a sixth wiring area. The fifth wiring area may be arranged in the second direction together with the third wiring area, the sixth wiring area may be arranged in the second direction together with the fourth wiring area, the third driving circuit area may be disposed between the fifth wiring area and the sixth wiring area, and the first wiring line may further include a third branch extending from the fifth wiring area to the third driving circuit area and electrically connected to the third driving circuit.

In an embodiment, the driving circuit area may further include a third driving circuit area and a fourth driving circuit area, arranged in the second direction together with the second driving circuit area, the driving circuit may further include a third driving circuit overlapping the third driving circuit area and a fourth driving circuit overlapping the fourth driving circuit area, and the wiring area may further include a fifth wiring area, a sixth wiring area, a seventh wiring area, and an eighth wiring area. The fifth wiring area and the seventh wiring area may be arranged in the second direction, the sixth wiring area and the eighth wiring area may be arranged in the second direction, the third driving circuit area may be disposed between the fifth wiring area and the sixth wiring area, the fourth driving circuit area may be disposed between the seventh wiring area and the eighth wiring area, and the wiring line may include a first wiring line extending from the first wiring area to the third wiring area and a second wiring line extending from the sixth wiring area to the eighth wiring area. The first wiring line may include a first branch extending from the first wiring area to the first driving circuit area and electrically connected to the first driving circuit, and a second branch extending from the third wiring area to the second driving circuit area and electrically connected to the second driving circuit, and the second wiring line may include a third branch extending from the sixth wiring area to the third driving circuit area and electrically connected to the third driving circuit, and a fourth branch extending from the eighth wiring area to the fourth driving circuit area and electrically connected to the fourth driving circuit.

In an embodiment, the first driving circuit area may include a first partial driving circuit area and a second partial driving circuit area adjacent to each other in the first direction and having a same area as each other, and the second driving circuit area may include a third partial driving circuit area and a fourth partial driving circuit area adjacent to each other in the first direction and having a same area as each other. The first driving circuit may include a first partial driving circuit overlapping the first partial driving circuit area and a second partial driving circuit overlapping the second partial driving circuit area, and the second driving circuit may include a third partial driving circuit overlapping the third partial driving circuit area and a fourth partial driving circuit overlapping the fourth partial driving circuit area.

In an embodiment, the first partial driving circuit may include a transistor and a storage capacitor, and the second partial driving circuit may include a transistor and adjust a magnitude of a signal generated by the first partial driving circuit.

According to an embodiment of the invention, a display device includes a substrate including a display area including a first pixel area, a second pixel area adjacent to the first pixel area in a first direction, and a first connection area extending from the first pixel area to the second pixel area and a non-display area including a driving circuit area, a wiring area adjacent to the driving circuit area in the first direction, and a second connection area extending from the driving circuit area to the wiring area, a circuit layer disposed on the substrate, the circuit layer including a first pixel circuit overlapping the first pixel area, a second pixel circuit overlapping the second pixel area, a driving circuit overlapping the driving circuit area, a first organic insulating layer overlapping the second connection area, a second organic insulating layer disposed on the first organic insulating layer, and a wiring line extending from the wiring area to the second connection area and disposed between the first organic insulating layer and the second organic insulating layer in the second connection area, the wiring line being electrically connected to the driving circuit, and a light-emitting element layer disposed on the circuit layer, the light-emitting element layer including a first light-emitting element overlapping the first pixel area and a second light-emitting element overlapping the second pixel area.

In an embodiment, a first opening area is defined between the first pixel area and the second pixel area in the display area, and a second opening area is defined between the driving circuit area and the wiring area in the non-display area. In a plan view, an edge of the first pixel area, an edge of the second pixel area, and an edge of the first connection area may define at least a portion of the first opening area, and in the plan view, an edge of the driving circuit area, an edge of the wiring area, and an edge of the second connection area may define at least a portion of the second opening area. A width of the first connection area and a width of the second connection area may be equal to each other.

In an embodiment, the driving circuit area may include a first driving circuit area and a second driving circuit area, arranged in a second direction crossing the first direction, the driving circuit may include a first driving circuit overlapping the first driving circuit area and a second driving circuit overlapping the second driving circuit area, and the wiring area may include a first wiring area, a second wiring area, a third wiring area, and a fourth wiring area. The first wiring area and the third wiring area may be arranged in the second direction, the second wiring area and the fourth wiring area may be arranged in the second direction, the first driving circuit area may be disposed between the first wiring area and the second wiring area, and the second driving circuit area may be disposed between the third wiring area and the fourth wiring area.

In an embodiment, the wiring line may include a first wiring line extending from the first wiring area to the third wiring area and a second wiring line extending from the second wiring area to the fourth wiring area. The first wiring line may include a first branch extending from the first wiring area to the first driving circuit area and electrically connected to the first driving circuit, and the second wiring line may include a second branch extending from the fourth wiring area to the second driving circuit area and electrically connected to the second driving circuit.

In an embodiment, the wiring line may further include a third wiring line extending from the first driving circuit area to the second driving circuit area. The first wiring line and the second wiring line may be voltage lines, and the third wiring line may be a clock signal line.

In an embodiment, the wiring line may further include a signal line electrically connected to the first driving circuit and extending from the first driving circuit area to the second wiring area. The signal line may further extend from the first driving circuit area to the second driving circuit area and may be electrically connected to the second driving circuit.

In an embodiment, the driving circuit area may further include a third driving circuit area arranged in the second direction together with the second driving circuit area, the driving circuit may further include a third driving circuit overlapping the third driving circuit area, and the wiring area may further include a fifth wiring area and a sixth wiring area. The fifth wiring area may be arranged in the second direction together with the third wiring area, the sixth wiring area may be arranged in the second direction together with the fourth wiring area, the third driving circuit area may be disposed between the fifth wiring area and the sixth wiring area, and the first wiring line may further include a third branch extending from the fifth wiring area to the third driving circuit area and electrically connected to the third driving circuit.

In an embodiment, the first wiring line and the second wiring line may include a same material in the second connection area.

In an embodiment, the first driving circuit area may include a first partial driving circuit area and a second partial driving circuit area adjacent to each other in the first direction and having a same area as each other, and the second driving circuit area may include a third partial driving circuit area and a fourth partial driving circuit area adjacent to each other in the first direction and having a same area as each other. The first driving circuit may include a first partial driving circuit overlapping the first partial driving circuit area and a second partial driving circuit overlapping the second partial driving circuit area, and the second driving circuit may include a third partial driving circuit overlapping the third partial driving circuit area and a fourth partial driving circuit overlapping the fourth partial driving circuit area.

In an embodiment, the circuit layer may further include an inorganic insulating layer including a first inorganic insulating layer overlapping the wiring area and a second inorganic insulating layer disposed on the first inorganic insulating layer. The wiring line may include a lower wiring line disposed between the first inorganic insulating layer and the second inorganic insulating layer, a first upper wiring line disposed on the second inorganic insulating layer and connected to the lower wiring line through a first contact hole of the second inorganic insulating layer, and a second upper wiring line disposed on the second inorganic insulating layer and connected to the lower wiring line through a second contact hole of the second inorganic insulating layer.

BRIEF DESCRIPTION OF THE DRAWINGS

The above and other features and advantages of embodiments of the invention will be more apparent from the following description taken in conjunction with the accompanying drawings, in which.

DETAILED DESCRIPTION

Figure 1:
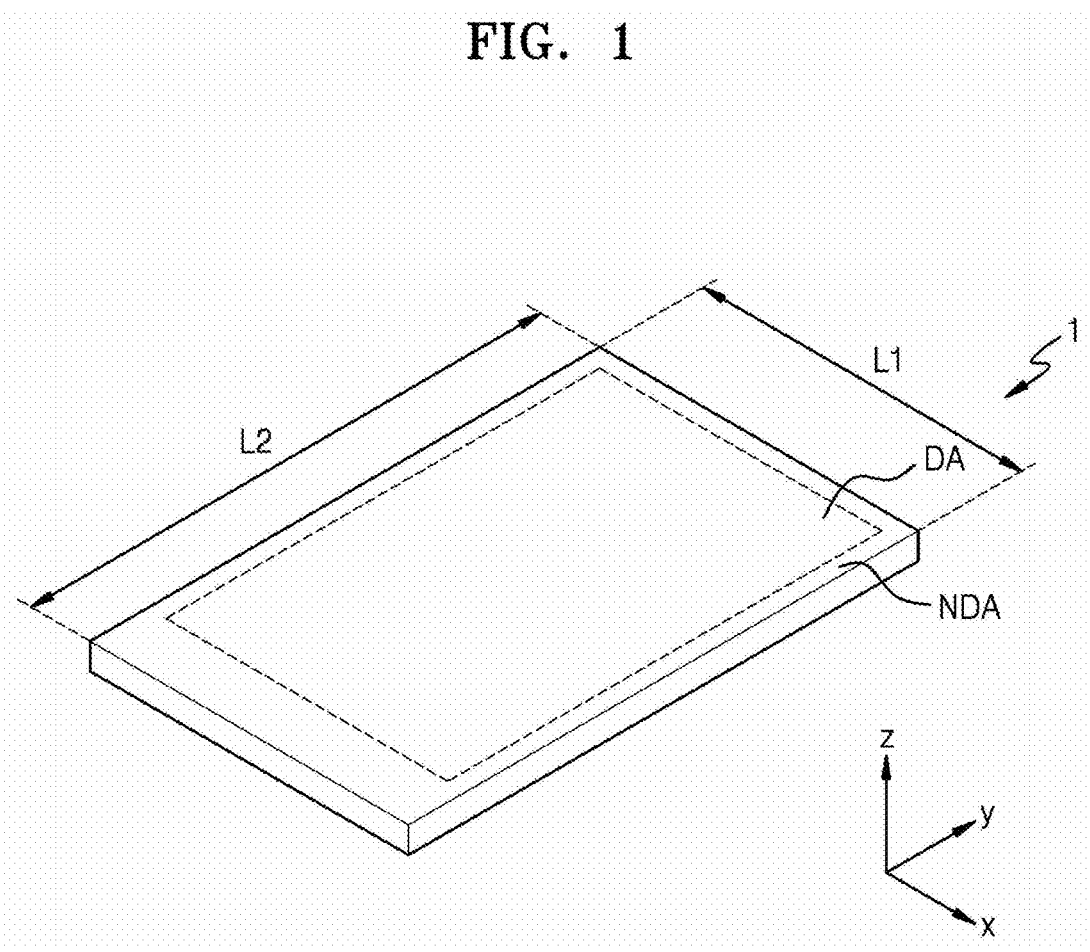
FIG. 1 is a schematic perspective view of an embodiment of a display device.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items.

As the disclosure allows for various changes and numerous embodiments, particular embodiments will be illustrated in the drawings and described in detail in the written description. The attached drawings for illustrating embodiments are referred to in order to gain a sufficient understanding, the merits thereof, and the objectives accomplished by the implementation. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "include", "have", "including", and/or "having" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

Sizes of components in the drawings may be exaggerated for convenience of explanation. In other words, since sizes (e.g., thicknesses) of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the following embodiments, when layers, regions, or elements are connected to each other, the layers, the regions, or the elements may be directly connected to each other, or another layer, another region, or another element may be interposed between the layers, the regions, or the elements and thus the layers, the regions, or the elements may be indirectly connected to each other. For example, in the following embodiments, when layers, regions, or elements are electrically connected to each other, the layers, the regions, or the elements may be directly electrically connected to each other, or another layer, another region, or another element may be interposed between the layers, the regions, or the elements and thus the layers, the regions, or the elements may be indirectly electrically connected to each other.

Throughout the disclosure, the expression "A and/or B" indicates only A, only B, or both A and B. In addition, throughout the disclosure, the expression "at least one of A and B" indicates only A, only B, or both A and B.

In the following embodiments, the term "ON" used in connection with the state of an element may refer to an active state of the element, and the term "OFF" used in connection with the state of the element may refer to an inactive state of the element. The term "ON" used in connection with a signal received by the element may refer to a signal that activates the element, and the term "OFF" used in connection with the signal may refer to a signal that deactivates the element. The element may be activated by either a high voltage or a low voltage. Hereinafter, a voltage that turns on a transistor is referred to as an on voltage, and a voltage that turns off the transistor is referred to as an off voltage.

Display devices may display images, and may be included in portable electronic devices such as game consoles, multimedia devices, and micro personal computers. In an embodiment, the display devices may include a liquid crystal display, an electrophoretic display, an organic light-emitting display, an inorganic electroluminescent ("EL") display (i.e., an inorganic light-emitting display), a field emission display, a surface-conduction electron-emitter display, a quantum dot display, a plasma display, a cathode ray display, and the like. Hereinafter, as a display device in an embodiment, an organic light-emitting display will be described as an example. However, various types of display devices as described above may be used in embodiments.

Figure 2A:
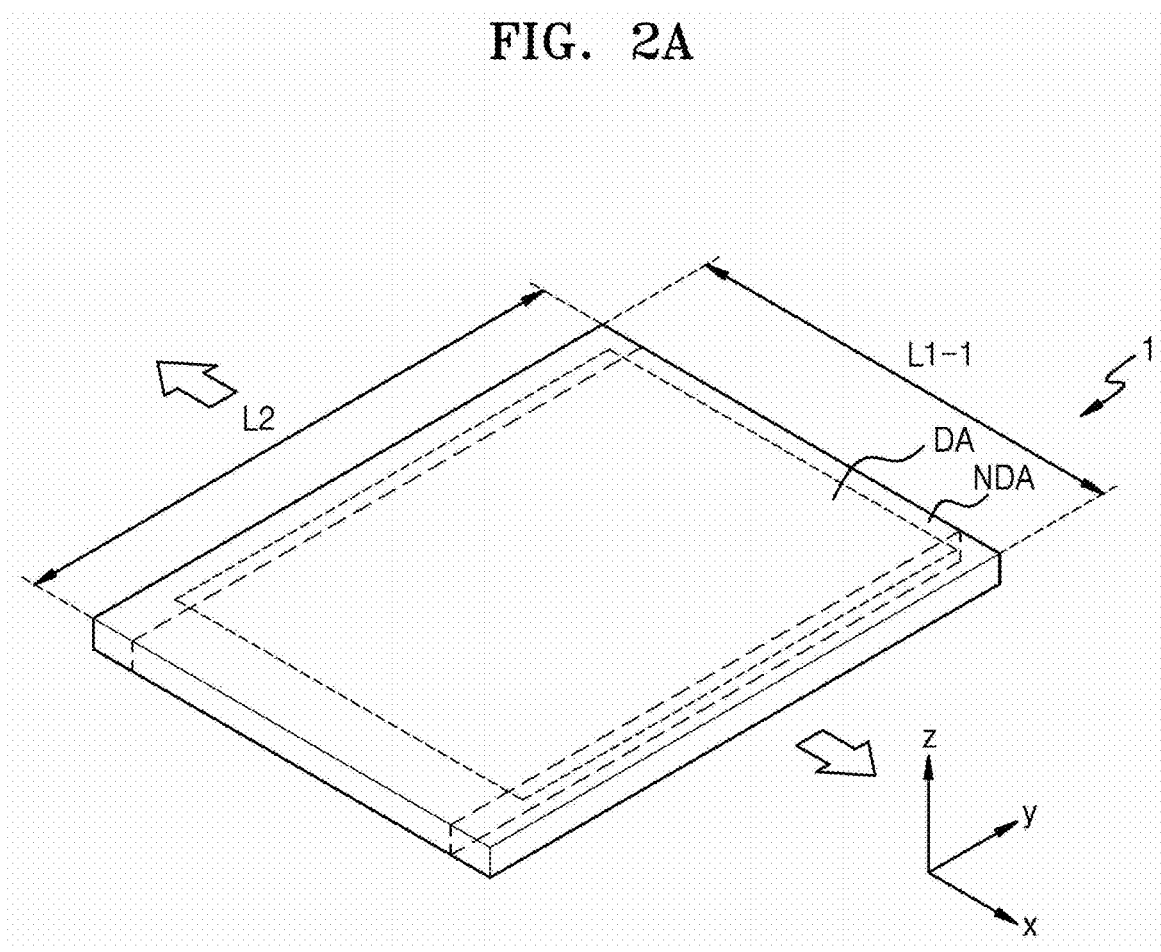
FIG. 2A is a perspective view illustrating a first state in which the display device of FIG. 1 is stretched in a first direction.
Figure 2B:
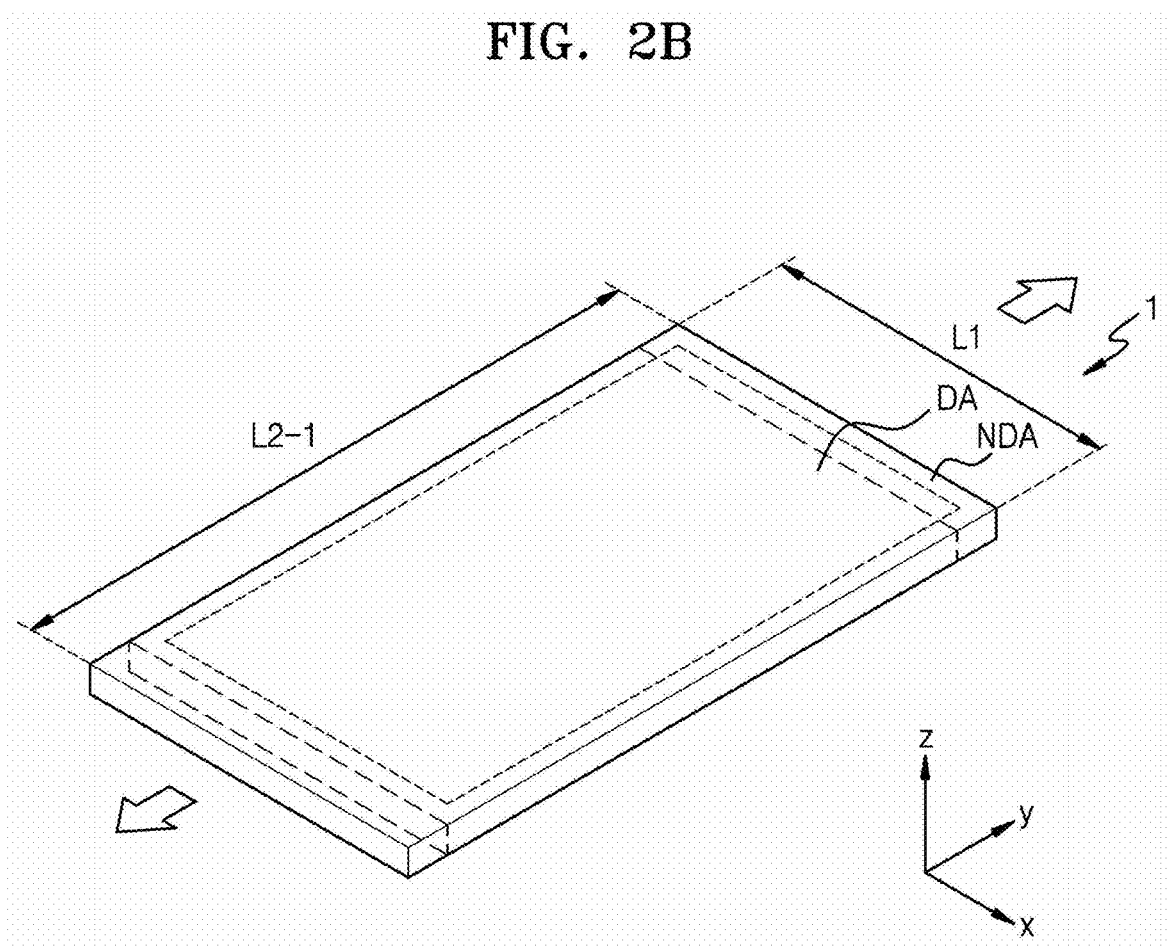
FIG. 2B is a perspective view illustrating a second state in which the display device of FIG. 1 is stretched in a second direction.

FIG. 1 is a schematic perspective view of an embodiment of a display device 1. FIG. 2A is a perspective view illustrating a first state in which the display device 1 of FIG. 1 is stretched in a first direction. FIG. 2B is a perspective view illustrating a second state in which the display device 1 of FIG. 1 is stretched in a second direction.

Referring to FIG. 1, the display device 1 may display an image. The display device 1 may include a display area DA and a non-display area NDA. A plurality of pixels may be arranged in the display area DA, and the display device 1 may provide a predetermined image by light emitted from the plurality of pixels. The non-display area NDA may be adjacent to the display area DA. The non-display area NDA may at least partially surround the display area DA. In an embodiment, the non-display area NDA may surround an entirety of the display area DA in a plan view.

The display device 1 may include a first side L1 extending in the first direction and a second side L2 extending in the second direction. The first side L1 and the second side L2 may be edges of the display device 1. The first direction and the second direction may cross each other. In an embodiment, the first direction and the second direction may define an acute angle, for example. In another embodiment, the first direction and the second direction may define an obtuse angle or be orthogonal to each other. Hereinafter, a case in which the first direction is an x direction or a −x direction and the second direction is a y direction or a −y direction will be mainly described in detail.

Referring to FIGS. 2A and 2B, the display device 1 may be a stretchable display device. Referring to FIG. 2A, when a tensile force is applied to the display device 1 in the first direction (e.g., the x direction or the −x direction), the display device 1 may be stretched in the first direction (e.g., the x direction or the −x direction). In this case, a first side L1-1 in FIG. 2A may be greater than the first side L1 in FIG. 1. Each of the display area DA and the non-display area NDA may be stretched in the first direction (e.g., the x direction or the −x direction). In another embodiment, when a compression force is applied to the display device 1 in the first direction (e.g., the x direction or the −x direction), the display device 1 may be contracted in the first direction (e.g., the x direction or the −x direction). In this case, the first side L1-1 in FIG. 2A may be less than the first side L1 in FIG. 1. Each of the display area DA and the non-display area NDA may be contracted in the first direction (e.g., the x direction or the −x direction).

Referring to FIG. 2B, when a tensile force is applied to the display device 1 in the second direction (e.g., the y direction or the −y direction), the display device 1 may be stretched in the second direction (e.g., the y direction or the −y direction). In this case, a second side L2-1 in FIG. 2B may be greater than the second side L2 in FIG. 1. Each of the display area DA and the non-display area NDA may be stretched in the second direction (e.g., the y direction or the −y direction). In another embodiment, when a compression force is applied to the display device 1 in the second direction (e.g., the y direction or the −y direction), the display device 1 may be contracted in the second direction (e.g., the y direction or the −y direction). In this case, the second side L2-1 in FIG. 2B may be less than the second side L2 in FIG. 1. Each of the display area DA and the non-display area NDA may be contracted in the second direction (e.g., the y direction or the −y direction). As described above, when a tensile force or a compression force is applied to the display device 1, the display device 1 may be deformed into various shapes.

Figure 3:
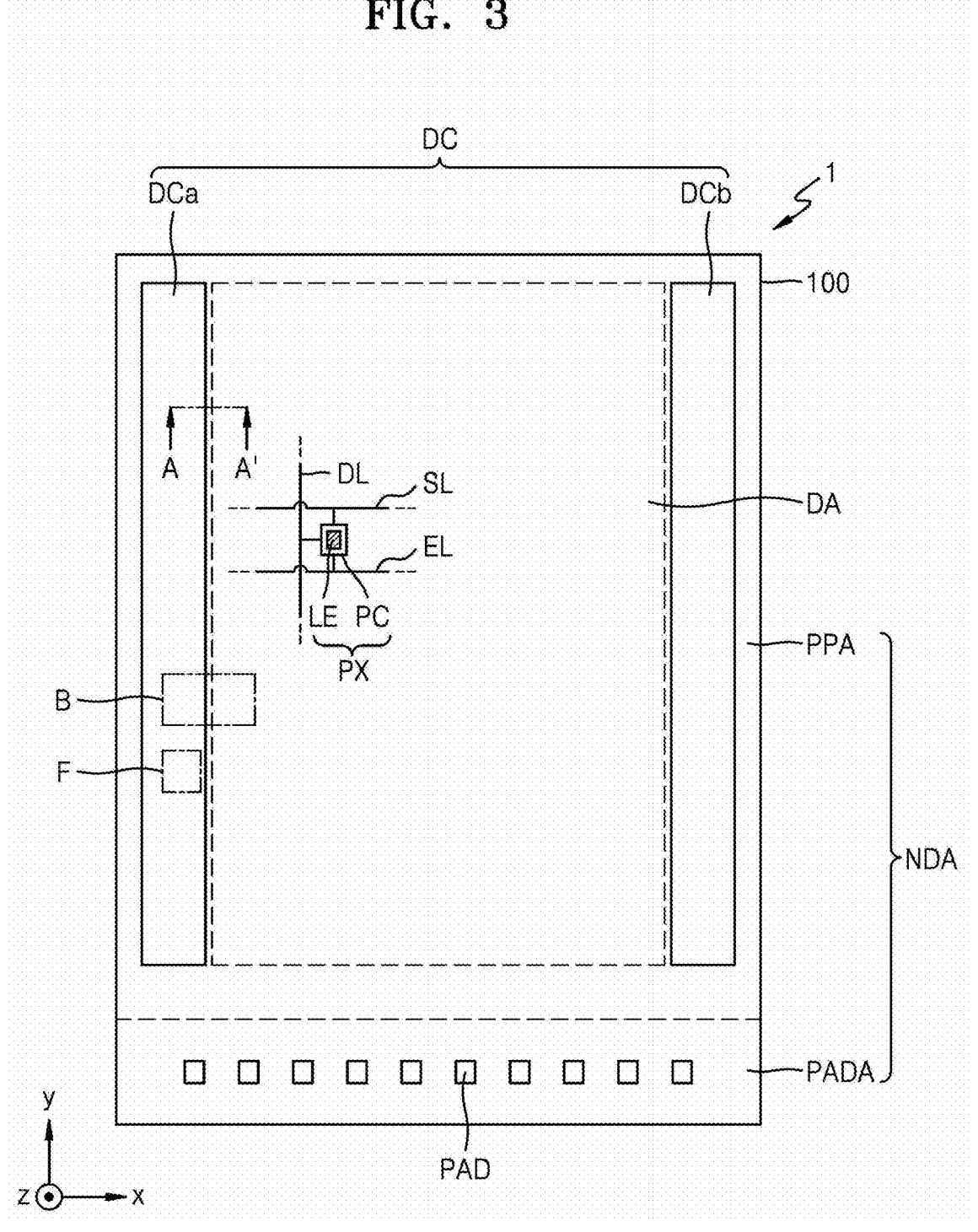
FIG. 3 is a schematic plan view of an embodiment of a display device.

FIG. 3 is a schematic plan view of an embodiment of a display device 1.

Referring to FIG. 3, the display device 1 may include a substrate 100, a pixel PX, a scan line SL, a data line DL, an emission control line EL, a driving circuit DC, and a pad PAD. The display device 1 may include a display area DA and a non-display area NDA. In an embodiment, the display area DA and the non-display area NDA may be defined in the substrate 100. In an embodiment, the substrate 100 may include the display area DA and the non-display area NDA, for example.

A pixel PX may be disposed in the display area DA. The non-display area NDA may be adjacent to the display area DA. In an embodiment, the non-display area NDA may at least partially surround the display area DA. In an embodiment, the non-display area NDA may surround an entirety of the display area DA in a plan view, for example. The non-display area NDA may include a peripheral area PPA and a pad area PADA. The peripheral area PPA may be adjacent to the display area DA. The driving circuit DC may be disposed in the peripheral area PPA. The pad area PADA may be disposed on one side of the peripheral area PPA. The pad PAD may be disposed in the pad area PADA.

The pixel PX may be disposed in the display area DA. In an embodiment, a plurality of pixels PX may be provided in the display area DA. The pixel PX may include a pixel circuit PC and a light-emitting element LE.

The pixel circuit PC may be a circuit that controls the light-emitting element LE. A plurality of pixel circuits PC may be provided in the display area DA. The pixel circuit PC may include at least one transistor and at least one storage capacitor. In an embodiment, the pixel circuit PC may be electrically connected to the scan line SL and the data line DL. In an embodiment, the pixel circuit PC may be electrically connected to the scan line SL, the emission control line EL, and the data line DL.

The light-emitting element LE may be electrically connected to the pixel circuit PC. A plurality of light-emitting elements LE may be provided in the display area DA. The light-emitting element LE may be an organic light-emitting diode including an organic emission layer. In an alternative embodiment, the light-emitting element LE may be an inorganic light-emitting diode including an inorganic emission layer. The light-emitting diode may have a micro size or a nano size. In an embodiment, the light-emitting diode may be a micro light-emitting diode, for example. In an alternative embodiment, the light-emitting diode may be a nanorod light-emitting diode. The nanorod light-emitting diode may include gallium nitride (GaN). In an embodiment, a color conversion layer may be disposed on the nanorod light-emitting diode. The color conversion layer may include quantum dots. In an alternative embodiment, the light-emitting element LE may be a quantum dot light-emitting diode including a quantum dot emission layer. Hereinafter, a case in which the light-emitting element LE is an organic light-emitting diode will be mainly described in detail.

The scan line SL may extend in a first direction (e.g., an x direction or a −x direction). The scan line SL may be electrically connected to the driving circuit DC. In an embodiment, the scan line SL may be electrically connected to a scan driving circuit among the driving circuits DC. The scan line SL may be electrically connected to the pixel circuit PC. The scan line SL may receive a scan signal from the scan driving circuit and transmit the scan signal to the pixel circuit PC.

The data line DL may extend in a second direction (e.g., a y direction or a −y direction). The data line DL may be electrically connected to a data driver (not shown). The data line DL may be electrically connected to the pixel circuit PC. The data line DL may receive a data signal from the data driver and transmit the data signal to the pixel circuit PC.

The emission control line EL may extend in the first direction (e.g., the x direction or the −x direction). The emission control line EL may be electrically connected to the driving circuit DC. In an embodiment, the emission control line EL may be electrically connected to an emission control driving circuit among the driving circuits DC. The emission control line EL may be electrically connected to the pixel circuit PC. The emission control line EL may receive an emission control signal from the emission control driving circuit and transmit the emission control signal to the pixel circuit PC.

The driving circuit DC may be disposed in the peripheral area PPA. The driving circuit DC may be disposed on one side of the display area DA. In an embodiment, the driving circuit DC may extend in the second direction (e.g., the y direction or the −y direction). In an embodiment, the driving circuit DC may include a left driving circuit DCa and a right driving circuit DCb. The left driving circuit DCa may be disposed on the left side of the display area DA. The right driving circuit DCb may be disposed on the right side of the display area DA. The display area DA may be disposed between the left driving circuit DCa and the right driving circuit DCb. In some embodiments, any one of the left driving circuit DCa and the right driving circuit DCb may be omitted.

The pad PAD may be disposed in the pad area PADA. A plurality of pads PAD may be provided in the pad area PADA. A display driver (not shown) and/or a display circuit board (not shown) may be arranged in the pad area PADA, and the pad PAD may be electrically connected to the display driver and/or the display circuit board.

Figure 4A:
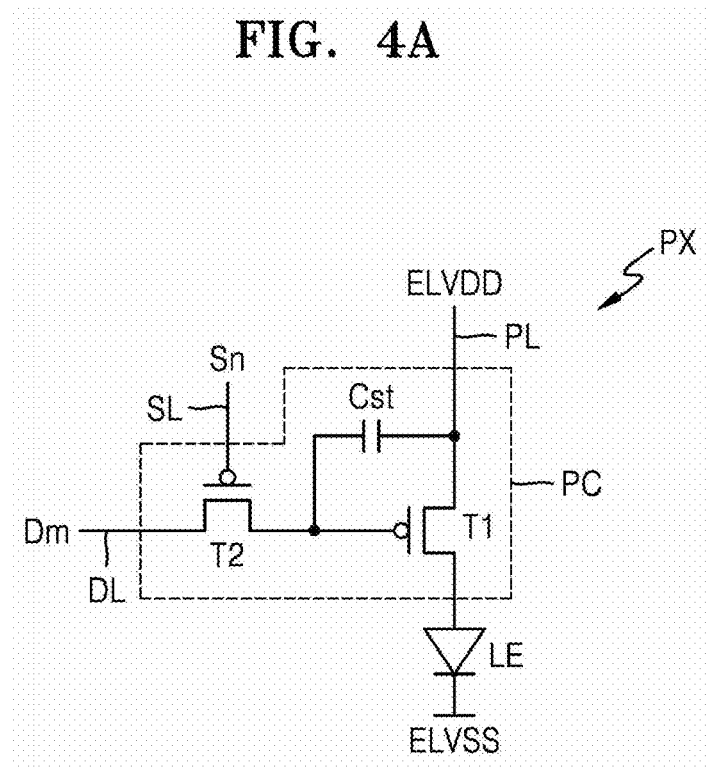
FIGS. 4A and 4B are schematic equivalent circuit diagrams of one pixel of a display device.
Figure 4B:
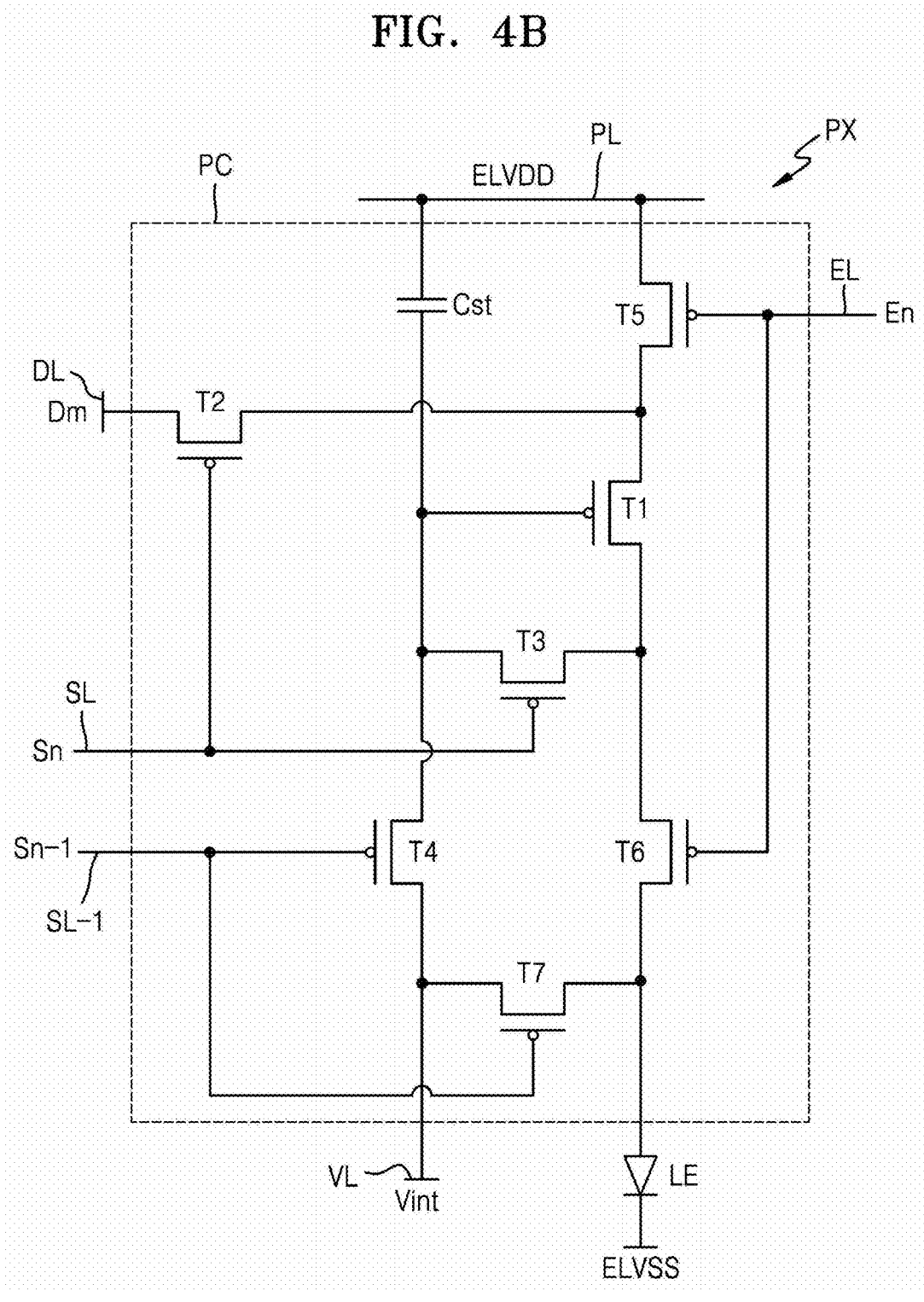

FIGS. 4A and 4B are schematic equivalent circuit diagrams of one pixel PX of a display device.

Referring to FIG. 4A, the pixel PX may include a pixel circuit PC and a light-emitting element LE electrically connected to the pixel circuit PC. In an embodiment, the pixel circuit PC may include a driving transistor T1, a switching transistor T2, and a storage capacitor Cst.

The switching transistor T2 may be connected to a scan line SL and a data line DL, and may transmit, to the driving transistor T1, a data signal Dm input from the data line DL according to a scan signal Sn input from the scan line SL.

The storage capacitor Cst may be connected to the switching transistor T2 and a driving voltage line PL, and may store a voltage corresponding to a difference between a voltage received from the switching transistor T2 and a first power voltage ELVDD supplied to the driving voltage line PL.

The driving transistor T1 may be connected to the driving voltage line PL and the storage capacitor Cst, and may control a driving current flowing from the driving voltage line PL to the light-emitting element LE in response to a value of the voltage stored in the storage capacitor Cst. The light-emitting element LE may emit light having a predetermined luminance by the driving current. An opposite electrode (e.g., a cathode) of the light-emitting element LE may receive a second power voltage ELVSS.

Although FIG. 4A illustrates a case in which the pixel circuit PC includes two transistors and one storage capacitor, the invention is not limited thereto. In another embodiment, the pixel circuit PC may include three or more transistors and two or more storage capacitors.

Referring to FIG. 4B, the pixel PX may include a pixel circuit PC and a light-emitting element LE. The pixel circuit PC may include a driving transistor T1, a switching transistor T2, a compensation transistor T3, a first initialization transistor T4, an operation control transistor T5, an emission control transistor T6, a second initialization transistor T7, and a storage capacitor Cst.

Although FIG. 4B illustrates a case in which a scan line SL, a previous scan line SL−1, an emission control line EL, a data line DL, an initialization voltage line VL, and a driving voltage line PL are provided for each pixel circuit PC, the invention is not limited thereto. In another embodiment, at least one of the scan line SL, the previous scan line SL−1, the emission control line EL, the data line DL, the initialization voltage line VL, and the driving voltage line PL may be shared by neighboring pixel circuits.

The driving drain electrode of the driving transistor T1 may be electrically connected to the light-emitting element LE via the emission control transistor T6. The driving transistor T1 may receive the data signal Dm according to a switching operation of the switching transistor T2 and supply a driving current to the light-emitting element LE.

The switching gate electrode of the switching transistor T2 may be connected to the scan line SL, and the switching source electrode of the switching transistor T2 may be connected to the data line DL. The switching drain electrode of the switching transistor T2 may be connected to the driving source electrode of the driving transistor T1 and may be connected to the driving voltage line PL via the operation control transistor T5.

The switching transistor T2 may be turned on according to the scan signal Sn received through the scan line SL and perform a switching operation for transmitting the data signal Dm, transmitted to the data line DL, to the driving source electrode of the driving transistor T1.

The compensation gate electrode of the compensation transistor T3 may be connected to the scan line SL. The compensation source electrode of the compensation transistor T3 may be connected to the driving drain electrode of the driving transistor T1 and may be connected to the pixel electrode (e.g., an anode) of the light-emitting element LE via the emission control transistor T6. The compensation drain electrode of the compensation transistor T3 may be connected to one electrode of the storage capacitor Cst, the first initialization source electrode of the first initialization transistor T4, and the driving gate electrode of the driving transistor T1. The compensation transistor T3 may be turned on according to the scan signal Sn received through the scan line SL and connect the driving gate electrode and the driving drain electrode of the driving transistor T1 to each other, and thus, the driving transistor T1 may be diode-connected.

The first initialization gate electrode of the first initialization transistor T4 may be connected to the previous scan line SL−1. The first initialization drain electrode of the first initialization transistor T4 may be connected to the initialization voltage line VL. The first initialization source electrode of the first initialization transistor T4 may be connected to one electrode of the storage capacitor Cst, the compensation drain electrode of the compensation transistor T3, and the driving gate electrode of the driving transistor T1. The first initialization transistor T4 may be turned on according to the previous scan signal Sn−1 received through the previous scan line SL−1 and transmit an initialization voltage Vint to the driving gate electrode of the driving transistor T1 to perform an initialization operation for initializing the voltage of the driving gate electrode of the driving transistor T1.

The operation control gate electrode of the operation control transistor T5 may be connected to the emission control line EL. The operation control source electrode of the operation control transistor T5 may be connected to the driving voltage line PL. The operation control drain electrode of the operation control transistor T5 may be connected to the driving source electrode of the driving transistor T1 and the switching drain electrode of the switching transistor T2.

The emission control gate electrode of the emission control transistor T6 may be connected to the emission control line EL. The emission control source electrode of the emission control transistor T6 may be connected to the driving drain electrode of the driving transistor T1 and the compensation source electrode of the compensation transistor T3. The emission control drain electrode of the emission control transistor T6 may be electrically connected to the pixel electrode of the light-emitting element LE. The operation control transistor T5 and the emission control transistor T6 may be simultaneously turned on according to the emission control signal En received through the emission control line EL, and thus, the first power voltage ELVDD may be transmitted to the light-emitting element LE and a driving current flows through the light-emitting element LE.

The second initialization gate electrode of the second initialization transistor T7 may be connected to the previous scan line SL−1. The second initialization source electrode of the second initialization transistor T7 may be connected to the pixel electrode of the light-emitting element LE. The second initialization drain electrode of the second initialization transistor T7 may be connected to the initialization voltage line VL. The second initialization transistor T7 may be turned on according to the previous scan signal Sn−1 received through the previous scan line SL−1 to initialize the pixel electrode of the light-emitting element LE.

In FIG. 4B, a case in which both the first initialization transistor T4 and the second initialization transistor T7 are connected to the previous scan line SL−1 is illustrated. However, the invention is not limited thereto. In another embodiment, the first initialization transistor T4 and the second initialization transistor T7 may be connected to the previous scan line SL−1 and a subsequent scan line (not shown), respectively, and may be driven according to the previous scan signal Sn−1 and a subsequent scan signal, respectively.

The other electrode of the storage capacitor Cst may be connected to the driving voltage line PL. One electrode of the storage capacitor Cst may be connected to the driving gate electrode of the driving transistor T1, the compensation drain electrode of the compensation transistor T3, and the first initialization source electrode of the first initialization transistor T4.

An opposite electrode (e.g., a cathode) of the light-emitting element LE may receive the second power voltage ELVSS. The light-emitting element LE may receive a driving current from the driving transistor T1 and emit light.

In other embodiments, at least one of the aforementioned drain electrodes may be a source electrode and at least one of the aforementioned source electrodes may be a drain electrode according to a type of corresponding transistors.

Figure 5:
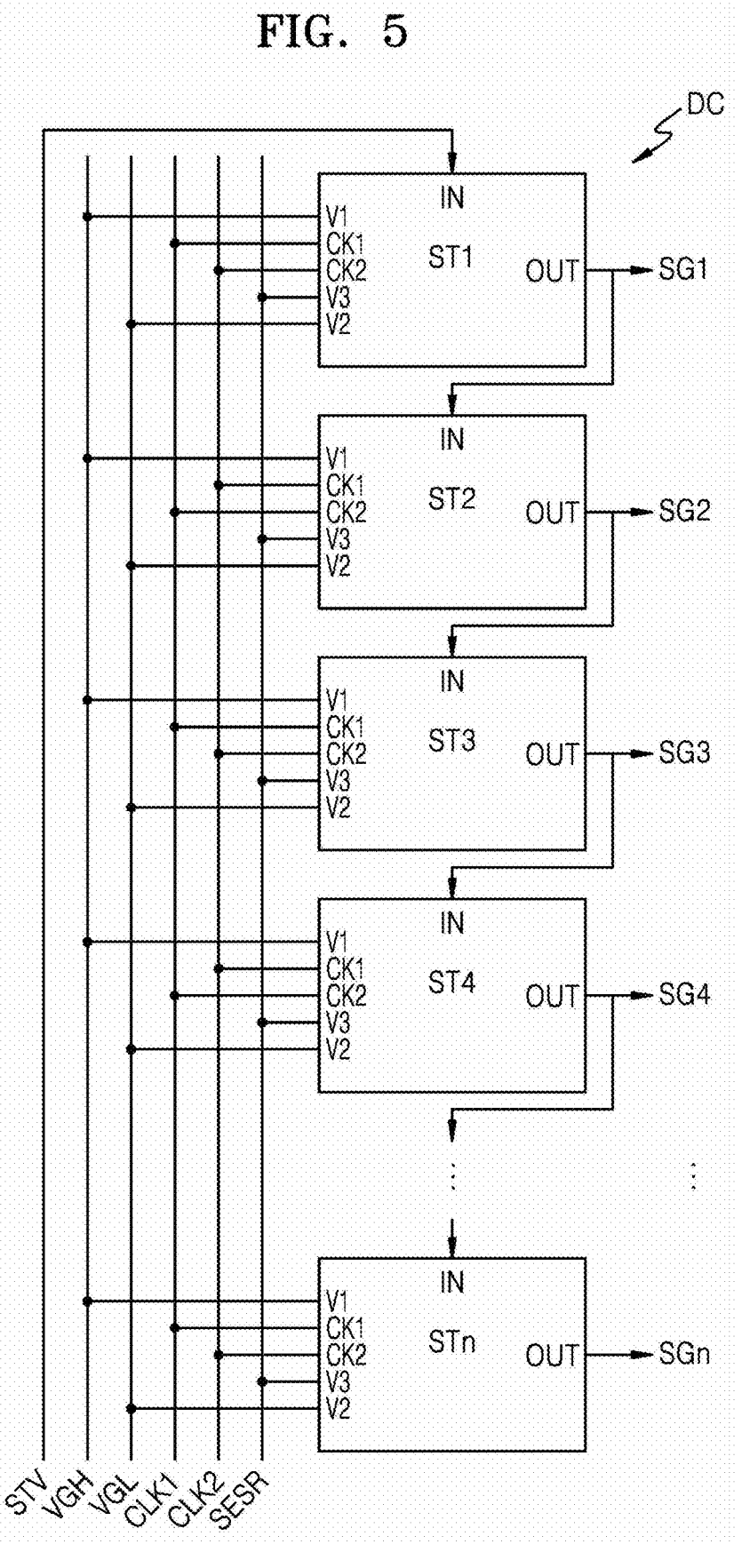
FIG. 5 is a schematic block diagram of an embodiment of a driving circuit.

FIG. 5 is a schematic block diagram of an embodiment of a driving circuit DC.

Referring to FIG. 5, the driving circuit DC may include a plurality of stages. In an embodiment, the plurality of stages may include first to n-th stages ST1 to STn, where n is a natural number greater than zero. Each of the first to n-th stages ST1 to STn may correspond to a pixel row (pixel line) provided in a display area, for example. The number of stages of the driving circuit DC may be variously modified according to the number of pixel rows. Each of the first to n-th stages ST1 to STn may include at least one transistor and at least one storage capacitor.

Each of the first to n-th stages ST1 to STn may output signals in response to a start signal or a previous signal. In an embodiment, a signal output from each of the first to n-th stages ST1 to STn may be the scan signal Sn or the previous scan signal Sn–1 applied to the pixel circuit PC of FIG. 4A or 4B. In an embodiment, a signal output from each of the first to n-th stages ST1 to STn may be the emission control signal En applied to the pixel circuit PC of FIG. 4B.

Each of the first to n-th stages ST1 to STn may include an input terminal IN, a first clock terminal CK1, a second clock terminal CK2, a first voltage input terminal V1, a second voltage input terminal V2, a third voltage input terminal V3, and an output terminal OUT.

The input terminal IN may receive an external signal STV or a previous signal as a start signal. In an embodiment, the external signal STV may be applied to the input terminal IN of the first stage ST1, and a previous signal output from a previous stage may be applied to the input terminal IN of each of the second to n-th stages ST2 to STn other than the first stage ST1. In an embodiment, the first stage ST1 may start driving by the external signal STV, and may generate and output a first signal SG1, for example. The second stage ST2 may start driving by the first signal SG1, and may generate and output a second signal SG2. The third stage ST3 may start driving by the second signal SG2, and may generate and output a third signal SG3. The fourth stage ST4 may start driving by the third signal SG3, and may generate and output a fourth signal SG4. An (n–1)-th signal output from the (n–1)-th stage may be input to the input terminal IN of the n-th stage STn, and the n-th stage STn may generate and output an n-th signal SGn.

A first clock signal CLK1 or a second clock signal CLK2 may be applied to the first clock terminal CK1 and the second clock terminal CK2. In an embodiment, the first clock signal CLK1 and the second clock signal CLK2 may be alternately applied to the first to n-th stages ST1 to STn. In an embodiment, the first clock signal CLK1 may be applied to the first clock terminal CK1 of an odd-numbered stage, and the second clock signal CLK2 may be applied to the second clock terminal CK2 of the odd-numbered stage, for example. The second clock signal CLK2 may be applied to the first clock terminal CK1 of an even-numbered stage, and the first clock signal CLK1 may be applied to the second clock terminal CK2 of the even-numbered stage.

The first voltage input terminal V1 may receive a first voltage VGH that is a high voltage, and the second voltage input terminal V2 may receive a second voltage VGL that is a low voltage. The first voltage VGH and the second voltage VGL may be rated voltages applied to the driving circuit DC. The first voltage VGH and the second voltage VGL may be supplied as global signals from a control unit (not shown)

and/or a power supply unit (not shown). The third voltage input terminal V3 may receive a third voltage SESR. The third voltage SESR may be a voltage for solving a glare problem of the display device. In some embodiments, the third voltage SESR may be omitted.

The output terminal OUT may output a signal. In an embodiment, the signal may be supplied to a pixel circuit as a scan signal or a previous scan signal through a scan line or a previous scan line. In an alternative embodiment, the signal may be supplied to the pixel circuit through an emission control line as an emission control signal. In an embodiment, the signal may be supplied to the input terminal IN of a next stage as a carry signal.

Figure 6:
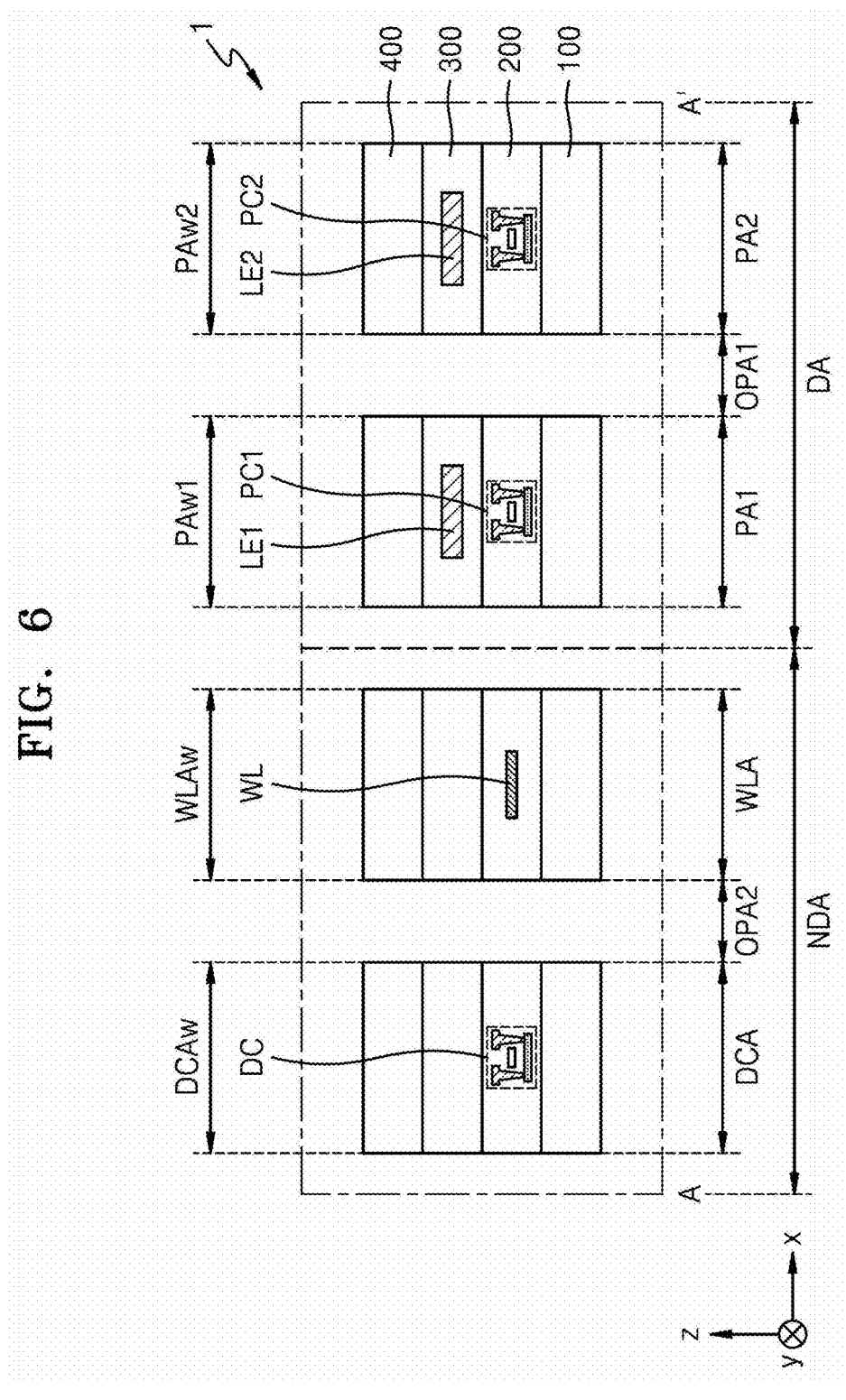
FIG. 6 is a schematic cross-sectional view of the display device of FIG. 3, taken along line A-A' in FIG. 3.

FIG. 6 is a schematic cross-sectional view of the display device 1 of FIG. 3, taken along line A-A' in FIG. 3.

Referring to FIG. 6, the display device 1 may include a substrate 100, a circuit layer 200, a light-emitting element layer 300, and an encapsulation layer 400. The substrate 100 may include a display area DA and a non-display area NDA.

The display area DA may include a first pixel area PA1 and a second pixel area PA2, and a first opening area OPA1 may be defined in the display area DA. The first pixel area PA1 and the second pixel area PA2 may be areas in which light-emitting elements are disposed. The first opening area OPA1 may be defined between the first pixel area PA1 and the second pixel area PA2. The first opening area OPA1 may be an area in which a light-emitting element is not disposed. The first opening area OPA1 may be an area in which the substrate 100, the circuit layer 200, the light-emitting element layer 300, and the encapsulation layer 400 are not disposed in the display area DA. Accordingly, in the display area DA, the stretchability of the display device 1 may increase. Although not shown in the drawings, the display area DA may further include a first connection area extending from the first pixel area PA1 to the second pixel area PA2. Accordingly, the first pixel area PA1 and the second pixel area PA2 may be connected to each other by the first connection area. In a plan view, at least a portion of the first opening area OPA1 may be defined by an edge of the first pixel area PA1, an edge of the second pixel area PA2, and an edge of the first connection area.

The non-display area NDA may include a driving circuit area DCA and a wiring area WLA, and a second opening area OPA2 may be defined in the non-display area NDA. The driving circuit area DCA may be an area in which a driving circuit DC is disposed. The wiring area WLA may be an area in which a wiring line WL is disposed. In the wiring area WLA, the driving circuit DC may not be disposed. The second opening area OPA2 may be defined between the driving circuit area DCA and the wiring area WLA. The second opening area OPA2 may be an area in which the substrate 100, the circuit layer 200, the light-emitting element layer 300, and the encapsulation layer 400 are not disposed in the non-display area NDA. Accordingly, in the non-display area NDA, the stretchability of the display device 1 may increase. Although not shown in the drawings, the non-display area NDA may further include a second connection area extending from the driving circuit area DCA to the wiring area WLA. Accordingly, the driving circuit area DCA and the wiring area WLA may be connected to each other by the second connection area. In a plan view, at least a portion of the second opening area OPA2 may be defined by an edge of the driving circuit area DCA, an edge of the wiring area WLA, and an edge of the second connection area.

A width DCAw of the driving circuit area DCA and a width WLAw of the wiring area WLA may be equal to each other. In an embodiment, the width DCAw of the driving circuit area DCA may be a distance between edges of the driving circuit area DCA, which are opposite to each other in a first direction (e.g., an x direction or a –x direction). The width WLAw of the wiring area WLA may be a distance between edges of the wiring area WLA, which are opposite to each other in the first direction (e.g., the x direction or the –x direction). That is, in the description, a width of an element may mean a length of the element taken along a direction which is perpendicular to a main length extension direction of the element.

The width DCAw of the driving circuit area DCA, the width WLAw of the wiring area WLA, and a width PAw1 of the first pixel area PA1 may be equal to one another. The width DCAw of the driving circuit area DCA, the width WLAw of the wiring area WLA, the width PAw1 of the first pixel area PA1, and a width PAw2 of the second pixel area PA2 may be equal to one another. In an embodiment, the width PAw1 of the first pixel area PA1 may be a distance between edges of the first pixel area PA1, which are opposite to each other in the first direction (e.g., the x direction or the –x direction). The width PAw2 of the second pixel area PA2 may be a distance between edges of the second pixel area PA2, which are opposite to each other in the first direction (e.g., the x direction or the –x direction).

The circuit layer 200 may be disposed on the substrate 100. The circuit layer 200 may include a first pixel circuit PC1, a second pixel circuit PC2, a driving circuit DC, a wiring line WL, and an insulating layer. The first pixel circuit PC1 may overlap the first pixel area PA1. The first pixel circuit PC1 may include at least one transistor and at least one storage capacitor. The first pixel circuit PC1 may drive a first light-emitting element LE1. The second pixel circuit PC2 may overlap the second pixel area PA2. The second pixel circuit PC2 may include at least one transistor and at least one storage capacitor. The second pixel circuit PC2 may drive a second light-emitting element LE2.

The driving circuit DC may overlap the driving circuit area DCA. The driving circuit DC may include at least one transistor and at least one storage capacitor. The driving circuit DC may generate and output a signal applied to the first pixel circuit PC1 and/or the second pixel circuit PC2.

The wiring line WL may overlap the wiring area WLA. In an embodiment, although not shown in the drawings, the wiring line WL may extend to the second connection area and be electrically connected to the driving circuit DC. In an embodiment, although not shown in the drawings, the wiring line WL may extend from the non-display area NDA to the display area DA and be electrically connected to the first pixel circuit PC1 and/or the second pixel circuit PC2. Accordingly, the wiring line WL may transmit a signal output from the driving circuit DC to the first pixel circuit PC1 and/or the second pixel circuit PC2.

The insulating layer may insulate the components of the circuit layer 200. The insulating layer may include an inorganic material and/or an organic material.

In the illustrated embodiment, the first opening area OPA1 may be defined in the display area DA and the second opening area OPA2 may be defined in the non-display area NDA. Accordingly, stretchability may be high in both the display area DA and the non-display area NDA. Also, the non-display area NDA may include a wiring area WLA having a width WLAw equal to the width DCAw of the driving circuit area DCA. The driving circuit DC may be electrically connected to various wiring lines WL, and various wiring lines WL may be arranged in the non-display area NDA. In the illustrated embodiment, because the non-display area NDA includes the wiring area WLA in which the wiring line WL is disposed, the wiring lines WL may be dispersed while the second opening area OPA2 is maintained. Accordingly, the display device 1 may maintain high stretchability even in the non-display area NDA.

The light-emitting element layer 300 may be disposed on the circuit layer 200. The light-emitting element layer 300 may include a first light-emitting element LE1 and a second light-emitting element LE2. The first light-emitting element LE1 may overlap the first pixel area PA1. Although not shown in the drawings, the first light-emitting element LE1 may be electrically connected to the first pixel circuit PC1. The second light-emitting element LE2 may overlap the second pixel area PA2. Although not shown in the drawings, the second light-emitting element LE2 may be electrically connected to the second pixel circuit PC2. In an embodiment, the first light-emitting element LE1 may be a first organic light-emitting diode. The second light-emitting element LE2 may be a second organic light-emitting diode.

The encapsulation layer 400 may be disposed on the light-emitting element layer 300. The encapsulation layer 400 may protect the light-emitting element layer 300. The encapsulation layer 400 may cover the first light-emitting element LE1 and the second light-emitting element LE2. In an embodiment, the encapsulation layer 400 may include at least one inorganic encapsulation layer and at least one organic encapsulation layer. The at least one inorganic encapsulation layer may include at least one inorganic material of aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). In an embodiment, $ZnO_x$ may include zinc oxide (ZnO) and/or zinc peroxide ($ZnO_2$). The at least one organic encapsulation layer may include a polymer-based material. In an embodiment, the polymer-based material may include at least one of acrylic resin, epoxy-based resin, polyimide, and polyethylene. In an embodiment, the at least one organic encapsulation layer may include an acrylate.

Although not shown in the drawings, a touch sensor layer and an optical function layer may be further disposed on the encapsulation layer 400. The touch sensor layer may be disposed on the encapsulation layer 400. The touch sensor layer may sense coordinate information according to an external input, e.g., a touch event. The touch sensor layer may include a sensor electrode and touch wiring lines connected to the sensor electrode. The touch sensor layer may sense an external input by a self-capacitance method or a mutual capacitance method.

The touch sensor layer may be formed on the encapsulation layer 400. In an alternative embodiment, the touch sensor layer may be separately formed on a touch substrate and then coupled to the encapsulation layer 400 through an adhesive layer such as an optically transparent adhesive layer. In an embodiment, the touch sensor layer may be formed directly on the encapsulation layer 400, and in this case, the adhesive layer may not be between the touch sensor layer and the encapsulation layer 400.

The optical function layer may be disposed on the touch sensor layer. The optical function layer may reduce the reflectance of light (e.g., external light) incident toward the display device 1 from the outside. The optical function layer may improve color purity of light emitted from the display device 1. In an embodiment, the optical functional layer may include a retarder and a polarizer. In an embodiment, the retarder may be of a film type or a liquid crystal coating type, and may include a λ/2 phase delay and/or a λ/4 phase delay. However, the invention is not limited thereto, and the retarder may include various other phase delays. The polarizer may also be of a film type or a liquid crystal coating type. The film type may include a stretched synthetic resin film, and the liquid crystal coating type may include liquid crystals arranged in a predetermined arrangement. The retarder and the polarizer may each further include a protective film.

In another embodiment, the optical function layer may include a black matrix and color filters. The color filters may be arranged by considering the color of light emitted from each of the plurality of pixels of the display device 1. Each of the color filters may include a red, green, or blue pigment or dye. In an alternative embodiment, each of the color filters may further include quantum dots in addition to the aforementioned pigment or dye. In an alternative embodiment, some of the color filters may not include the aforementioned pigment or dye, and may include scattering particles such as titanium oxide.

In another embodiment, the optical function layer may include a destructive interference structure. The destructive interference structure may include a first reflective layer and a second reflective layer, disposed on different layers. First reflected light and second reflected light respectively reflected from the first reflective layer and the second reflective layer may destructively interfere, and thus external light reflectance may be reduced.

Figure 7:
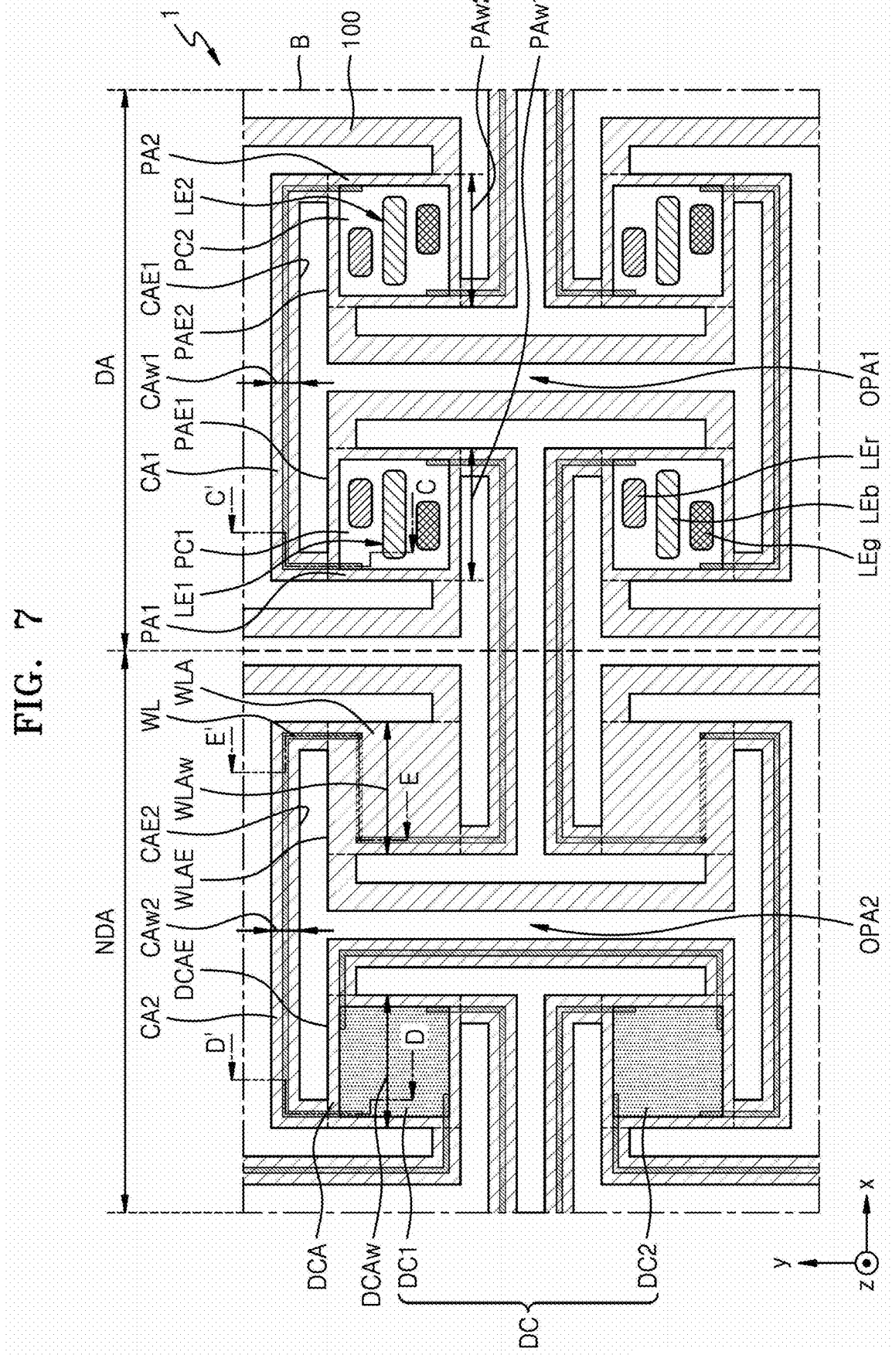
FIG. 7 is an enlarged plan view illustrating an embodiment of a portion B of the display device of FIG. 3.

FIG. 7 is an enlarged plan view illustrating an embodiment of a portion B of the display device 1 of FIG. 3.

Referring to FIG. 7, the display device 1 may include a substrate 100, a circuit layer, and a light-emitting element layer. The substrate 100 may include a display area DA and a non-display area NDA. The display area DA may include a pixel area and a first connection area CA1, and a first opening area OPA1 may be defined in the display area DA. A plurality of pixel areas may be provided. The plurality of pixel areas may be arranged in a first direction (e.g., an x direction or a −x direction) and/or a second direction (e.g., a y direction or a −y direction). In an embodiment, the pixel area may include a first pixel area PA1 and a second pixel area PA2. The first pixel area PA1 and the second pixel area PA2 may be adjacent to each other in the first direction (e.g., the x direction or the −x direction).

The first connection area CA1 may be a first bridge area in the display area DA. Adjacent pixel areas may extend to or from each other by the first connection area CA1. In an embodiment, one pixel area may extend to or from four first connection areas CA1, for example. Each of the four first connection areas CA1 may extend to adjacent pixel areas. Accordingly, the adjacent pixel areas may extend to or from each other. In an embodiment, the first connection area CA1 may extend from the first pixel area PA1 to the second pixel area PA2. The first pixel area PA1 and the second pixel area PA2 may extend to or from each other by the first connection area CA1. In other words, the first pixel area PA1, the first connection area CA1, and the second pixel area PA2 may be unitary with each other.

Herein, an expression that a first area of the substrate 100 and a second area of the substrate 100 extend to or from each other by a connection area of the substrate 100 means that the connection area extends from the first area to the second area and the first area, the connection area, and the second area are unitary with one another.

A direction in which the first connection area CA1 extends may be changed. In an embodiment, the direction in which the first connection area CA1 extends may be changed from the first direction (e.g., the x direction or the −x direction) to the second direction (e.g., the y direction or the −y direction), for example. In another embodiment, the direction in which the first connection area CA1 extends may be changed from the second direction (e.g., the y direction or the −y direction) to the first direction (e.g., the x direction or the −x direction). Although FIG. 7 illustrates a case in which the edge of the first connection area CA1 is bent at a right angle, the invention is not limited thereto. In another embodiment, the edge of the first connection area CA1 may be bent at various angles. In another embodiment, the edge of the first connection area CA1 may be curved.

The first opening area OPA1 may be an empty area in which components of the display device 1 are not disposed in the display area DA. The first opening area OPA1 may be defined between adjacent pixel areas. In an embodiment, the first opening area OPA1 may be defined between the first pixel area PA1 and the second pixel area PA2. In a plan view, the first opening area OPA1 may be defined by edges of adjacent pixel areas and edges of the first connection areas CA1. In an embodiment, in a plan view, at least a portion of the first opening area OPA1 may be defined by an edge PAE1 of the first pixel area PA1, an edge PAE2 of the second pixel area PA2, and an edge CAE1 of the first connection area CA1, for example.

In FIG. 7, four pixel areas and first connection areas CA1 extending to or from each of the four pixel areas are shown, and the four pixel areas and the first connection areas CA1 may be defined as a first basic unit. The first basic unit may be repeated in the first direction (e.g., the x direction or the −x direction) and/or the second direction (e.g., the y direction or the −y direction) in the display area DA.

The non-display area NDA may include a driving circuit area DCA, a wiring area WLA and a second connection area CA2, and a second opening area OPA2 may be defined in the non-display area NDA. In an embodiment, the driving circuit area DCA and the wiring area WLA may be adjacent to each other in the first direction (e.g., the x direction or the −x direction). A plurality of driving circuit areas DCA may be provided, and a plurality of wiring areas WLA may be provided. In an embodiment, the plurality of driving circuit areas DCA may be arranged in the second direction (e.g., the y direction or the −y direction), for example. The plurality of wiring areas WLA may be arranged in the second direction (e.g., the y direction or the −y direction).

The second connection area CA2 may be a second bridge area in the non-display area NDA. Each of the second connection areas CA2 may extend from the driving circuit area DCA or the wiring area WLA to an adjacent driving circuit area DCA or an adjacent wiring area WLA. One driving circuit area DCA may extend to or from four second connection areas CA2. One wiring area WLA may extend to or from four second connection areas CA2. Each of the four second connection areas CA2 may extend to or from an adjacent driving circuit area DCA or an adjacent wiring area WLA.

A direction in which the second connection area CA2 extends may be changed. In an embodiment, the direction in which the second connection area CA2 extends may be changed from the first direction (e.g., the x direction or the −x direction) to the second direction (e.g., the y direction or the −y direction), for example. In another embodiment, the direction in which the second connection area CA2 extends may be changed from the second direction (e.g., the y direction or the −y direction) to the first direction (e.g., the x direction or the −x direction). Although FIG. 7 illustrates a case in which the edge of the second connection area CA2 is bent at a right angle, the invention is not limited thereto. In another embodiment, the edge of the second connection area CA2 may be bent at various angles. In another embodiment, the edge of the second connection area CA2 may be curved.

The second opening area OPA2 may be an empty area in which components of the display device 1 are not disposed in the non-display area NDA. The second opening area OPA2 may be defined between the driving circuit area DCA and the wiring area WLA. In an alternative embodiment, the second opening area OPA2 may be defined between adjacent driving circuit areas DCA. In an alternative embodiment, the second opening area OPA2 may be defined between adjacent wiring areas WLA. In a plan view, the second opening area OPA2 may be defined by edges DCAE of the driving circuit area DCA, edges WLAE of the wiring area WLA, and edges CAE2 of the second connection area CA2. In the plan view, at least a portion of the second opening area OPA2 may be defined by an edge DCAE of the driving circuit area DCA, an edge WLAE of the wiring area WLA, and an edge CAE2 of the second connection area CA2.

In FIG. 7, two driving circuit areas DCA, two wiring areas WLA, and second connection areas CA2 extending to or from each of the driving circuit areas DCA and wiring areas WLA may be defined as a second basic unit. The second basic unit may be repeated in the first direction (e.g., the x direction or the −x direction) and/or the second direction (e.g., the y direction or the −y direction) in the non-display area NDA.

In a plan view, the shape of the driving circuit area DCA, the shape of the wiring area WLA, the shape of the first pixel area PA1, and the shape of the second pixel area PA2 may be the same as one another. In a plan view, a width DCAw of the driving circuit area DCA and a width WLAw of the wiring area WLA may be equal to each other. In an embodiment, the width DCAw of the driving circuit area DCA in a plan view may be a distance between edges of the driving circuit area DCA, which are opposite to each other in the first direction (e.g., the x direction or the −x direction). In a plan view, the width WLAw of the wiring area WLA may be a distance between edges of the wiring area WLA, which are opposite to each other in the first direction (e.g., the x direction or the −x direction).

In a plan view, the width DCAw of the driving circuit area DCA, the width WLAw of the wiring area WLA, and a width PAw1 of the first pixel area PA1 may be equal to one another. In a plan view, the width DCAw of the driving circuit area DCA, the width WLAw of the wiring area WLA, the width PAw1 of the first pixel area PA1, and a width PAw2 of the second pixel area PA2 may be equal to one another. In an embodiment, the width PAw1 of the first pixel area PA1 in a plan view may be a distance between edges of the first pixel area PA1, which are opposite to each other in the first direction (e.g., the x direction or the −x direction). In a plan view, the width PAw2 of the second pixel area PA2 may be a distance between edges of the second pixel area PA2, which are opposite to each other in the first direction (e.g., the x direction or the −x direction).

The shape of the first connection area CA1 and the shape of the second connection area CA2 may be the same as each other. A width CAw1 of the first connection area CA1 and a width CAw2 of the second connection area CA2 may be equal to each other. In an embodiment, the width CAw1 of the first connection area CA1 may be a distance between edges of the first connection area CA1, which are opposite to each other in the second direction (e.g., the y direction or the −y direction). The width CAw2 of the second connection area CA2 may be a distance between edges of the second connection area CA2, which are opposite to each other in the second direction (e.g., the y direction or the −y direction). Accordingly, the shape of the substrate 100 in the display area DA and the shape of the substrate 100 in the non-display area NDA may be the same as each other. Unlike the illustrated embodiment, when the shape of the substrate 100 in the display area DA and the shape of the substrate 100 in the non-display area NDA are different from each other, stress may be concentrated at the boundary between the display area DA and the non-display area NDA when an external force is applied to the display device 1. In this case, the display device 1 may be damaged at the boundary between the display area DA and the non-display area NDA. In the illustrated embodiment, because the shape of the substrate 100 in the display area DA and the shape of the substrate 100 in the non-display area NDA are the same, a phenomenon in which stress is concentrated at the boundary between the display area DA and the non-display area NDA may be prevented or reduced.

The circuit layer may be disposed on the substrate 100. The circuit layer may include a first pixel circuit PC1, a second pixel circuit PC2, a driving circuit DC, and a wiring line WL. The first pixel circuit PC1 may overlap the first pixel area PA1. The second pixel circuit PC2 may overlap the second pixel area PA2. The driving circuit DC may overlap the driving circuit area DCA. In an embodiment, the driving circuit DC may include a first driving circuit DC1 and a second driving circuit DC2. The first driving circuit DC1 and the second driving circuit DC2 may each be disposed in the driving circuit area DCA. The first driving circuit DC1 may generate and output a signal to be applied to pixel circuits disposed in the same row. The second driving circuit DC2 may generate and output a signal to be applied to pixel circuits disposed in the same row.

The wiring line WL may overlap the wiring area WLA. The wiring line WL may extend from the wiring area WLA to the second connection area CA2. The wiring line WL may be electrically connected to the driving circuit DC. In an embodiment, the wiring line WL may be a signal line transmitting an external signal or a previous signal. In another embodiment, the wiring line WL may be a clock signal line that transmits a clock signal for driving the driving circuit DC. In another embodiment, the wiring line WL may be a power supply line that transmits a rated voltage for driving the driving circuit DC. In another embodiment, the wiring line WL may be a signal line that transmits a signal output from the driving circuit DC to a pixel circuit. Accordingly, pixel circuits arranged in the same row as the driving circuit DC may receive a signal through the wiring line WL. In another embodiment, the wiring line WL may be a carry signal line that transmits a carry signal output from the first driving circuit DC1 to the second driving circuit DC2.

As such, the types of wiring lines WL connected to the driving circuit DC may be various. When the wiring area WLA is omitted, various wiring lines WL may be integrated in a connection area connected to the driving circuit area DCA, and it may be inevitable to increase the width of the connection area. When the width of the connection area increases, the display device 1 may not be flexible in the non-display area NDA. In the illustrated embodiment, the non-display area NDA may include the driving circuit area DCA and the wiring area WLA, and various wiring lines WL electrically connected to the driving circuit DC may be dispersed. Accordingly, the width of the second connection area CA2 may be kept small and the display device 1 may be flexible in the non-display area NDA.

The light-emitting element layer may be disposed on the circuit layer. The light-emitting element layer may include a light-emitting element. In an embodiment, the light-emitting element layer may include a first light-emitting element LE1 and a second light-emitting element LE2. The first light-emitting element LE1 may overlap the first pixel area PA1. The first light-emitting element LE1 may be electrically connected to the first pixel circuit PC1. The second light-emitting element LE2 may overlap the second pixel area PA2. The second light-emitting element LE2 may be electrically connected to the second pixel circuit PC2.

In an embodiment, the first light-emitting element LE1 and/or the second light-emitting element LE2 may include a red light-emitting element LEr, a green light-emitting element LEg, and a blue light-emitting element LEb. The red light-emitting element LEr, the green light-emitting element LEg, and the blue light-emitting element LEb may emit red light, green light, and blue light, respectively. In another embodiment, the first light-emitting element LE1 and/or the second light-emitting element LE2 may include a red light-emitting element LEr, a green light-emitting element LEg, a blue light-emitting element LEb, and a white light-emitting element. Hereinafter, a case in which the first light-emitting element LE1 and/or the second light-emitting element LE2 includes the red light-emitting element LEr, the green light-emitting element LEg, and the blue light-emitting element LEb will be mainly described in detail.

Figure 8A:
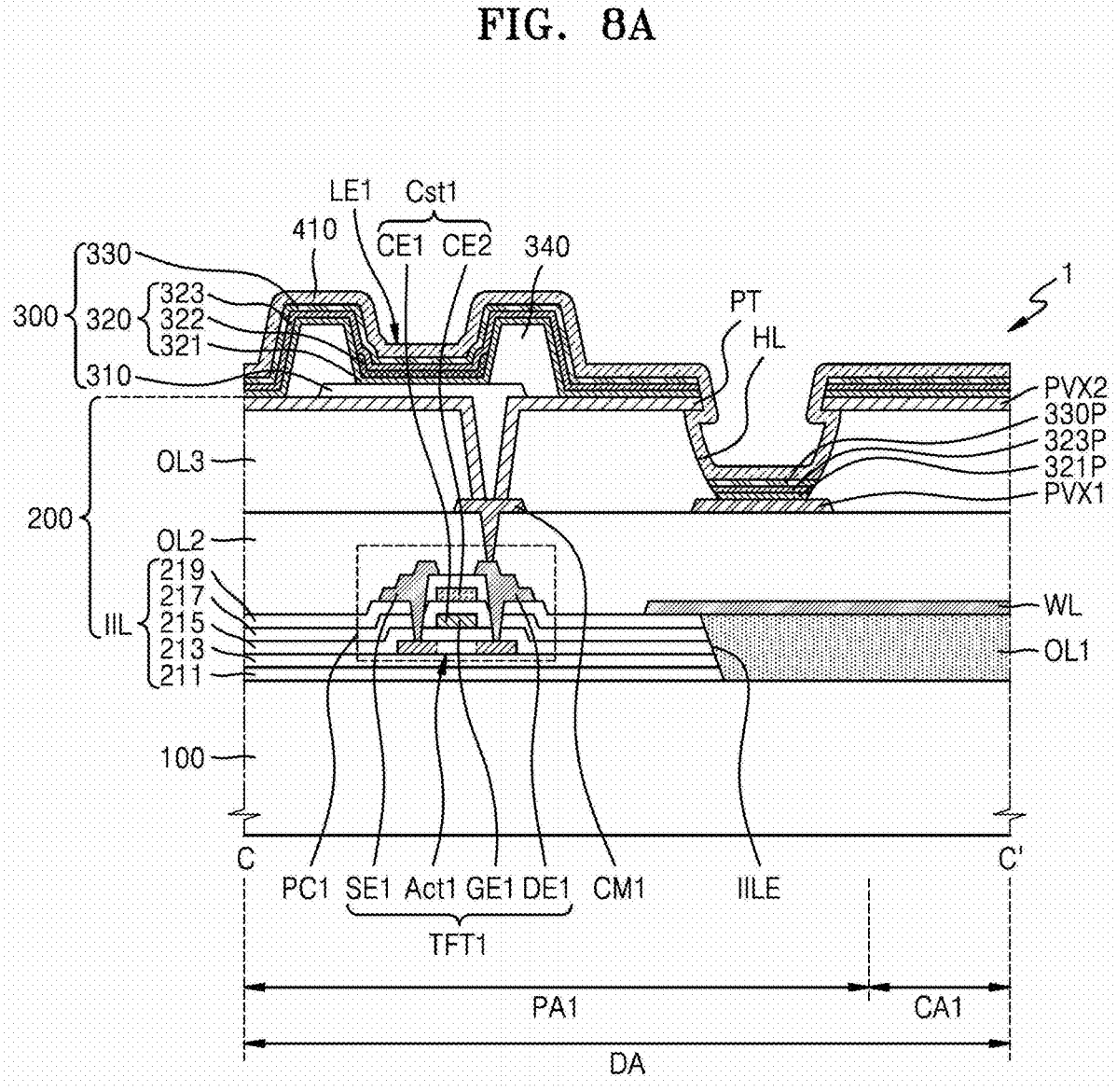
FIG. 8A is a schematic cross-sectional view of the display device of FIG. 7, taken along line C-C' in FIG. 7.

FIG. 8A is a schematic cross-sectional view of the display device 1 of FIG. 7, taken along line C-C' in FIG. 7.

Referring to FIG. 8A, the display device 1 may include a substrate 100, a circuit layer 200, a light-emitting element layer 300, and an inorganic encapsulation layer 410. The substrate 100 may include a display area DA and a non-display area. The display area DA may include a first pixel area PA1 and a first connection area CA1. In an embodiment, the substrate 100 may include a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the substrate 100 may have a multilayer structure including a base layer including the aforementioned polymer resin and a barrier layer (not shown). The substrate 100 including the polymer resin may have flexible, rollable, and/or bendable properties. In some embodiments, the substrate 100 may include glass.

The circuit layer 200 may be disposed on the substrate 100. The circuit layer 200 may include a first pixel circuit PC1, a wiring line WL, an inorganic insulating layer IIL, a first organic insulating layer OL1, a second organic insulating layer OL2, a first connection electrode CM1, a third organic insulating layer OL3, a first inorganic layer PVX1, and a second inorganic layer PVX2. The first pixel circuit PC1 may overlap the first pixel area PA1. The first pixel circuit PC1 may include a first transistor TFT1 and a first storage capacitor Cst1. The first transistor TFT1 may include a first semiconductor layer Act1, a first gate electrode GE1, a first source electrode SE1, and a first drain electrode DE1. The first storage capacitor Cst1 may include a first capacitor electrode CE1 and a second capacitor electrode CE2.

The inorganic insulating layer IIL may be disposed on the substrate 100. The inorganic insulating layer IIL may include a barrier layer 211, a buffer layer 213, a first gate insulating layer 215, a second gate insulating layer 217, and an inter-insulating layer 219.

The barrier layer 211 may be disposed on the substrate 100. The barrier layer 211 may be a layer that prevents or reduces penetration of foreign materials. In an embodiment, the barrier layer 211 may include a single layer or multiple layers including an inorganic material such as $SiN_x$, $SiO_2$, or SiON.

The buffer layer 213 may be disposed on the barrier layer 211. In an embodiment, the buffer layer 213 may include an inorganic insulating material such as $SiN_x$, SiON, or $SiO_2$, and may include a single layer or multiple layers including the aforementioned inorganic insulating material.

The first semiconductor layer Act1 may be disposed on the buffer layer 213. The first semiconductor layer Act1 may include polysilicon. In an alternative embodiment, the first semiconductor layer Act1 may include amorphous silicon, an oxide semiconductor, or an organic semiconductor. In an embodiment, the first semiconductor layer Act1 may include a channel region, and a source region and a drain region disposed on opposite sides of the channel region, respectively.

The first gate insulating layer 215 may be disposed on the first semiconductor layer Act1 and the buffer layer 213. In an embodiment, the first gate insulating layer 215 may include an inorganic insulating material, such as $SiO_2$, $SiN_x$, SiON, $Al_2O_3$, $TiO_2$, $Ta_2O_5$, hafnium oxide ($HfO_2$), or $ZnO_x$. $ZnO_x$ may include zinc oxide (ZnO) and/or zinc peroxide ($ZnO_2$).

The first gate electrode GE1 may be disposed on the first gate insulating layer 215. The first gate electrode GE1 may overlap the channel region of the first semiconductor layer Act1. The first gate electrode GE1 may include a low-resistance metal material. In an embodiment, the first gate electrode GE1 may include a conductive material including molybdenum (Mo), aluminum (Al), copper (Cu), titanium (Ti), or the like, and may be provided as a multi-layer or a single layer including the conductive material.

The second gate insulating layer 217 may be disposed on the first gate electrode GE1 and the first gate insulating layer 215. In an embodiment, the second gate insulating layer 217 may include an inorganic insulating material, such as $SiO_2$, $SiN_x$, SiON, $Al_2O_3$, $TiO_2$, $Ta_2O_5$, $HfO_2$, or $ZnO_x$.

The second capacitor electrode CE2 may be disposed on the second gate insulating layer 217. The second capacitor electrode CE2 may overlap the first gate electrode GE1. In this case, the first gate electrode GE1 may function as the first capacitor electrode CE1. Although FIG. 8A illustrates a case in which the first storage capacitor Cst1 and the first transistor TFT1 overlap each other, the invention is not limited thereto. In another embodiment, the first storage capacitor Cst1 and the first transistor TFT1 may not overlap each other. In this case, the first capacitor electrode CE1 and the first gate electrode GE1 may be separate electrodes. In an embodiment, the second capacitor electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the aforementioned materials.

The inter-insulating layer 219 may be disposed on the second capacitor electrode CE2 and the second gate insulating layer 217. In an embodiment, the inter-insulating layer 219 may include an inorganic insulating material, such as $SiO_2$, $SiN_x$, SiON, $Al_2O_3$, $TiO_2$, $Ta_2O_5$, $HfO_2$, or $ZnO_x$.

Each of the first source electrode SE1 and the first drain electrode DE1 may be disposed on the inter-insulating layer 219. Each of the first source electrode SE1 and the first drain electrode DE1 may be connected to the first semiconductor layer Act1 through contact holes provided in the first gate insulating layer 215, the second gate insulating layer 217, and the inter-insulating layer 219. At least one of the first source electrode SE1 and the first drain electrode DE1 may include a conductive material including Mo, Al, Cu, Ti, or the like, and may be provided as a multi-layer or a single layer including the conductive material. In an embodiment, at least one of the first source electrode SE1 and the first drain electrode DE1 may have a multilayer structure of Ti/Al/Ti.

In an embodiment, the inorganic insulating layer IIL may overlap the first pixel area PA1 and may not overlap the first connection area CA1. The inorganic insulating layer IIL may include an end portion IILE of the inorganic insulating layer IIL facing the first connection area CA1. Accordingly, the display device 1 may be flexible in the first connection area CA1. Although FIG. 8A illustrates a case in which the end portion IILE of the inorganic insulating layer IIL does not have a step difference, the invention is not limited thereto. In another embodiment, the end portion IILE of the inorganic insulating layer IIL may have a step difference. In some embodiments, the inorganic insulating layer IIL may be continuously disposed in the first pixel area PA1 and the first connection area CA1. Hereinafter, a case in which the inorganic insulating layer IIL includes the end portion IILE will be described in detail.

The first organic insulating layer OL1 may overlap the first connection area CA1. The first organic insulating layer OL1 may be a first planarization layer. The first organic insulating layer OL1 may cover the end portion IILE of the inorganic insulating layer IIL. The first organic insulating layer OL1 may reduce a height difference when the wiring line WL extends from the first pixel area PA1 to the first connection area CA1, or may absorb stress that may be applied to the wiring line WL. The first organic insulating layer OL1 may include an organic material. In an embodiment, the first organic insulating layer OL1 may include an organic insulating material, such as a general purpose polymer such as polymethylmethacrylate ("PMMA") or polystyrene ("PS"), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

The wiring line WL may be disposed on the inorganic insulating layer IIL and the first organic insulating layer OL1. The wiring line WL may extend from the first pixel area PA1 to the first connection area CA1. Although not shown in the drawings, the wiring line WL may be electrically connected to the first pixel circuit PC1. The wiring line WL may include a conductive material including Mo, Al, Cu, Ti, or the like, and may be provided as a multi-layer or a single layer including the conductive material. In an embodiment, the wiring line WL may have a multilayer structure of Ti/Al/Ti.

The second organic insulating layer OL2 may be disposed on the inorganic insulating layer IIL, the first source electrode SE1, the first drain electrode DE1, and the wiring line WL. The second organic insulating layer OL2 may be a second planarization layer. The second organic insulating layer OL2 may include an organic material. In an embodiment, the second organic insulating layer OL2 may include an organic insulating material, such as a general purpose polymer such as PMMA or PS, a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

The wiring line WL may be disposed between the first organic insulating layer OL1 and the second organic insulating layer OL2 in the first connection area CA1. When the shape of the display device 1 is deformed, the first connection area CA1 may be bent. In this case, a stress neutral plane may be in the display device 1. When the wiring line WL is not disposed between the first organic insulating layer OL1 and the second organic insulating layer OL2, an excessive stress may be applied to the wiring line WL. In the illustrated embodiment, because the wiring line WL is disposed between the first organic insulating layer OL1 and the second organic insulating layer OL2, the wiring line WL may be disposed on a stress neutral plane. Accordingly, the stress applied to the wiring line WL may be reduced.

The first connection electrode CM1 may overlap the first pixel area PA1 and may be disposed on the second organic insulating layer OL2. The first connection electrode CM1 may be electrically connected to the first pixel circuit PC1 through a contact hole of the second organic insulating layer OL2. The first connection electrode CM1 may include a conductive material including Mo, Al, Cu, Ti, or the like, and may be provided as a multi-layer or a single layer including the conductive material. The first connection electrode CM1 may have a multilayer structure of Ti/Al/Ti.

The third organic insulating layer OL3 may be disposed on the second organic insulating layer OL2 and the first connection electrode CM1. The third organic insulating layer OL3 may be a third planarization layer. The third organic insulating layer OL3 may include an organic material. In an embodiment, the third organic insulating layer OL3 may include an organic insulating material, such as a general purpose polymer such as PMMA or PS, a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

In an embodiment, an additional wiring line may not be disposed between the second organic insulating layer OL2 and the third organic insulating layer OL3 in the first connection area CA1. In the illustrated embodiment, a stress neutral plane may be disposed between the first organic insulating layer OL1 and the second organic insulating layer OL2, and thus, excessive stress may not be applied to the wiring line WL. When an additional wiring line is disposed between the second organic insulating layer OL2 and the third organic insulating layer OL3, the additional wiring line may not be disposed on the stress neutral plane and excessive stress may be applied. Accordingly, an additional wiring line may not be disposed between the second organic insulating layer OL2 and the third organic insulating layer OL3, and the reliability of the display device 1 may increase.

The first inorganic layer PVX1 may be disposed between the second organic insulating layer OL2 and the third organic insulating layer OL3. The first inorganic layer PVX1 may include an inorganic material.

A hole HL may be defined in the third organic insulating layer OL3. The hole HL may expose the first inorganic layer PVX1. The hole HL may be formed by etching the third organic insulating layer OL3. The first inorganic layer PVX1 may prevent or reduce over-etching of a component disposed under the first inorganic layer PVX1.

The second inorganic layer PVX2 may be disposed on the third organic insulating layer OL3. The second inorganic layer PVX2 may include a protruding tip PT protruding toward the center of the hole HL. A lower surface of the protruding tip PT of the second inorganic layer PVX2 may be exposed to the hole HL.

The light-emitting element layer 300 may be disposed on the circuit layer 200. The light-emitting element layer 300 may include a first light-emitting element LE1 and a pixel-defining layer 340. The first light-emitting element LE1 may be an organic light-emitting diode. The first light-emitting element LE1 may include a pixel electrode 310, an intermediate layer 320, and an opposite electrode 330.

The pixel electrode 310 may be electrically connected to the first connection electrode CM1 through a contact hole of the third organic insulating layer OL3. Accordingly, the first light-emitting element LE1 may be electrically connected to the first pixel circuit PC1. In an embodiment, the pixel electrode 310 may include a conductive oxide, such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 310 may include a reflective layer including Ag, Mg, Al, Pt, Pd, Au, Ni, Nd, Ir, Cr, or any combinations thereof. In another embodiment, the pixel electrode 310 may further include a layer including ITO, IZO, ZnO, or $In_2O_3$ above and/or under the reflective layer.

The pixel-defining layer 340 may cover the edge of the pixel electrode 310. The pixel-defining layer 340 may include a pixel opening, and the pixel opening may overlap the pixel electrode 310. The pixel opening may define an emission area of light emitted from the first light-emitting element LE1. The pixel-defining layer 340 may include an organic insulating material and/or an inorganic insulating material. In some embodiments, the pixel-defining layer 340 may include a light-blocking material.

The intermediate layer 320 may be disposed on the pixel electrode 310, the pixel-defining layer 340, and/or the second inorganic layer PVX2. The intermediate layer 320 may include an emission layer 322. The emission layer 322 may overlap the pixel electrode 310. The emission layer 322 may include a polymer or a low molecular weight organic material that emits light of a predetermined color.

The intermediate layer 320 may further include at least one of a first functional layer 321 and a second functional layer 323. The first functional layer 321 may be disposed between the pixel electrode 310 and the emission layer 322. The first functional layer 321 may include a hole transport layer ("HTL") and/or a hole injection layer ("HIL"). The second functional layer 323 may be disposed between the emission layer 322 and the opposite electrode 330. The second functional layer 323 may include an electron transport layer ("ETL") and/or an electron injection layer ("EIL"). In an embodiment, the first functional layer 321 and the second functional layer 323 may be disposed in an entirety of the first pixel area PA1 and the first connection area CA1.

The opposite electrode 330 may be disposed on the pixel electrode 310, the intermediate layer 320, and the pixel-defining layer 340. The opposite electrode 330 may include a conductive material having a low work function. In an embodiment, the opposite electrode 330 may include a (semi) transparent layer including Ag, Mg, Al, Pt, Pd, Au, Ni, Nd, Ir, Cr, Li, Ca, or an alloy thereof, for example. In an alternative embodiment, the opposite electrode 330 may further include a layer including ITO, IZO, ZnO or $In_2O_3$ on the (semi) transparent layer including the aforementioned material.

The protruding tip PT may be a component for increasing the reliability of the display device 1. At least one of the first functional layer 321 and the second functional layer 323 may include an organic material, and external oxygen or moisture may flow into the first light-emitting element LE1 through at least one of the first functional layer 321 and the second functional layer 323. The external oxygen or moisture may damage the first light-emitting element LE1. In the illustrated embodiment, because the second inorganic layer PVX2 includes the protruding tip PT protruding toward the center of the hole HL, the first functional layer 321 and the second functional layer 323 may each be disconnected around the hole HL. Accordingly, the inflow of moisture or oxygen into the first light-emitting element LE1 from the outside may be prevented or reduced. Accordingly, the reliability of the display device 1 may increase.

In an embodiment, at least one of a first functional layer pattern 321P including the same material as that of the first functional layer 321 and a second functional layer pattern 323P including the same material as that of the second functional layer 323 may be disposed in the hole HL. In an embodiment, an opposite electrode pattern 330P including the same material as that of the opposite electrode 330 may be disposed on the first functional layer pattern 321P and/or the second functional layer pattern 323P.

The inorganic encapsulation layer 410 may be disposed on the light-emitting element layer 300. The inorganic encapsulation layer 410 may be continuously disposed in an entirety of the first pixel area PA1 and the first connection area CA1. The inorganic encapsulation layer 410 may directly contact the lower surface of the protruding tip PT of the second inorganic layer PVX2. Accordingly, the inflow of moisture or oxygen into the first light-emitting element LE1 from the outside may be prevented or reduced.

In some embodiments, the organic encapsulation layer may be disposed on the inorganic encapsulation layer 410 to overlap the first light-emitting element LE1. In addition, an additional inorganic encapsulation layer may be further disposed on the organic encapsulation layer.

Figure 8B:
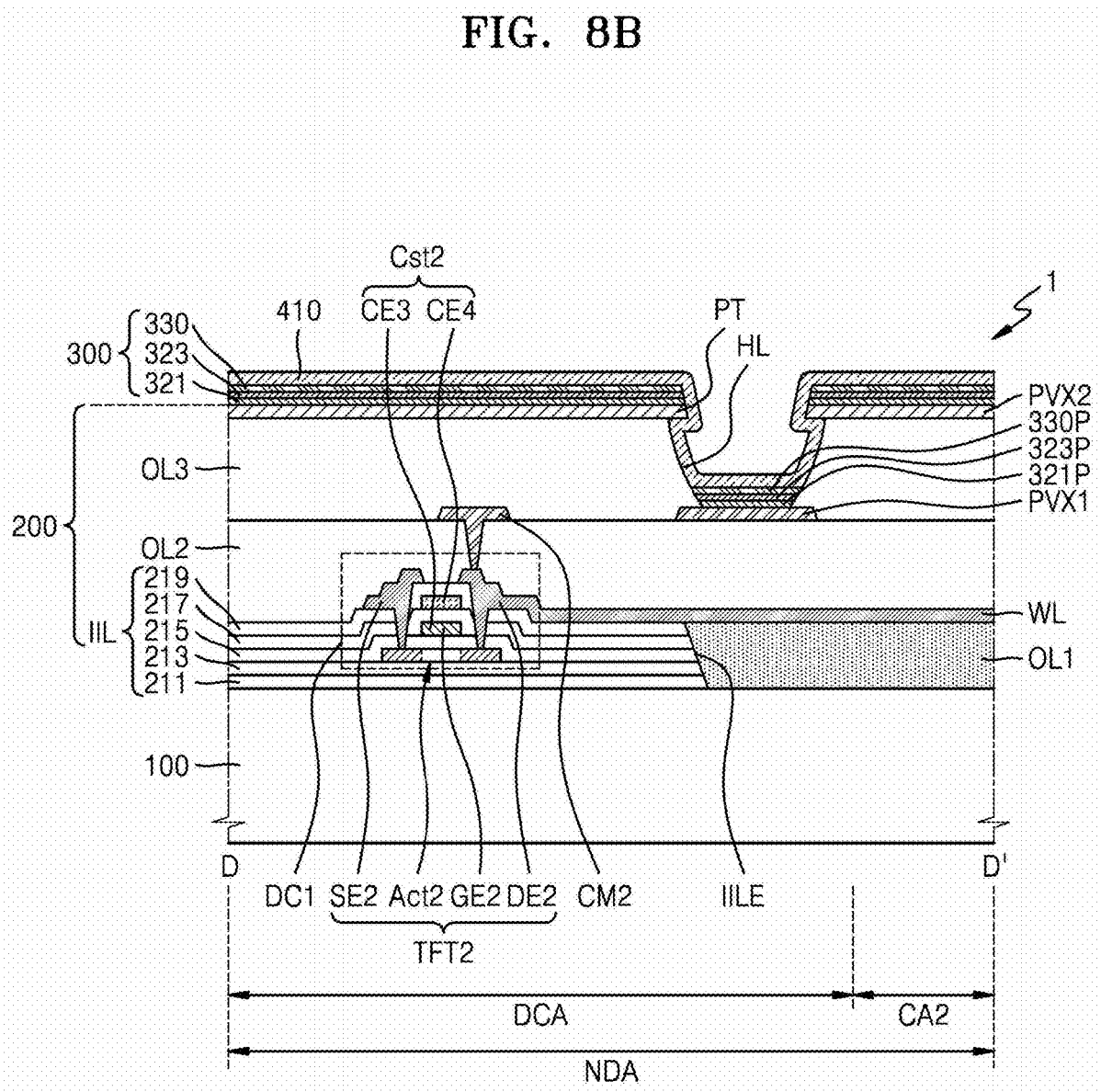
FIG. 8B is a schematic cross-sectional view of the display device of FIG. 7, taken along line D-D' in FIG. 7.

FIG. 8B is a schematic cross-sectional view of the display device 1 of FIG. 7, taken along line D-D' in FIG. 7. In FIG. 8B, the same reference numerals as those of FIG. 8A denote the same members, and thus, repeated descriptions will be omitted.

Referring to FIG. 8B, the display device 1 may include a substrate 100, a circuit layer 200, a light-emitting element layer 300, and an inorganic encapsulation layer 410. The substrate 100 may include a display area and a non-display area NDA. The non-display area NDA may include a driving circuit area DCA and a second connection area CA2.

The circuit layer 200 may be disposed on the substrate 100. The circuit layer 200 may include a first driving circuit DC1, a wiring line WL, a first organic insulating layer OL1, a second organic insulating layer OL2, a second connection electrode CM2, a third organic insulating layer OL3, a first inorganic layer PVX1, and a second inorganic layer PVX2. The first driving circuit DC1 may overlap the driving circuit area DCA. The first driving circuit DC1 may include a second transistor TFT2 and a second storage capacitor Cst2. The second transistor TFT2 may include a second semiconductor layer Act2, a second gate electrode GE2, a second source electrode SE2, and a second drain electrode DE2. The second storage capacitor Cst2 may include a third capacitor electrode CE3 and a fourth capacitor electrode CE4.

An inorganic insulating layer IIL may be disposed on the substrate 100. The inorganic insulating layer IIL may include a barrier layer 211, a buffer layer 213, a first gate insulating layer 215, a second gate insulating layer 217, and an inter-insulating layer 219.

The second semiconductor layer Act2 may be disposed between the buffer layer 213 and the first gate insulating layer 215. The second semiconductor layer Act2 may include polysilicon. In an alternative embodiment, the second semiconductor layer Act2 may include amorphous silicon, an oxide semiconductor, or an organic semiconductor. In an embodiment, the second semiconductor layer Act2 may include a channel region, and a source region and a drain region disposed on opposite sides of the channel region, respectively.

The second gate electrode GE2 may be disposed between the first gate insulating layer 215 and the second gate insulating layer 217. The second gate electrode GE2 may overlap the channel region of the second semiconductor layer Act2. The second gate electrode GE2 may include a low-resistance metal material. In an embodiment, the second gate electrode GE2 may include a conductive material including Mo, Al, Cu, Ti, or the like, and may be provided as a multi-layer or a single layer including the conductive material.

The fourth capacitor electrode CE4 may be disposed between the second gate insulating layer 217 and the inter-insulating layer 219. The fourth capacitor electrode CE4 may overlap the second gate electrode GE2. In this case, the second gate electrode GE2 may function as the third capacitor electrode CE3. Although FIG. 8B illustrates a case in which the second storage capacitor Cst2 and the second transistor TFT2 overlap each other, the invention is not limited thereto. In another embodiment, the second storage capacitor Cst2 and the second transistor TFT2 may not overlap each other. In this case, the third capacitor electrode CE3 and the second gate electrode GE2 may be separate electrodes. In an embodiment, the fourth capacitor electrode CE4 may include Al, Pt, Pd, Ag, Mg, Au, Ni, Nd, Ir, Cr, Ca, Mo, Ti, W, and/or Cu, and may include a single layer or multiple layers including the aforementioned materials.

Each of the second source electrode SE2 and the second drain electrode DE2 may be disposed on the inter-insulating layer 219. Each of the second source electrode SE2 and the second drain electrode DE2 may be connected to the second semiconductor layer Act2 through contact holes provided in the first gate insulating layer 215, the second gate insulating layer 217, and the inter-insulating layer 219. At least one of the second source electrode SE2 and the second drain electrode DE2 may include a conductive material including Mo, Al, Cu, Ti, or the like, and may be provided as a multi-layer or a single layer including the conductive material. In an embodiment, at least one of the second source electrode SE2 and the second drain electrode DE2 may have a multilayer structure of Ti/Al/Ti.

In an embodiment, the inorganic insulating layer IIL may overlap the driving circuit area DCA and may not overlap the second connection area CA2. The inorganic insulating layer IIL may include an end portion IILE of the inorganic insulating layer IIL facing the second connection area CA2. Accordingly, the display device 1 may be flexible in the second connection area CA2. In some embodiments, the inorganic insulating layer IIL may be continuously disposed in the driving circuit area DCA and the second connection area CA2. Hereinafter, a case in which the inorganic insulating layer IIL includes the end portion IILE will be described in detail.

The first organic insulating layer OL1 may overlap the second connection area CA2. The first organic insulating layer OL1 may cover the end portion IILE of the inorganic insulating layer IIL. The first organic insulating layer OL1 may reduce a height difference when the wiring line WL extends from the driving circuit area DCA to the second connection area CA2, or may absorb stress that may be applied to the wiring line WL.

The wiring line WL may be disposed on the inorganic insulating layer IIL and the first organic insulating layer OL1. The wiring line WL may extend from the driving circuit area DCA to the second connection area CA2. The wiring line WL may be electrically connected to the first driving circuit DC1. In some embodiments, the wiring line WL may be unitary with the second source electrode SE2 or the second drain electrode DE2. In some embodiments, the wiring line WL may be electrically connected to the second gate electrode GE2. Because the wiring line WL is disposed between the first organic insulating layer OL1 and the second organic insulating layer OL2 in the second connection area CA2, the wiring line WL may be disposed on a stress neutral plane. Accordingly, the stress applied to the wiring line WL may be reduced.

The second connection electrode CM2 may overlap the driving circuit area DCA and may be disposed between the second organic insulating layer OL2 and the third organic insulating layer OL3. The second connection electrode CM2 may be electrically connected to the first driving circuit DC1 through a contact hole of the second organic insulating layer OL2. The second connection electrode CM2 may include a conductive material including Mo, Al, Cu, Ti, or the like, and may be provided as a multi-layer or a single layer including the conductive material. The second connection electrode CM2 may have a multilayer structure of Ti/Al/Ti.

An emission layer may not be disposed in the non-display area NDA. In some embodiments, components of the light-emitting element layer 300 may not be disposed in the non-display area NDA.

Figure 8C:
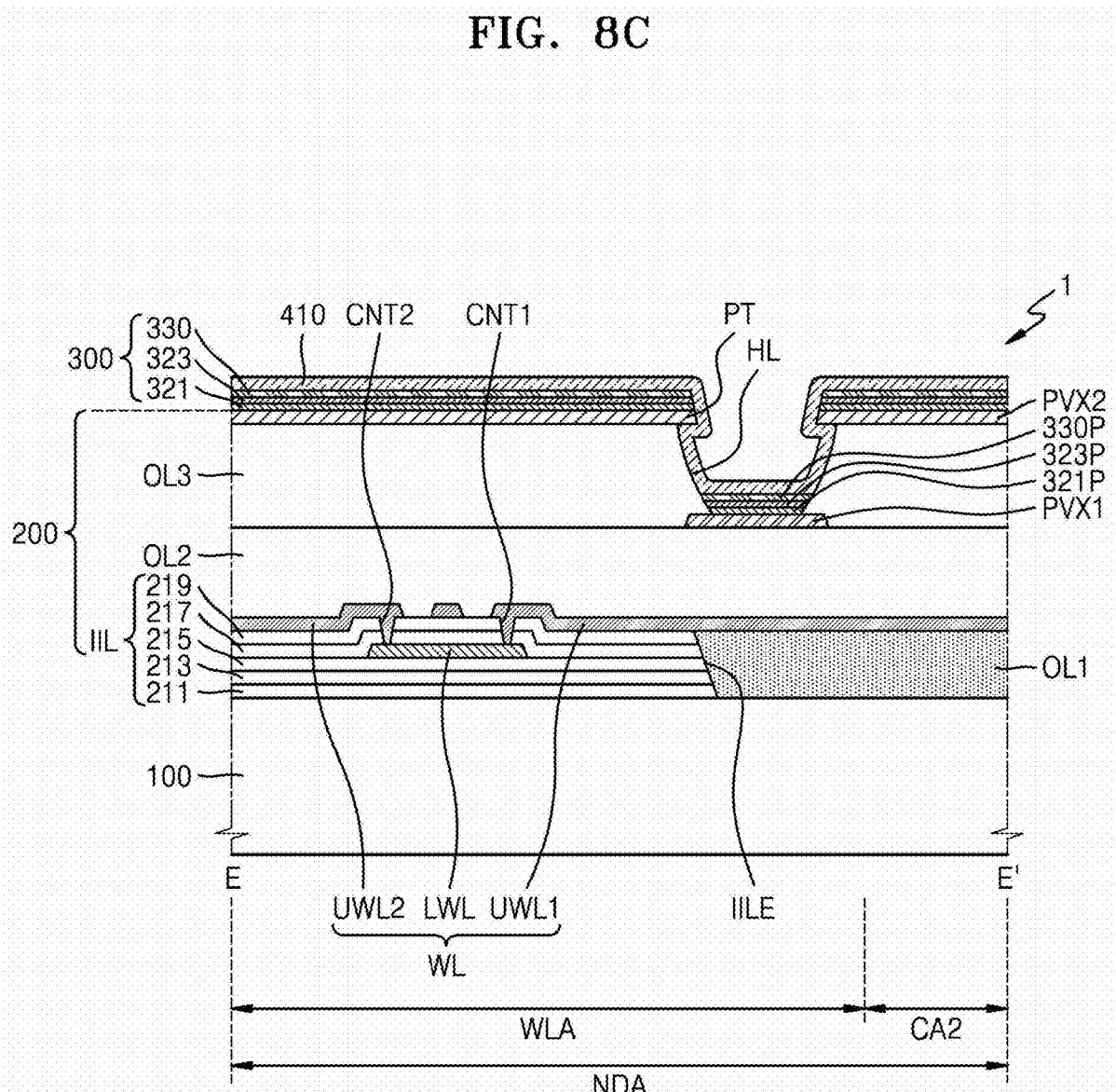
FIG. 8C is a schematic cross-sectional view of the display device of FIG. 7, taken along line E-E' in FIG. 7.

FIG. 8C is a schematic cross-sectional view of the display device 1 of FIG. 7, taken along line E-E' in FIG. 7. In FIG. 8C, the same reference numerals as those of FIG. 8B denote the same members, and repeated descriptions will be omitted.

Referring to FIG. 8C, the display device 1 may include a substrate 100, a circuit layer 200, a light-emitting element layer 300, and an inorganic encapsulation layer 410. The substrate 100 may include a display area and a non-display area NDA. The non-display area NDA may include a wiring area WLA and a second connection area CA2.

The circuit layer 200 may be disposed on the substrate 100. The circuit layer 200 may include a wiring line WL, a first organic insulating layer OL1, a second organic insulating layer OL2, a second connection electrode CM2 (refer to FIG. 8B), a third organic insulating layer OL3, a first inorganic layer PVX1, and a second inorganic layer PVX2. The inorganic insulating layer IIL may be disposed on the substrate 100. The inorganic insulating layer IIL may include a barrier layer 211, a buffer layer 213, a first gate insulating layer 215, a second gate insulating layer 217, and an inter-insulating layer 219.

The wiring line WL may overlap the wiring area WLA. The wiring line WL may extend from the wiring area WLA to the second connection area CA2. The wiring line WL may include a lower wiring line LWL, a first upper wiring line UWL1 and a second upper wiring line UWL2.

The lower wiring line LWL may be disposed between a first inorganic insulating layer and a second inorganic insulating layer. The lower wiring line LWL may overlap the wiring area WLA. In an embodiment, the first inorganic insulating layer may be one of the barrier layer 211, the buffer layer 213, the first gate insulating layer 215, and the second gate insulating layer 217. The second inorganic insulating layer may be disposed above the first inorganic insulating layer and may be one of the buffer layer 213, the first gate insulating layer 215, the second gate insulating layer 217, and the inter-insulating layer 219. In an embodiment, the lower wiring line LWL may be disposed between the first gate insulating layer 215 and the second gate insulating layer 217, for example. The lower wiring line LWL may include a low-resistance metal material. In an embodiment, the lower wiring line LWL may include a conductive material including Mo, Al, Cu, Ti, or the like, and may be provided as a multi-layer or a single layer including the conductive material. In another embodiment, the lower wiring line LWL may be disposed between the second gate insulating layer 217 and the inter-insulating layer 219. In an embodiment, the lower wiring line LWL may include Al, Pt, Pd, Ag, Mg, Au, Ni, Nd, Ir, Cr, Ca, Mo, Ti, W, and/or Cu, and may include a single layer or multiple layers including the aforementioned materials. Hereinafter, a case in which the lower wiring line LWL is disposed between the first gate insulating layer 215 and the second gate insulating layer 217 will be described in detail.

The first upper wiring line UWL1 may be disposed on the second inorganic insulating layer. In an embodiment, the first upper wiring line UWL1 may be disposed on the second gate insulating layer 217 or the inter-insulating layer 219, for example. The first upper wiring line UWL1 may include a conductive material including Mo, Al, Cu, Ti, or the like, and may be provided as a multi-layer or a single layer including the conductive material. In an embodiment, the first upper wiring line UWL1 may have a multilayer structure of Ti/Al/Ti.

The first upper wiring line UWL1 and the lower wiring line LWL may be electrically connected to each other through a first contact hole of the second inorganic insulating layer. In an embodiment, the first upper wiring line UWL1 and the lower wiring line LWL may be electrically connected to each other through a first contact hole CNT1 of the second gate insulating layer 217 and the inter-insulating layer 219, for example.

The second upper wiring line UWL2 may be disposed on the second inorganic insulating layer. In an embodiment, the second upper wiring line UWL2 may be disposed on the second gate insulating layer 217 or the inter-insulating layer 219, for example. The second upper wiring line UWL2 may include a conductive material including Mo, Al, Cu, Ti, or the like, and may be provided as a multi-layer or a single layer including the conductive material. In an embodiment, the second upper wiring line UWL2 may have a multilayer structure of Ti/Al/Ti.

The second upper wiring line UWL2 and the lower wiring line LWL may be electrically connected to each other through a second contact hole of the second inorganic insulating layer. In an embodiment, the second upper wiring line UWL2 and the lower wiring line LWL may be electrically connected to each other through a second contact hole CNT2 of the second gate insulating layer 217 and the inter-insulating layer 219, for example. Accordingly, a plurality of wiring lines WL may cross each other in the wiring area WLA, and the plurality of wiring lines WL may be arranged in various ways.

Figure 9:
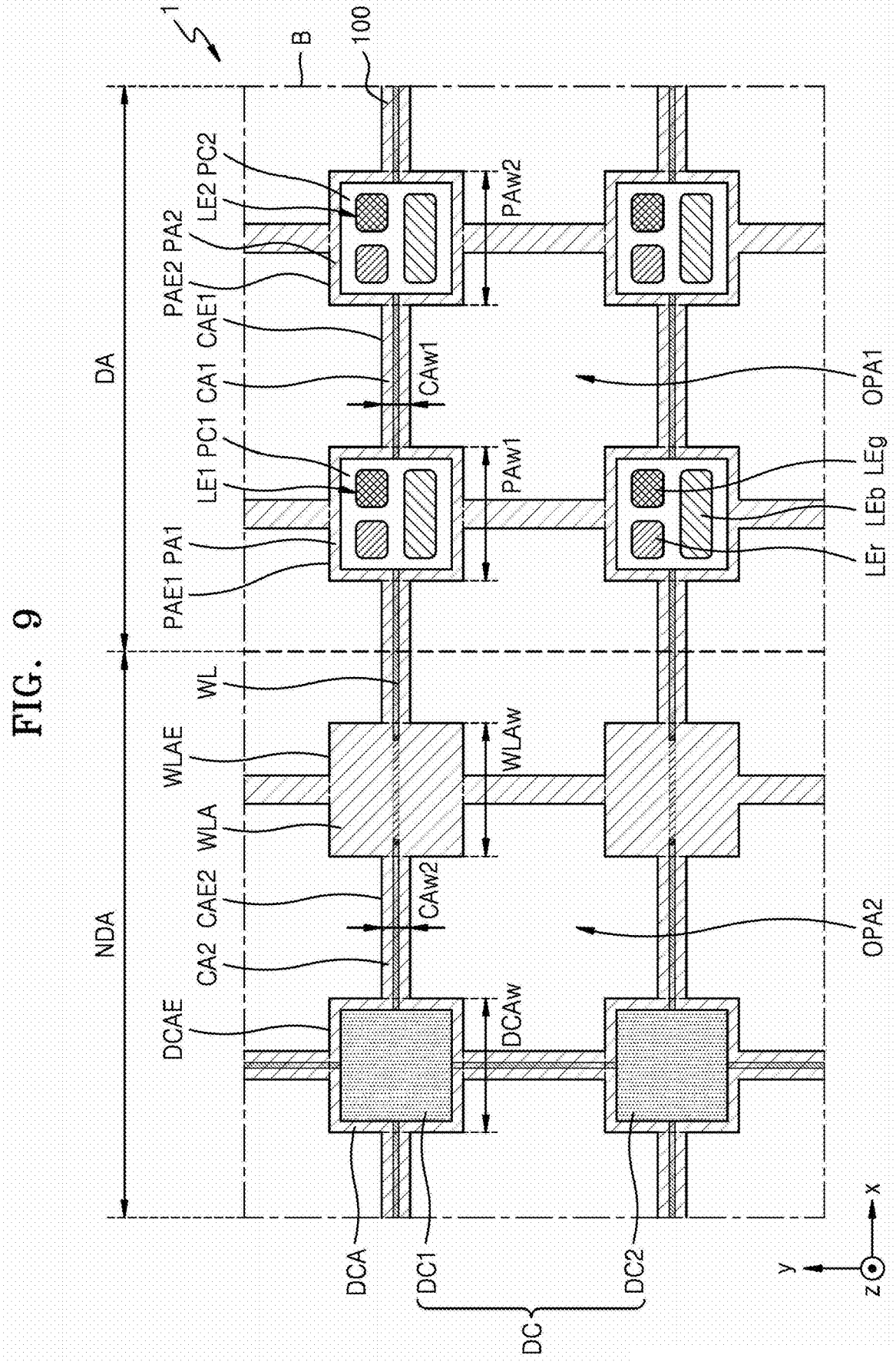
FIG. 9 is an enlarged plan view illustrating another embodiment of the portion B of the display device of FIG. 3.

FIG. 9 is an enlarged plan view illustrating another embodiment of the portion B of the display device 1 of FIG. 3. In FIG. 9, the same reference numerals as those of FIG. 7 denote the same members, and thus repeated descriptions will be omitted.

Referring to FIG. 9, the display device 1 may include a substrate 100, a circuit layer, and a light-emitting element layer. The substrate 100 may include a display area DA and a non-display area NDA.

The display area DA may include a pixel area and a first connection area CA1, and a first opening area OPA1 may be defined in the display area DA. The first connection area CA1 may be a first bridge area in the display area DA. Compared to FIG. 7, in FIG. 9, the first connection area CA1 may extend in one direction. In an embodiment, a direction in which the first connection area CA1 extends may be a first direction (e.g., an x direction or a −x direction), for example. In another embodiment, the direction in which the first connection area CA1 extends may be a second direction (e.g., a y direction or a −y direction).

The non-display area NDA may include a driving circuit area DCA, a wiring area WLA and a second connection area CA2, and a second opening area OPA2 may be defined in the non-display area NDA. The second connection area CA2 may be a second bridge area in the non-display area NDA. Compared to FIG. 7, in FIG. 9, the second connection area CA2 may extend in one direction. In an embodiment, a direction in which the second connection area CA2 extends may be the first direction (e.g., the x direction or the −x direction), for example. In another embodiment, the direction in which the second connection area CA2 extends may be the second direction (e.g., the y direction or the −y direction).

The circuit layer may be disposed on the substrate 100. The circuit layer may include a first pixel circuit PC1, a second pixel circuit PC2, a driving circuit DC, and a wiring line WL.

The light-emitting element layer may be disposed on the circuit layer. The light-emitting element layer may include a light-emitting element. In an embodiment, the light-emitting element layer may include a first light-emitting element LE1 and a second light-emitting element LE2. In an embodiment, the first light-emitting element LE1 and/or the second light-emitting element LE2 may include a red light-emitting element LEr, a green light-emitting element LEg, and a blue light-emitting element LEb. In an embodiment, the red light-emitting element LEr and the green light-emitting element LEg may be arranged side-by-side in the first direction (e.g., the x direction or the −x direction). The red light-emitting element LEr and the blue light-emitting element LEb may be arranged in the second direction (e.g., the y direction or the −y direction). The width of the blue light-emitting element LEb in the first direction (e.g., the x direction or the −x direction) may be greater than the width of the red light-emitting element LEr in the first direction (e.g., the x direction or the −x direction). The green light-emitting element LEg and the blue light-emitting element LEb may be arranged in the second direction (e.g., the y direction or the −y direction). The width of the blue light-emitting element LEb in the first direction (e.g., the x direction or the −x direction) may be greater than the width of the green light-emitting element LEg in the first direction (e.g., the x direction or the −x direction).

Figure 10:
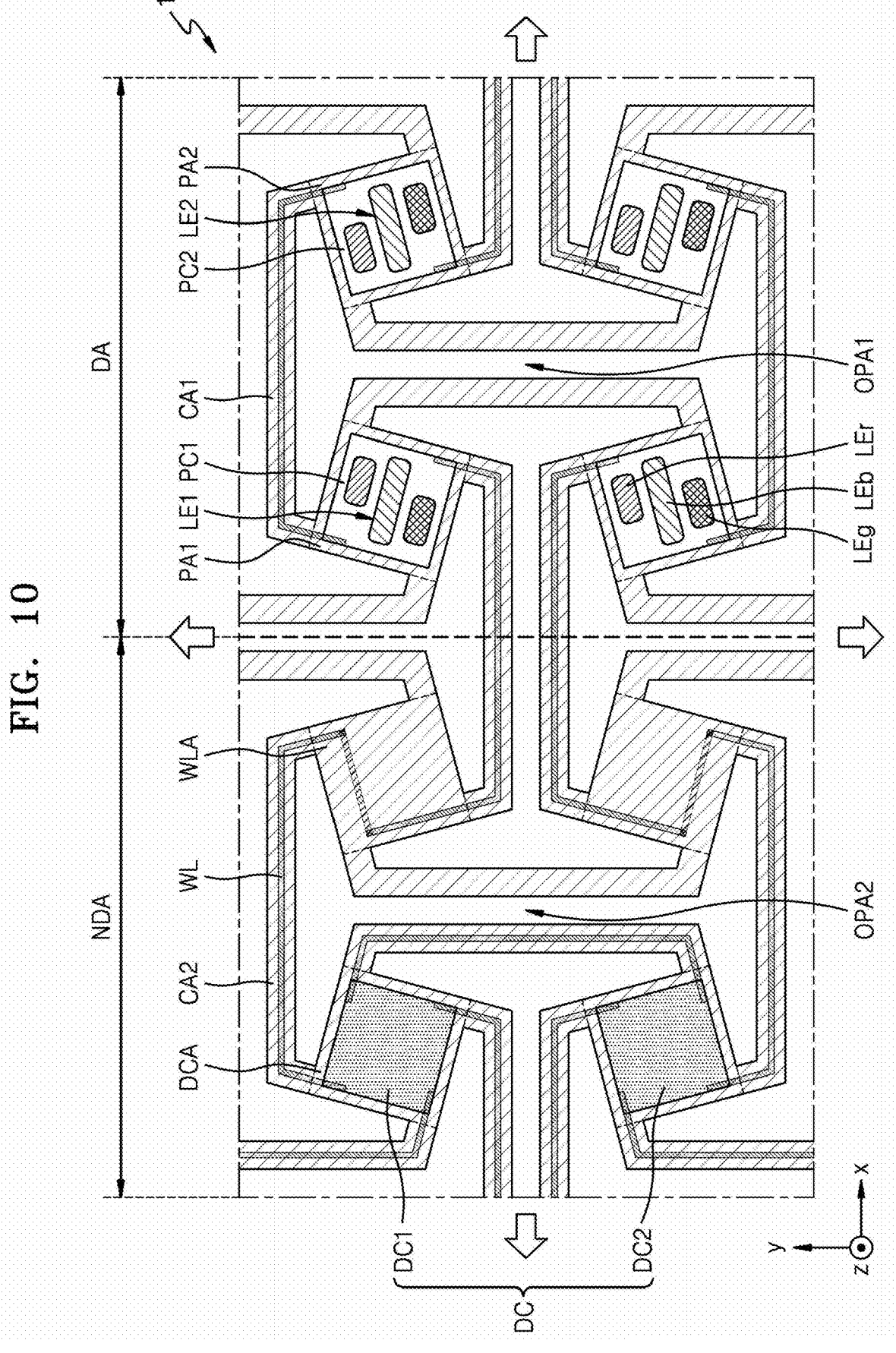
FIG. 10 is a plan view illustrating an embodiment of a deformed state of the display device of FIG. 7 when a tensile force is applied to the display device of FIG. 7.

FIG. 10 is a plan view illustrating an embodiment of a deformed state of the display device 1 of FIG. 7 when a tensile force is applied to the display device 1 of FIG. 7. In FIG. 10, the same reference numerals as those of FIG. 7 denote the same members, and thus repeated descriptions will be omitted.

Referring to FIG. 10, a tensile force may be applied to the display device 1 in a first direction (e.g., an x direction or a −x direction) and/or a second direction (e.g., a y direction or a –y direction). In this case, in a plan view, a first pixel area PA1, a second pixel area PA2, a driving circuit area DCA, and a wiring area WLA may each rotate. In an embodiment, the first pixel area PA1, the second pixel area PA2, the driving circuit area DCA, and the wiring area WLA may each be rotated in a third direction (e.g., a z direction or a –z direction) as an axis, for example. In this case, the display device 1 may be stretched in the first direction (e.g., the x direction or the –x direction) and/or the second direction (e.g., the y direction or the –y direction).

Figure 11A:
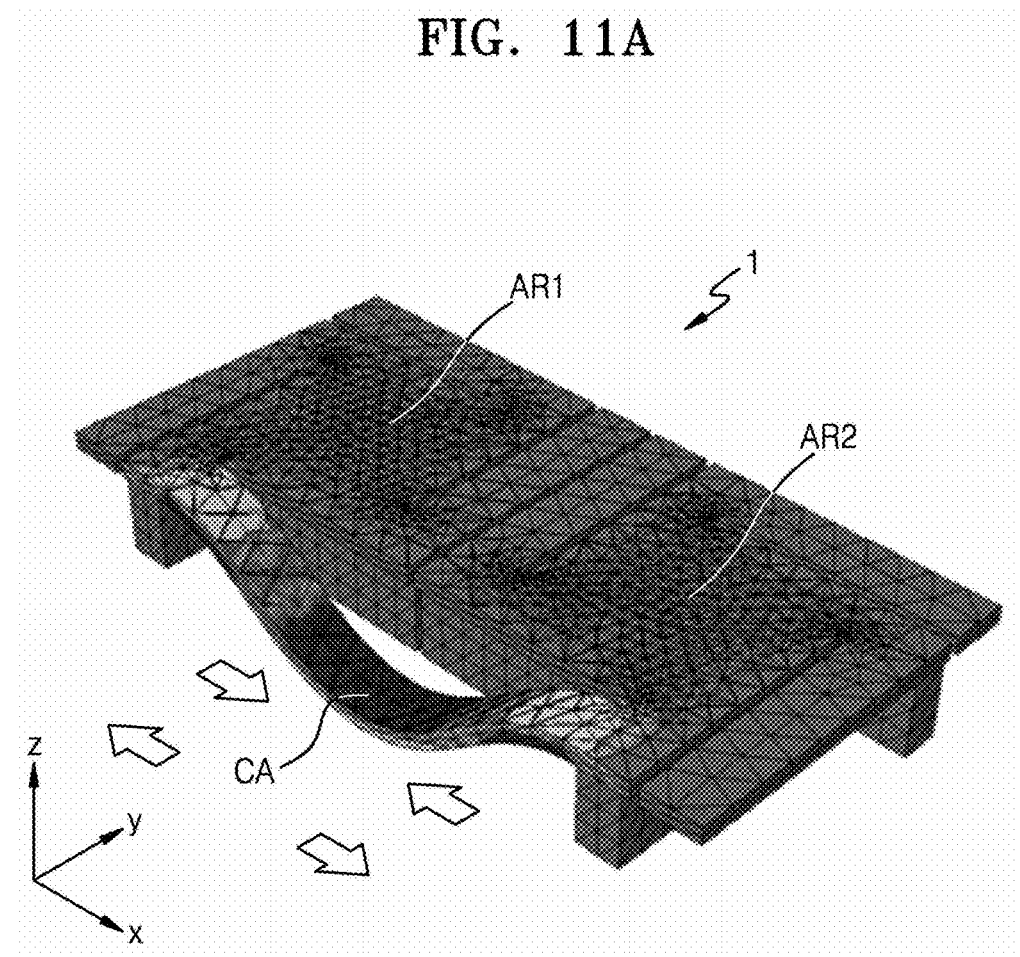
FIG. 11A is a simulation result illustrating another embodiment of a deformed state of the display device of FIG. 7 when a tensile force or a compression force is applied to the display device of FIG. 7.
Figure 11B:
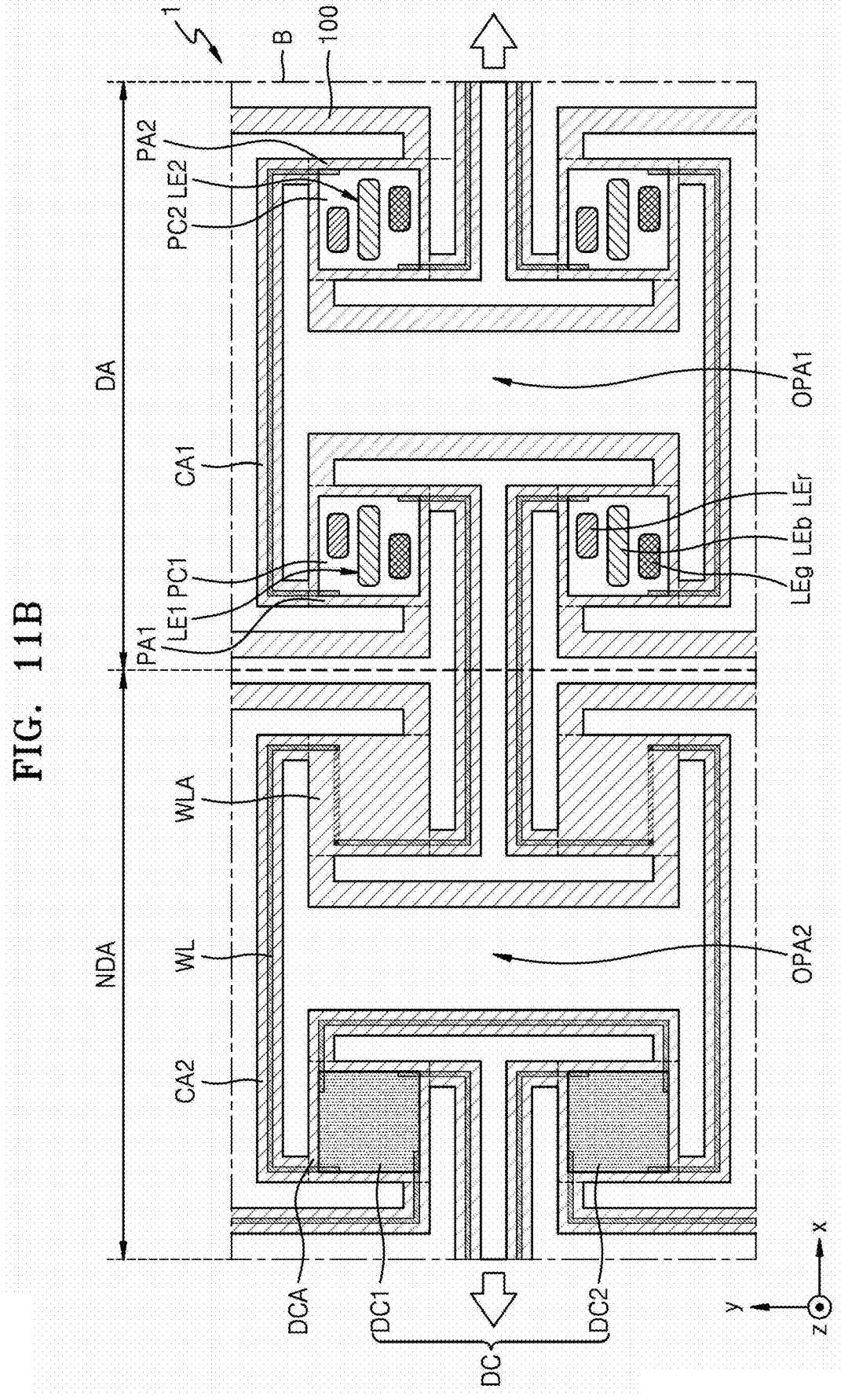
FIG. 11B is a plan view illustrating another embodiment of a deformed state of the display device of FIG. 7 when a tensile force is applied to the display device of FIG. 7.

FIG. 11A is a simulation result illustrating another embodiment of a deformed state of the display device 1 of FIG. 7 when a tensile force or a compression force is applied to the display device 1 of FIG. 7. FIG. 11B is a plan view illustrating another embodiment of a deformed state of the display device 1 of FIG. 7 when a tensile force is applied to the display device 1 of FIG. 7.

Referring to FIG. 11A, the display device 1 may include a first area AR1, a second area AR2, and a connection area CA. In an embodiment, the first area AR1 and the second area AR2 may correspond to the first pixel area PA1 and the second pixel area PA2 of FIG. 7, respectively. In this case, the connection area CA may correspond to the first connection area CA1 of FIG. 7. In another embodiment, the first area AR1 and the second area AR2 may correspond to the driving circuit area DCA and the wiring area WLA of FIG. 7, respectively. In this case, the connection area CA may correspond to the second connection area CA2 of FIG. 7.

When a tensile force or a compression force is applied to the display device 1, the connection area CA may be bent, and a portion of the connection area CA may be moved in a third direction (e.g., a z direction or a –z direction). In this case, the distance between the first area AR1 and the second area AR2 may increase or decrease and the shape of the display device 1 may be deformed. When the connection area CA is bent as described above, high stretchability of the display device 1 may be secured.

In this case, it may be important that a wiring line disposed in the connection area CA is disposed on the stress neutral plane. In the illustrated embodiment, a wiring line may be disposed between a first organic insulating layer and a second organic insulating layer, between which a stress neutral plane is positioned. Also, because a wiring line is not disposed between the second organic insulating layer and a third organic insulating layer, between which the stress neutral plane is not positioned, the reliability of the display device 1 may be high.

Referring to FIG. 11B, a tensile force may be applied to the display device 1 in a first direction (e.g., an x direction or a –x direction). Any part of the first connection area CA1 and/or the second connection area CA2 extending in the first direction (e.g., the x direction or the –x direction) may be moved in the third direction (e.g., the z direction or the –z direction). In this case, the distance between the driving circuit area DCA and the wiring area WLA may increase, and the shape of the display device 1 may be deformed, for example.

Contrary to the embodiment described with reference to FIG. 11B, a compression force may be applied to the display device 1 in the first direction (e.g., the x direction or the –x direction). Any part of the first connection area CA1 and/or the second connection area CA2 extending in the first direction (e.g., the x direction or the –x direction) may be moved in the third direction (e.g., the z direction or the –z direction). In this case, the distance between the driving circuit area DCA and the wiring area WLA may be reduced, and the shape of the display device 1 may be deformed, for example.

The embodiment described with reference to FIGS. 11A and 11B may provide a higher stretching rate than the embodiment described with reference to FIG. 10. In addition, unlike the embodiment described with reference to FIG. 10, in the embodiment described with reference to FIGS. 11A and 11B, a first stretching in the first direction (e.g., the x direction or the –x direction) and a second stretching in the second direction (e.g., the y direction or the –y direction) in the display device 1 may be performed substantially independently.

Although the stretching of the display device 1 is described with reference to the shape of FIG. 7 in FIGS. 11A and 11B, the same may also apply to the shape of FIG. 9.

Figure 12:
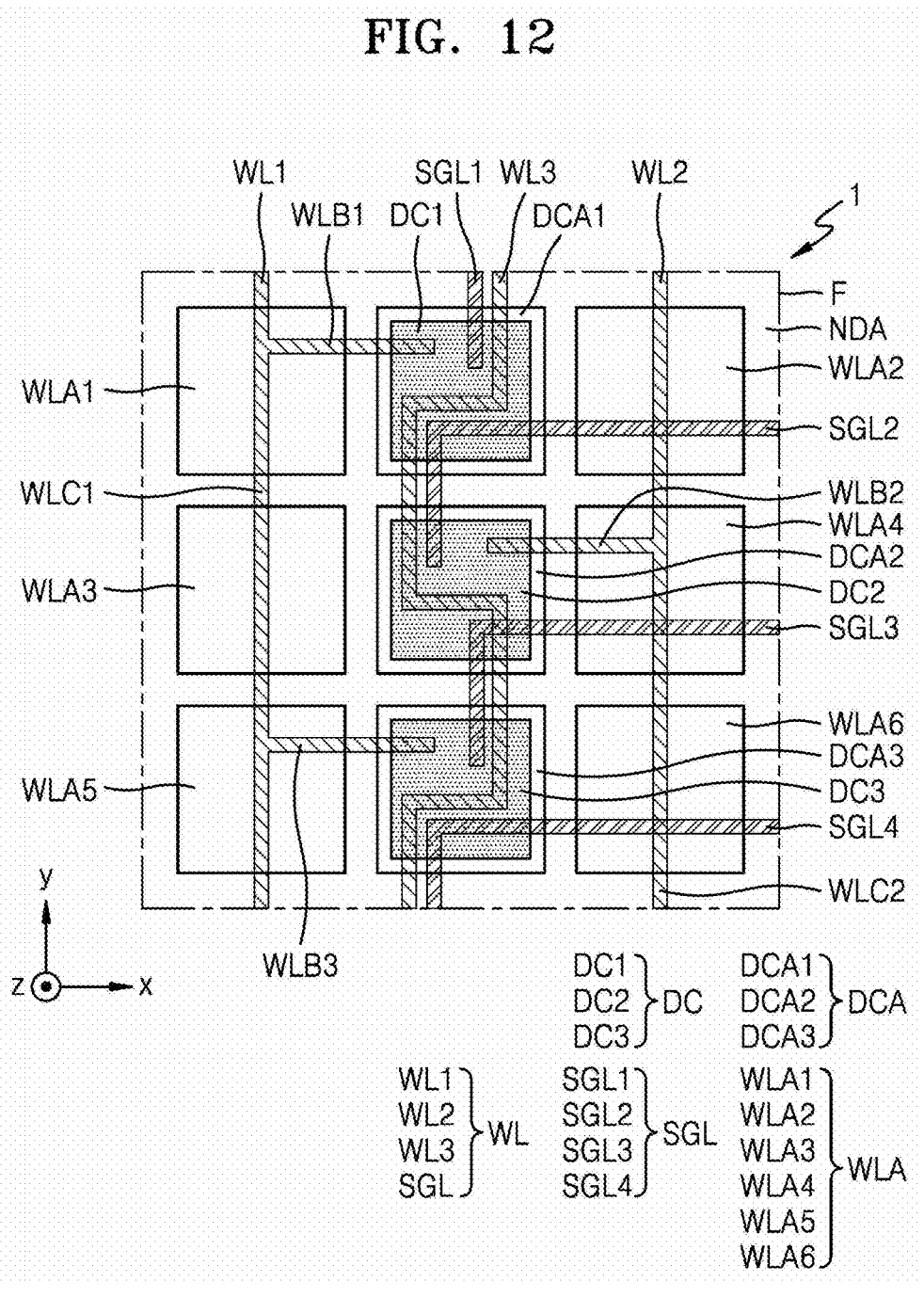
FIG. 12 is an enlarged plan view illustrating an embodiment of a portion F of the display device of FIG. 3.

FIG. 12 is an enlarged plan view illustrating an embodiment of a portion F of the display device 1 of FIG. 3.

Referring to FIG. 12, the display device 1 may include a substrate and a circuit layer. The substrate may include a display area and a non-display area NDA. The non-display area NDA may include a driving circuit area DCA and a wiring area WLA. Although not shown in FIG. 12, the non-display area NDA may further include a second connection area. The second connection area may connect the driving circuit area DCA to the wiring area WLA, connect adjacent driving circuit areas DCA, or connect adjacent wiring areas WLA.

The driving circuit area DCA may include a first driving circuit area DCA1, a second driving circuit area DCA2, and a third driving circuit area DCA3. The first driving circuit area DCA1, the second driving circuit area DCA2, and the third driving circuit area DCA3 may be sequentially arranged in the second direction (e.g., the y direction or the –y direction).

The wiring area WLA may be adjacent to the driving circuit area DCA in the first direction (e.g., the x direction or the –x direction). In an embodiment, the wiring area WLA may include a first wiring area WLA1 and a second wiring area WLA2, disposed on opposite sides of the driving circuit area DCA in the first direction (e.g., the x direction or the –x direction). In this case, the first wiring area WLA1, the driving circuit area DCA, and the second wiring area WLA2 may be sequentially arranged in the first direction (e.g., the x direction or the –x direction). In an embodiment, the wiring area WLA may include a first wiring area WLA1, a second wiring area WLA2, a third wiring area WLA3, a fourth wiring area WLA4, a fifth wiring area WLA5, and a sixth wiring area WLA6. The first wiring area WLA1, the third wiring area WLA3, and the fifth wiring area WLA5 may be sequentially arranged in the second direction (e.g., the y direction or the –y direction). The second wiring area WLA2, the fourth wiring area WLA4, and the sixth wiring area WLA6 may be sequentially arranged in the second direction (e.g., the y direction or the –y direction). The first driving circuit area DCA1 may be disposed between the first wiring area WLA1 and the second wiring area WLA2. The second driving circuit area DCA2 may be disposed between the third wiring area WLA3 and the fourth wiring area WLA4. The third driving circuit area DCA3 may be disposed between the fifth wiring area WLA5 and the sixth wiring area WLA6.

The circuit layer may be disposed on the substrate. The circuit layer may include a driving circuit DC and a wiring line WL. The driving circuit DC may include a first driving circuit DC1, a second driving circuit DC2, and a third driving circuit DC3. The first driving circuit DC1 may overlap the first driving circuit area DCA1. The second driving circuit DC2 may overlap the second driving circuit area DCA2. The third driving circuit DC3 may overlap the third driving circuit area DCA3.

The wiring line WL may overlap the wiring area WLA. The wiring line WL may include a first wiring line WL1, a second wiring line WL2, a third wiring line WL3, and a signal line SGL. The first wiring line WL1 may extend from the first wiring area WLA1 to the third wiring area WLA3. The first wiring line WL1 may extend from the third wiring area WLA3 to the fifth wiring area WLA5.

The first wiring line WL1 may include a first central portion WLC1, a first branch WLB1, and a third branch WLB3. The first central portion WLC1 may extend from the first wiring area WLA1 to the third wiring area WLA3 and may extend from the third wiring area WLA3 to the fifth wiring area WLA5. The first branch WLB1 may extend to or from the first central portion WLC1, and therefore an electrical path is defined between the first branch WLB1 and the first central portion WLC1. The first branch WLB1 may extend from the first wiring area WLA1 to the first driving circuit area DCA1. The first branch WLB1 may be electrically connected to the first driving circuit DC1. Accordingly, the first wiring line WL1 may be electrically connected to the first driving circuit DC1. The third branch WLB3 may extend to or from the first central portion WLC1, and therefore an electrical path is defined between the third branch WLB3 and the first central portion WLC1. The third branch WLB3 may extend from the fifth wiring area WLA5 to the third driving circuit area DCA3. The third branch WLB3 may be electrically connected to the third driving circuit DC3. Accordingly, the first wiring line WL1 may be electrically connected to the third driving circuit DC3.

The second wiring line WL2 may include a second central portion WLC2 and a second branch WLB2. The second central portion WLC2 may extend from the second wiring area WLA2 to the fourth wiring area WLA4 and may extend from the fourth wiring area WLA4 to the sixth wiring area WLA6. The second branch WLB2 may extend to or from the second central portion WLC2, and therefore an electrical path is defined between the second branch WLB2 and the second central portion WLC2. The second branch WLB2 may extend from the fourth wiring area WLA4 to the second driving circuit area DCA2. The second branch WLB2 may be electrically connected to the second driving circuit DC2. Accordingly, the second wiring line WL2 may be electrically connected to the second driving circuit DC2. As described above, driving circuits DC arranged in an odd row may be electrically connected to the first wiring line WL1, and driving circuits DC arranged in an even row may be electrically connected to the second wiring line WL2.

The third wiring line WL3 may extend from the first driving circuit area DCA1 to the second driving circuit area DCA2. The third wiring line WL3 may extend from the second driving circuit area DCA2 to the third driving circuit area DCA3. The third wiring line WL3 may be electrically connected to the driving circuit DC. Although FIG. 12 illustrates a case in which the third wiring line WL3 extends in a zigzag shape, the invention is not limited thereto. In other embodiments, the third wiring line WL3 may extend in various shapes.

Any one of the first wiring line WL1, the second wiring line WL2, and the third wiring line WL3 may be a voltage line. The other of the first wiring line WL1, the second wiring line WL2, and the third wiring line WL3 may be a clock signal line. In an embodiment, the first wiring line WL1 and the second wiring line WL2 may be voltage lines, and the third wiring line WL3 may be a clock signal line, for example. When the first wiring line WL1 and the second wiring line WL2 are voltage lines, the third wiring line WL3 is a clock signal line, and the third wiring line WL3 extends from the first driving circuit area DCA1 to the second driving circuit area DCA2 and from the second driving circuit area DCA2 to the third driving circuit area DCA3, the load resistance may be reduced.

The signal line SGL may include a first signal line SGL1, a second signal line SGL2, a third signal line SGL3, and a fourth signal line SGL4. The first signal line SGL1 may extend to the first driving circuit area DCA1. The first signal line SGL1 may be electrically connected to the first driving circuit DC1. The first signal line SGL1 may be a signal line transmitting an external signal or a previous signal. Although not shown in the drawings, in some embodiments, the first signal line SGL1 may extend from the first wiring area WLA1 or the second wiring area WLA2 to the first driving circuit area DCA1.

The second signal line SGL2 may extend from the first driving circuit area DCA1 to the second wiring area WLA2. The second signal line SGL2 may extend from the first driving circuit area DCA1 to the display area. The second signal line SGL2 may be electrically connected to the first driving circuit DC1. The second signal line SGL2 may extend from the first driving circuit area DCA1 to the second driving circuit area DCA2. The second signal line SGL2 may be electrically connected to the second driving circuit DC2. The second signal line SGL2 may transmit a previous signal to the second driving circuit DC2. Although not shown in the drawings, in some embodiments, the second signal line SGL2 may extend from the first driving circuit area DCA1 to the first wiring area WLA1, from the first wiring area WLA1 to the third wiring area WLA3, and from the third wiring area WLA3 to the second driving circuit area DCA2. In an alternative embodiment, the second signal line SGL2 may extend from the first driving circuit area DCA1 to the second wiring area WLA2, from the second wiring area WLA2 to the fourth wiring area WLA4, and from the fourth wiring area WLA4 to the second driving circuit area DCA2.

The third signal line SGL3 may extend from the second driving circuit area DCA2 to the fourth wiring area WLA4. The third signal line SGL3 may extend from the second driving circuit area DCA2 to the display area. The third signal line SGL3 may be electrically connected to the second driving circuit DC2. The third signal line SGL3 may extend from the second driving circuit area DCA2 to the third driving circuit area DCA3. The third signal line SGL3 may be electrically connected to the third driving circuit DC3. The third signal line SGL3 may transmit a previous signal to the third driving circuit DC3. Although not shown in the drawings, in some embodiments, the third signal line SGL3 may extend from the second driving circuit area DCA2 to the third wiring area WLA3, from the third wiring area WLA3 to the fifth wiring area WLA5, and from the fifth wiring area WLA5 to the third driving circuit area DCA3. In an alternative embodiment, the third signal line SGL3 may extend from the second driving circuit area DCA2 to the fourth wiring area WLA4, from the fourth wiring area WLA4 to the sixth wiring area WLA6, and from the sixth wiring area WLA6 to the third driving circuit area DCA3.

The fourth signal line SGL4 may extend from the third driving circuit area DCA3 to the sixth wiring area WLA6. The fourth signal line SGL4 may extend from the third driving circuit area DCA3 to the display area. The fourth signal line SGL4 may be electrically connected to the third driving circuit DC3. The fourth signal line SGL4 may extend from the third driving circuit area DCA3 to a next driving circuit area.

In an embodiment, the signal line SGL may transmit a scan signal or a previous scan signal applied to a pixel circuit. In an embodiment, the signal line SGL may transmit an emission control signal applied to the pixel circuit.

Figure 13A:
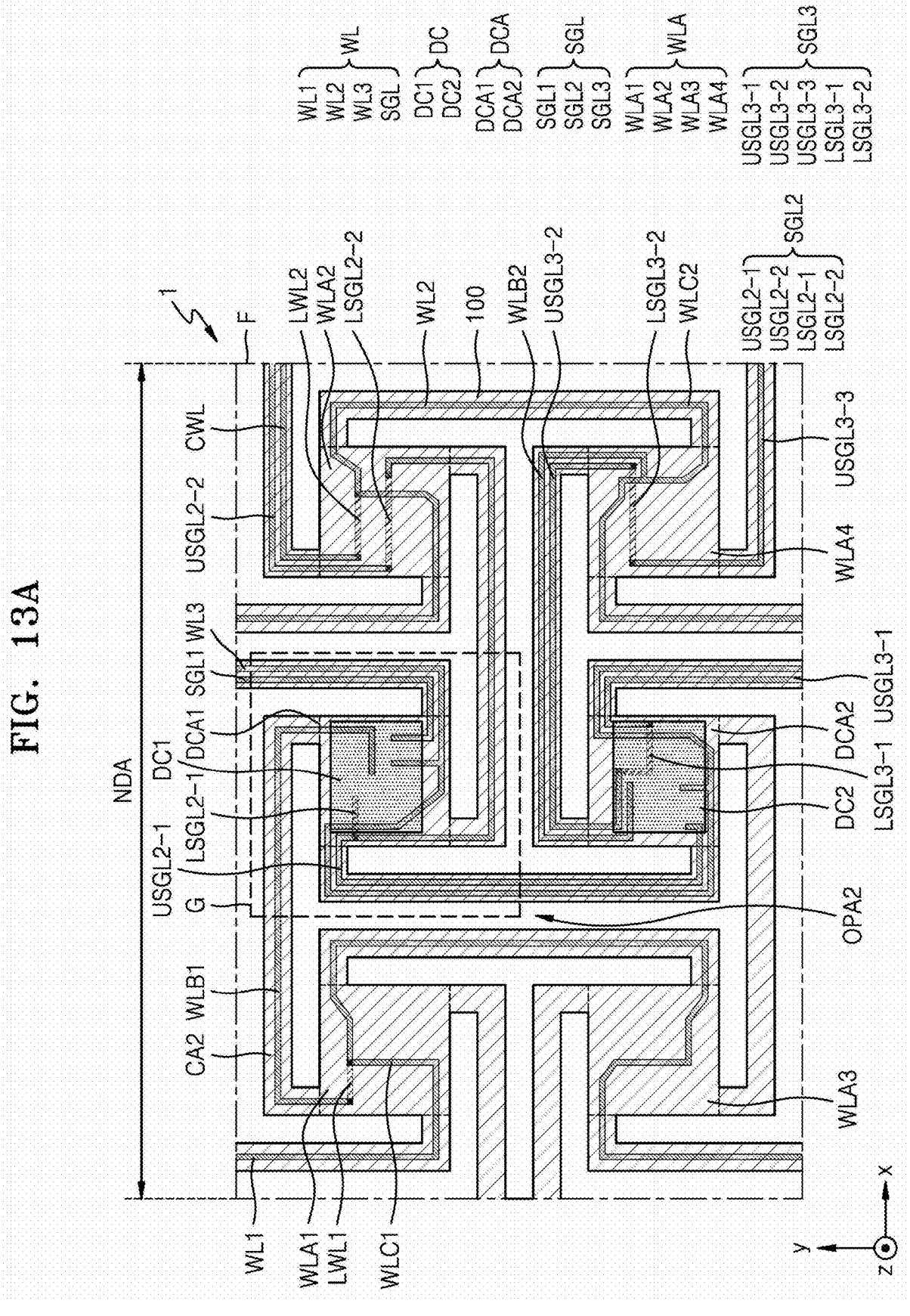
FIG. 13A is an enlarged plan view illustrating another embodiment of the portion F of the display device of FIG. 3.
Figure 13B:
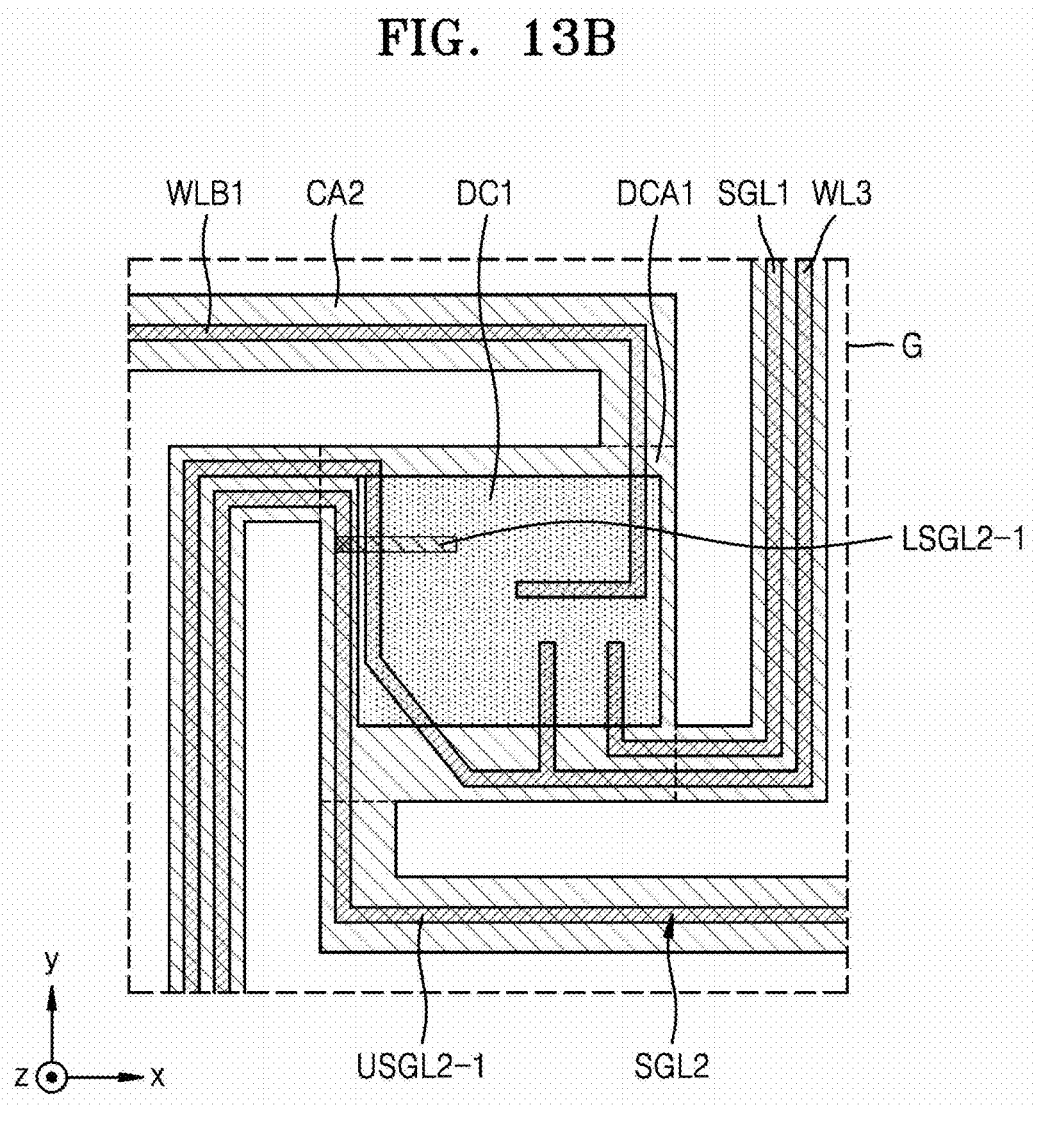
FIG. 13B is an enlarged plan view illustrating an embodiment of a portion G of the display device of FIG. 13A.

FIG. 13A is an enlarged plan view illustrating another embodiment of the portion F of the display device 1 of FIG. 3. FIG. 13B is an enlarged plan view illustrating an embodiment of a portion G of the display device 1 of FIG. 13A.

Referring to FIGS. 13A and 13B, the display device 1 may include a substrate 100 and a circuit layer. The substrate 100 may include a display area and a non-display area NDA. The non-display area NDA may include a driving circuit area DCA, a wiring area WLA and a second connection area CA2, and a second opening area OPA2 may be fined in the non-display area NDA. In an embodiment, the driving circuit area DCA and the wiring area WLA may be adjacent to each other in a first direction (e.g., an x direction or a −x direction). In an embodiment, the wiring area WLA may include a first wiring area WLA1 and a second wiring area WLA2 disposed on opposite sides of the driving circuit area DCA in the first direction (e.g., the x direction or the −x direction). A plurality of driving circuit areas DCA may be provided, and a plurality of wiring areas WLA may be provided. In an embodiment, the plurality of driving circuit areas DCA may be arranged in a second direction (e.g., a y direction or a −y direction), for example. The plurality of wiring areas WLA may be arranged in the second direction (e.g., the y direction or the −y direction).

The second connection area CA2 may be a second bridge area in the non-display area NDA. Each of the second connection areas CA2 may extend from the driving circuit area DCA or the wiring area WLA to an adjacent driving circuit area DCA or an adjacent wiring area WLA. One driving circuit area DCA may extend to or from four second connection areas CA2. One wiring area WLA may extend to or from four second connection areas CA2. Each of the four second connection areas CA2 may extend to or from an adjacent driving circuit area DCA or an adjacent wiring area WLA.

The second opening area OPA2 may be an empty area in which components of the display device 1 are not disposed in the non-display area NDA. The second opening area OPA2 may be defined between a driving circuit area DCA and a wiring area WLA which are adjacent to each other. In an alternative embodiment, the second opening area OPA2 may be defined between adjacent driving circuit areas DCA. In an alternative embodiment, the second opening area OPA2 may be defined between adjacent wiring areas WLA. In an embodiment, the second opening area OPA2 may be defined between the driving circuit area DCA and the wiring area WLA.

The driving circuit area DCA may include a first driving circuit area DCA1 and a second driving circuit area DCA2. The first driving circuit area DCA1 and the second driving circuit area DCA2 may be sequentially arranged in the second direction (e.g., the y direction or the −y direction).

The wiring area WLA may be adjacent to the driving circuit area DCA in the first direction (e.g., the x direction or the −x direction). In an embodiment, the wiring area WLA may include a first wiring area WLA1, a second wiring area WLA2, a third wiring area WLA3, and a fourth wiring area WLA4. The first wiring area WLA1 and the third wiring area WLA3 may be sequentially arranged in the second direction (e.g., the y direction or the −y direction). The second wiring area WLA2 and the fourth wiring area WLA4 may be sequentially arranged in the second direction (e.g., the y direction or the −y direction). The first driving circuit area DCA1 may be disposed between the first wiring area WLA1 and the second wiring area WLA2. The second driving circuit area DCA2 may be disposed between the third wiring area WLA3 and the fourth wiring area WLA4.

The circuit layer may be disposed on the substrate 100. The circuit layer may include a driving circuit DC and a wiring line WL. The driving circuit DC may include a first driving circuit DC1 and a second driving circuit DC2. The first driving circuit DC1 may overlap the first driving circuit area DCA1. The second driving circuit DC2 may overlap the second driving circuit area DCA2.

The wiring line WL may overlap the wiring area WLA. The wiring line WL may include a first wiring line WL1, a second wiring line WL2, a third wiring line WL3, and a signal line SGL. The first wiring line WL1 may extend from the first wiring area WLA1 to the third wiring area WLA3.

The first wiring line WL1 may include a first central portion WLC1, a first lower wiring line LWL1, and a first branch WLB1. The first central portion WLC1 may extend from the first wiring area WLA1 to the third wiring area WLA3 via the second connection area CA2 extending to or from both of the first wiring area WLA1 and the third wiring area WLA3.

The first lower wiring line LWL1 may overlap the first wiring area WLA1. The first lower wiring line LWL1 may be disposed between a first inorganic insulating layer and a second inorganic insulating layer, and the first central portion WLC1 and the first branch WLB1 may be disposed on the second inorganic insulating layer. The first lower wiring line LWL1 may be electrically connected to the first central portion WLC1 through a first contact hole of the second inorganic insulating layer in the first wiring area WLA1. The first lower wiring line LWL1 may be electrically connected to the first branch WLB1 through a second contact hole of the second inorganic insulating layer in the first wiring area WLA1.

The first branch WLB1 may extend from the first wiring area WLA1 to the first driving circuit area DCA1 via the second connection area CA2 extending to or from both of the first wiring area WLA1 and the first driving circuit area DCA1. The first branch WLB1 may be electrically connected to the first driving circuit DC1. Accordingly, the first wiring line WL1 may be electrically connected to the first driving circuit DC1.

The second wiring line WL2 may include a second central portion WLC2, a second lower wiring line LWL2, and a second branch WLB2. The second central portion WLC2 may extend from the second wiring area WLA2 to the fourth wiring area WLA4 via the second connection area CA2 extending to or from both of the second wiring area WLA2 and the fourth wiring area WLA4. The second branch WLB2 may extend from the fourth wiring area WLA4 to the second driving circuit area DCA2 via the second connection area CA2 extending to or from both of the fourth wiring area WLA4 and the second driving circuit area DCA2. The second branch WLB2 may extend to or from the second central portion WLC2 in the fourth wiring area WLA4, and therefore an electrical path is defined between the second branch WLB2 and the second central portion WLC2. The second branch WLB2 may be electrically connected to the second driving circuit DC2. Accordingly, the second wiring line WL2 may be electrically connected to the second driving circuit DC2. As described above, driving circuits DC arranged in an odd row may be electrically connected to the first wiring line WL1, and driving circuits DC arranged in an even row may be electrically connected to the second wiring line WL2.

In some embodiments, the second wiring line WL2 may be electrically connected to a wiring line disposed in an unillustrated wiring area through a connection wiring line CWL. When the second wiring line WL2 is a wiring line supplying a rated voltage, the second wiring line WL2 may be electrically connected to a wiring line disposed in an unillustrated wiring area and may share the rated voltage.

The second lower wiring line LWL2 may be disposed in the second wiring area WLA2. The second lower wiring line LWL2 may be disposed between the first inorganic insulating layer and the second inorganic insulating layer, and the second central portion WLC2 and the connection wiring line CWL may be disposed on the second inorganic insulating layer. The second lower wiring line LWL2 may be electrically connected to the second central portion WLC2 through a first contact hole of the second inorganic insulating layer in the second wiring area WLA2. The second lower wiring line LWL2 may be electrically connected to the connection wiring line CWL through a second contact hole of the second inorganic insulating layer in the second wiring area WLA2.

The third wiring line WL3 may extend from the first driving circuit area DCA1 to the second driving circuit area DCA2 via the second connection area CA2 extending to or from both of the first driving circuit area DCA1 and the second driving circuit area DCA2. The third wiring line WL3 may be electrically connected to the first driving circuit DC1 and the second driving circuit DC2.

Any one of the first wiring line WL1, the second wiring line WL2, and the third wiring line WL3 may be a voltage line. The other of the first wiring line WL1, the second wiring line WL2, and the third wiring line WL3 may be a clock signal line. In an embodiment, the first wiring line WL1 and the second wiring line WL2 may be voltage lines, and the third wiring line WL3 may be a clock signal line, for example. When the first wiring line WL1 and the second wiring line WL2 are voltage lines, the third wiring line WL3 is a clock signal line, and the third wiring line WL3 extends from the first driving circuit area DCA1 to the second driving circuit area DCA2, the load resistance may be reduced.

The signal line SGL may include a first signal line SGL1, a second signal line SGL2, and a third signal line SGL3. The first signal line SGL1 may extend to the first driving circuit area DCA1. The first signal line SGL1 may be electrically connected to the first driving circuit DC1. The first signal line SGL1 may be a signal line transmitting an external signal or a previous signal.

The second signal line SGL2 may extend from the first driving circuit area DCA1 to the second wiring area WLA2. The second signal line SGL2 may extend from the first driving circuit area DCA1 to the display area. In an embodiment, the second signal line SGL2 may include a first lower signal line LSGL2-1, a second lower signal line LSGL2-2, a first upper signal line USGL2-1, and a second upper signal line USGL2-2.

The first lower signal line LSGL2-1 may overlap the first driving circuit area DCA1. The first lower signal line LSGL2-1 may be electrically connected to the first driving circuit DC1. The first lower signal line LSGL2-1 may be disposed between the first inorganic insulating layer and the second inorganic insulating layer.

The first upper signal line USGL2-1 may be disposed on the second inorganic insulating layer. The first upper signal line USGL2-1 may be electrically connected to the first lower signal line LSGL2-1 in the first driving circuit area DCA1 through a contact hole of the second inorganic insulating layer. The first upper signal line USGL2-1 may extend from the first driving circuit area DCA1 to the second wiring area WLA2 via the second connection area CA2 extending to or from both of the first driving circuit area DCA1 and the second wiring area WLA2. The first upper signal line USGL2-1 may extend from the first driving circuit area DCA1 to the second driving circuit area DCA2 via the second connection area CA2 extending to or from both of the first driving circuit area DCA1 and the second driving circuit area DCA2. The first upper signal line USGL2-1 may be electrically connected to the second driving circuit DC2. The first upper signal line USGL2-1 may transmit a previous signal to the second driving circuit DC2.

The second lower signal line LSGL2-2 may overlap the second wiring area WLA2. The second lower signal line LSGL2-2 may be disposed between the first inorganic insulating layer and the second inorganic insulating layer. The second lower signal line LSGL2-2 may be electrically connected to the first upper signal line USGL2-1 through a first contact hole of the second inorganic insulating layer in the second wiring area WLA2. The second upper signal line USGL2-2 may extend from the second wiring area WLA2 to the display area. The second upper signal line USGL2-2 may be disposed on the second inorganic insulating layer. The second upper signal line USGL2-2 may be electrically connected to the second lower signal line LSGL2-2 through a second contact hole of the second inorganic insulating layer in the second wiring area WLA2.

The third signal line SGL3 may extend from the second driving circuit area DCA2 to the fourth wiring area WLA4. The third signal line SGL3 may extend from the second driving circuit area DCA2 to the display area. In an embodiment, the third signal line SGL3 may include a third lower signal line LSGL3-1, a fourth lower signal line LSGL3-2, a third upper signal line USGL3-1, a fourth upper signal line USGL3-2, and a fifth upper signal line USGL3-3.

The third lower signal line LSGL3-1 may overlap the second driving circuit area DCA2. The third lower signal line LSGL3-1 may be electrically connected to the second driving circuit DC2. The third lower signal line LSGL3-1 may be disposed between the first inorganic insulating layer and the second inorganic insulating layer.

The third upper signal line USGL3-1 may overlap the second driving circuit area DCA2. The third upper signal line USGL3-1 may be electrically connected to the third lower signal line LSGL3-1 through a first contact hole of the second inorganic insulating layer in the second driving circuit area DCA2. The third upper signal line USGL3-1 may transmit a previous signal to a next driving circuit.

The fourth upper signal line USGL3-2 may overlap the second driving circuit area DCA2. The fourth upper signal line USGL3-2 may be disposed on the second inorganic insulating layer. The fourth upper signal line USGL3-2 may be electrically connected to the third lower signal line LSGL3-1 through a second contact hole of the second inorganic insulating layer in the second driving circuit area DCA2. The fourth upper signal line USGL3-2 may extend from the second driving circuit area DCA2 to the fourth wiring area WLA4 via the second connection area CA2 extending to or from both of the second driving circuit area DCA2 and the fourth wiring area WLA4.

The fourth lower signal line LSGL3-2 may overlap the fourth wiring area WLA4. The fourth lower signal line LSGL3-2 may be disposed between the first inorganic insulating layer and the second inorganic insulating layer. The fourth lower signal line LSGL3-2 may be electrically connected to the fourth upper signal line USGL3-2 through a first contact hole of the second inorganic insulating layer in the fourth wiring area WLA4.

The fifth upper signal line USGL3-3 may overlap the fourth wiring area WLA4. The fifth upper signal line USGL3-3 may be disposed on the second inorganic insulating layer. The fifth upper signal line USGL3-3 may be electrically connected to the fourth lower signal line LSGL3-2 through a second contact hole of the second inorganic insulating layer in the fourth wiring area WLA4. The fifth upper signal line USGL3-3 may extend to the display area.

The wiring lines WL may be disposed in the same layer in the second connection areas CA2. The wiring lines WL may include the same material in the second connection area CA2. In an embodiment, the first wiring line WL1 and the second wiring line WL2 may include the same material in the second connection area CA2. Accordingly, all the wiring lines WL may be disposed on a stress neutral plane in the second connection areas CA2, and stress applied to the wiring lines WL may be reduced.

In addition, in order that all the wiring lines WL electrically connected to the driving circuit DC are disposed in the same layer in the second connection areas CA2 as described above, the non-display area NDA may include the driving circuit area DCA and the wiring area WLA. Accordingly, in the non-display area NDA, the wiring lines WL may be dispersed while the second opening area OPA2 is maintained, and the display device 1 may maintain high stretchability even in the non-display area NDA.

Figure 14:
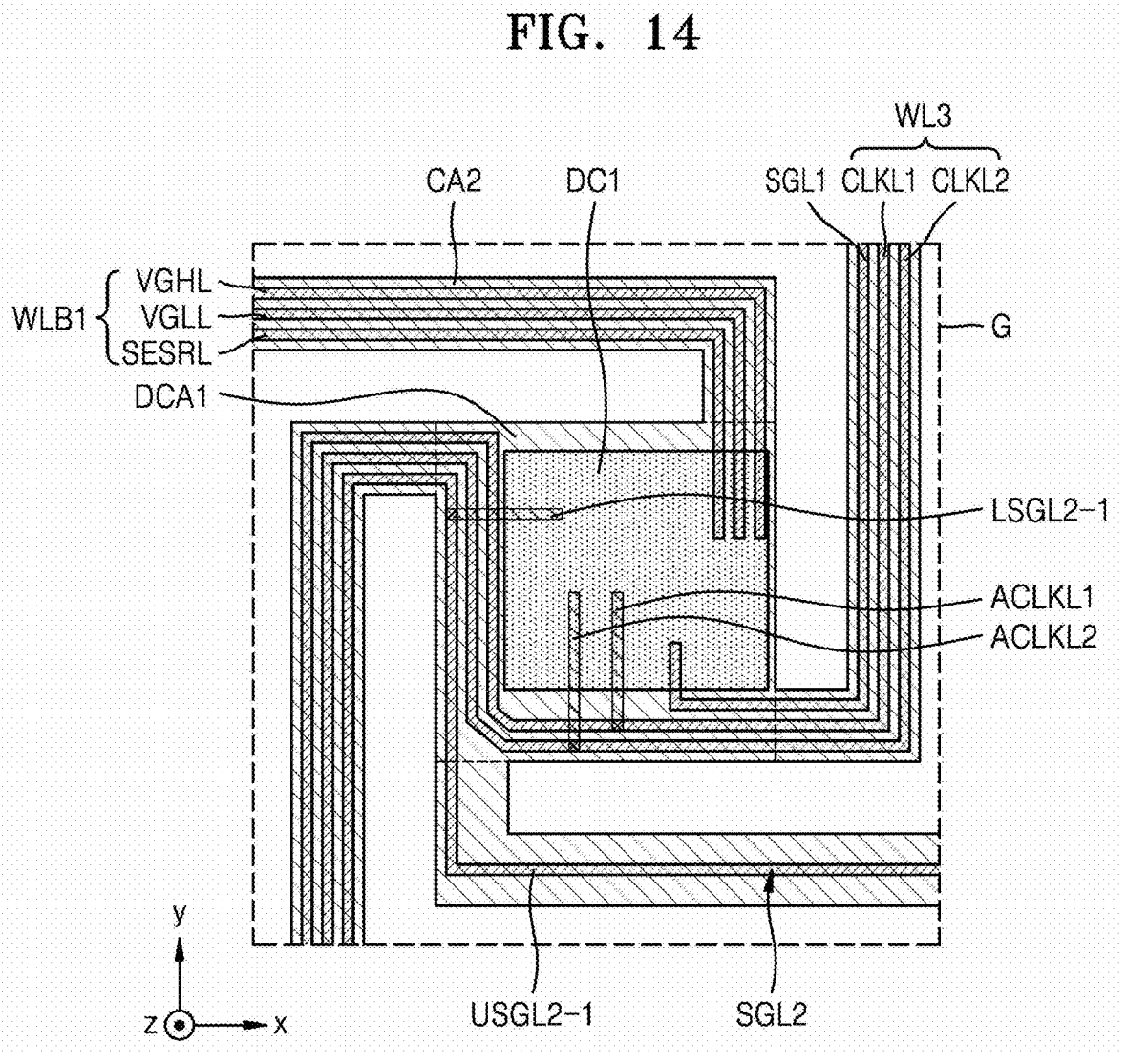
FIG. 14 is an enlarged plan view illustrating another embodiment of the portion G of the display device of FIG. 13A.

FIG. 14 is an enlarged plan view illustrating another embodiment of the portion G of the display device 1 of FIG. 13A. In FIG. 14, the same reference numerals as those of FIGS. 13A and 13B denote the same member, and thus repeated descriptions will be omitted.

Referring to FIG. 14, a first wiring line may include a first branch WLB1. The first branch WLB1 may include a first voltage line VGHL, a second voltage line VGLL, and a third voltage line SESRL. In an embodiment, the first voltage line VGHL may be a high voltage line and the second voltage line VGLL may be a low voltage line. The third voltage line SESRL may be a voltage line for solving a glare problem of the display device 1.

A third wiring line WL3 may include a first clock signal line CLKL1 and a second clock signal line CLKL2. The first clock signal line CLKL1 may transmit a first clock signal to a first driving circuit DC1. In an embodiment, the first clock signal line CLKL1 may be electrically connected to the first driving circuit DC1 through a first additional clock signal line ACLKL1 disposed between a first inorganic insulating layer and a second inorganic insulating layer. The second clock signal line CLKL2 may transmit a second clock signal to the first driving circuit DC1. In an embodiment, the second clock signal line CLKL2 may be electrically connected to the first driving circuit DC1 through a second additional clock signal line ACLKL2 disposed between the first inorganic insulating layer and the second inorganic insulating layer.

Figure 15:
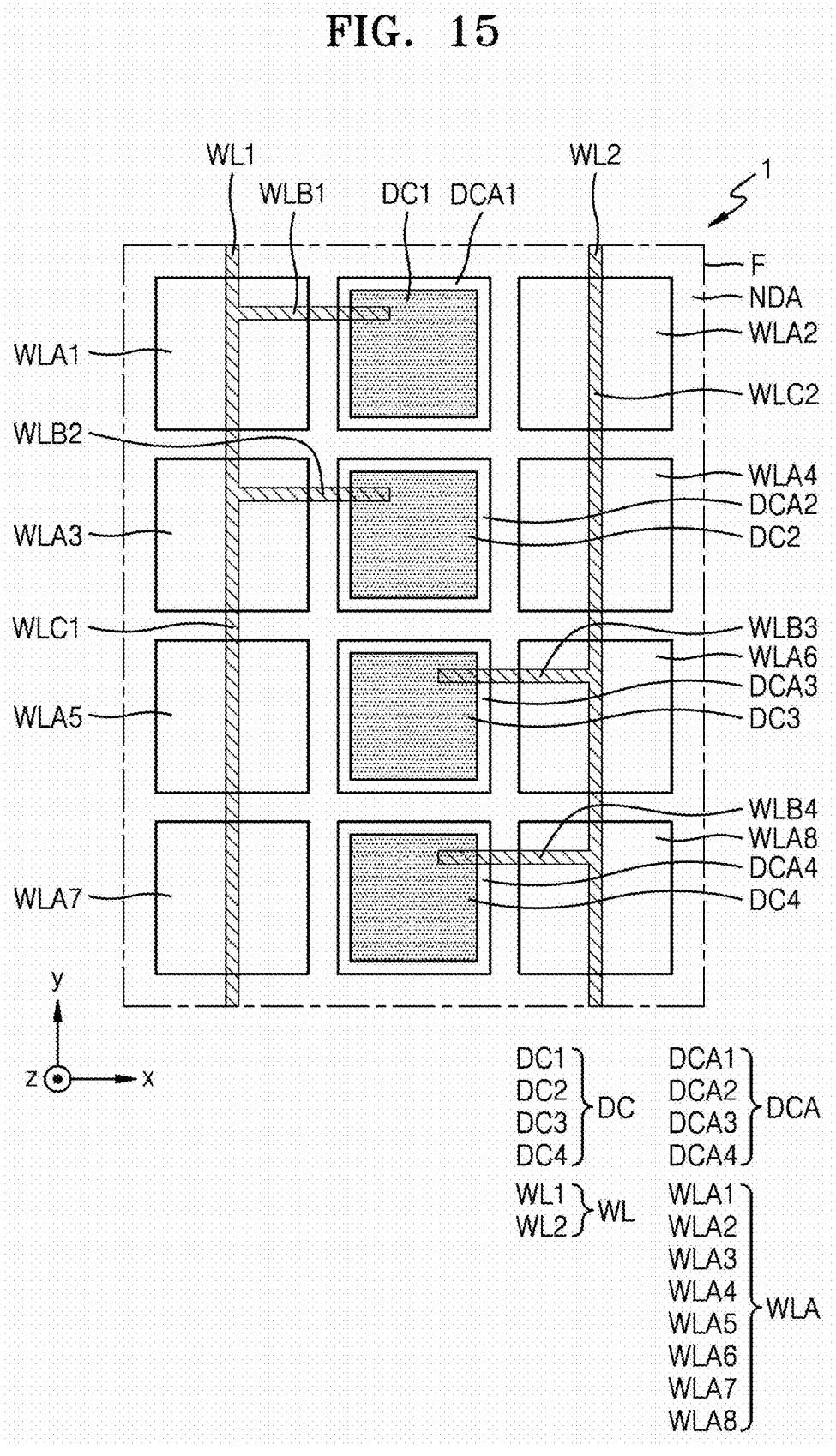
FIG. 15 is an enlarged plan view illustrating another embodiment of the portion F of the display device of FIG. 3.

FIG. 15 is an enlarged plan view illustrating another embodiment of the portion F of the display device 1 of FIG. 3. In FIG. 15, the same reference numerals as those of FIG. 12 denote the same members, and thus repeated descriptions will be omitted.

Referring to FIG. 15, the display device 1 may include a substrate and a circuit layer. The substrate may include a display area and a non-display area NDA. The non-display area NDA may include a driving circuit area DCA and a wiring area WLA.

The driving circuit area DCA may include a first driving circuit area DCA1, a second driving circuit area DCA2, a third driving circuit area DCA3, and a fourth driving circuit area DCA4. The first driving circuit area DCA1, the second driving circuit area DCA2, the third driving circuit area DCA3, and the fourth driving circuit area DCA4 may be sequentially arranged in a second direction (e.g., a y direction or a −y direction).

The wiring area WLA may be adjacent to the driving circuit area DCA in a first direction (e.g., an x direction or a −x direction). In an embodiment, the wiring area WLA may include a first wiring area WLA1 and a second wiring area WLA2, disposed on opposite sides of the driving circuit area DCA in the first direction (e.g., the x direction or the −x direction). In this case, the first wiring area WLA1, the driving circuit area DCA, and the second wiring area WLA2 may be sequentially arranged in the first direction (e.g., the x direction or the −x direction). In an embodiment, the wiring area WLA may include a first wiring area WLA1, a second wiring area WLA2, a third wiring area WLA3, a fourth wiring area WLA4, a fifth wiring area WLA5, a sixth wiring area WLA6, a seventh wiring area WLA7, and an eighth wiring area WLA8. The first wiring area WLA1, the third wiring area WLA3, the fifth wiring area WLA5, and the seventh wiring area WLA7 may be sequentially arranged in the second direction (e.g., the y direction or the −y direction). The second wiring area WLA2, the fourth wiring area WLA4, the sixth wiring area WLA6, and the eighth wiring area WLA8 may be sequentially arranged in the second direction (e.g., the y direction or the −y direction). The first driving circuit area DCA1 may be disposed between the first wiring area WLA1 and the second wiring area WLA2. The second driving circuit area DCA2 may be disposed between the third wiring area WLA3 and the fourth wiring area WLA4. The third driving circuit area DCA3 may be disposed between the fifth wiring area WLA5 and the sixth wiring area WLA6. The fourth driving circuit area DCA4 may be disposed between the seventh wiring area WLA7 and the eighth wiring area WLA8.

The circuit layer may be disposed on the substrate. The circuit layer may include a driving circuit DC and a wiring line WL. The driving circuit DC may include a first driving circuit DC1, a second driving circuit DC2, a third driving circuit DC3, and a fourth driving circuit DC4. The first driving circuit DC1 may overlap the first driving circuit area DCA1. The second driving circuit DC2 may overlap the second driving circuit area DCA2. The third driving circuit DC3 may overlap the third driving circuit area DCA3. The fourth driving circuit DC4 may overlap the fourth driving circuit area DCA4.

The wiring line WL may overlap the wiring area WLA. The wiring line WL may include a first wiring line WL1 and a second wiring line WL2. The first wiring line WL1 may extend from the first wiring area WLA1 to the third wiring area WLA3. The first wiring line WL1 may extend from the third wiring area WLA3 to the fifth wiring area WLA5. The first wiring line WL1 may extend from the fifth wiring area WLA5 to the seventh wiring area WLA7.

The first wiring line WL1 may include a first central portion WLC1, a first branch WLB1, and a second branch WLB2. The first central portion WLC1 may extend from the first wiring area WLA1 to the third wiring area WLA3 and may extend from the third wiring area WLA3 to the fifth wiring area WLA5. The first central portion WLC1 may extend from the fifth wiring area WLA5 to the seventh wiring area WLA7. The first branch WLB1 may extend to or from the first central portion WLC1, and therefore an electrical path may be defined between the first branch WLB1 and the first central portion WLC1. The first branch WLB1 may extend from the first wiring area WLA1 to the first driving circuit area DCA1. The first branch WLB1 may be electrically connected to the first driving circuit DC1. Accordingly, the first wiring line WL1 may be electrically connected to the first driving circuit DC1. The second branch WLB2 may extend to or from the first central portion WLC1, and therefore an electrical path may be defined between the second branch WLB2 and the first central portion WLC1. The second branch WLB2 may extend from the third wiring area WLA3 to the second driving circuit area DCA2. The second branch WLB2 may be electrically connected to the second driving circuit DC2. Accordingly, the first wiring line WL1 may be electrically connected to the second driving circuit DC2.

The second wiring line WL2 may include a second central portion WLC2, a third branch WLB3, and a fourth branch WLB4. The second central portion WLC2 may extend from the second wiring area WLA2 to the fourth wiring area WLA4 and may extend from the fourth wiring area WLA4 to the sixth wiring area WLA6. The second central portion WLC2 may extend from the sixth wiring area WLA6 to the eighth wiring area WLA8. The third branch WLB3 may extend to or from the second central portion WLC2, and therefore an electrical path may be defined between the third branch WLB3 and the second central portion WLC2. The third branch WLB3 may extend from the sixth wiring area WLA6 to the third driving circuit area DCA3. The third branch WLB3 may be electrically connected to the third driving circuit DC3. The fourth branch WLB4 may extend to or from the second central portion WLC2, and therefore an electrical path may be defined between the fourth branch WLB4 and the second central portion WLC2. The fourth branch WLB4 may extend from the eighth wiring area WLA8 to the fourth driving circuit area DCA4. The fourth branch WLB4 may be electrically connected to the fourth driving circuit DC4. As such, adjacent driving circuits may be electrically connected to the same wiring line.

Figure 16A:
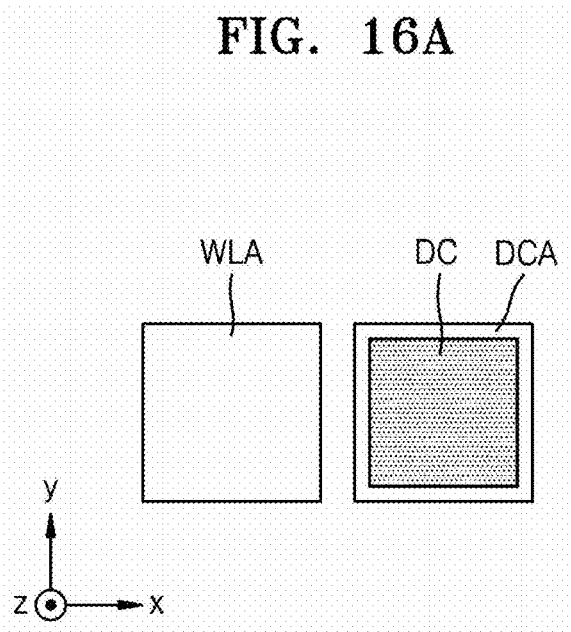
FIGS. 16A and 16B are plan views illustrating the arrangement of a driving circuit area and a wiring area, according to various embodiments.
Figure 16B:
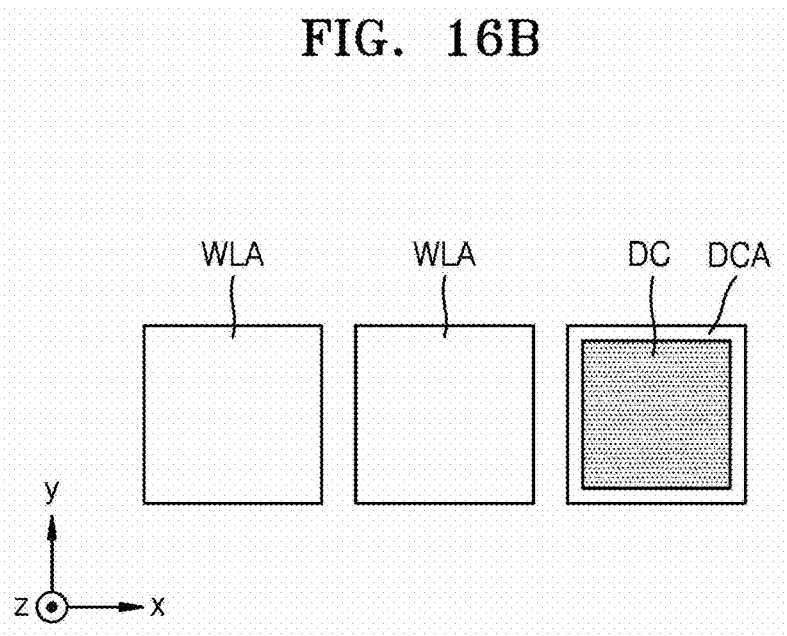

FIGS. 16A and 16B are plan views illustrating the arrangement of a driving circuit area DCA and a wiring area WLA, according to various embodiments.

Referring to FIGS. 16A and 16B, a display device may include a substrate and a circuit layer. The substrate may include a display area and a non-display area, and the non-display area may include a driving circuit area DCA and a wiring area WLA. In an embodiment, the wiring area WLA may be disposed on the left side of the driving circuit area DCA. In other words, the wiring area WLA and the driving circuit area DCA may be sequentially arranged in an x direction.

The circuit layer may be disposed on the substrate. The circuit layer may include a driving circuit DC overlapping the driving circuit area DCA.

Referring to FIG. 16B, a plurality of wiring areas WLA may be provided. The plurality of wiring areas WLA may be adjacent to each other in a first direction (e.g., an x direction or a −x direction). In an embodiment, two wiring areas WLA and a driving circuit area DCA may be sequentially arranged in the x direction, for example.

Figure 17A:
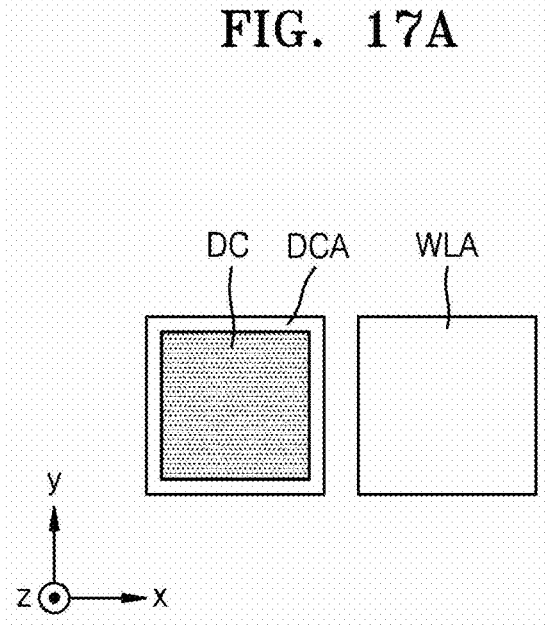
FIGS. 17A and 17B are plan views illustrating the arrangement of a driving circuit area and a wiring area, according to various embodiments.
Figure 17B:
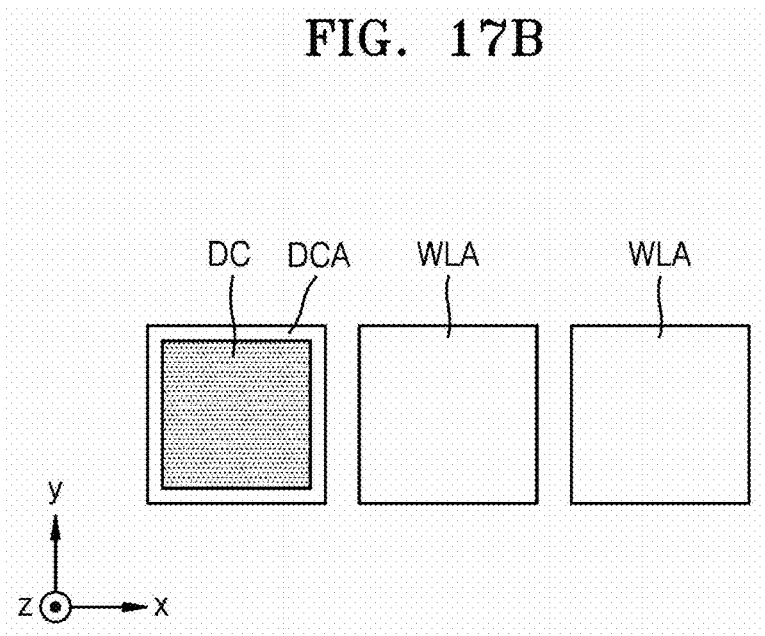

FIGS. 17A and 17B are plan views illustrating the arrangement of a driving circuit area DCA and a wiring area WLA, according to various embodiments.

Referring to FIGS. 17A and 17B, a display device may include a substrate and a circuit layer. The substrate may include a display area and a non-display area, and the non-display area may include a driving circuit area DCA and a wiring area WLA. In an embodiment, the wiring area WLA may be disposed on the right side of the driving circuit area DCA. In other words, the wiring area WLA and the driving circuit area DCA may be sequentially arranged in the −x direction.

The circuit layer may be disposed on the substrate. The circuit layer may include a driving circuit DC overlapping the driving circuit area DCA.

Referring to FIG. 17B, a plurality of wiring areas WLA may be provided. The plurality of wiring areas WLA may be adjacent to each other in the first direction (e.g., the x direction or the −x direction). In an embodiment, two wiring areas WLA and a driving circuit area DCA may be sequentially arranged in the −x direction, for example.

Figure 18A:
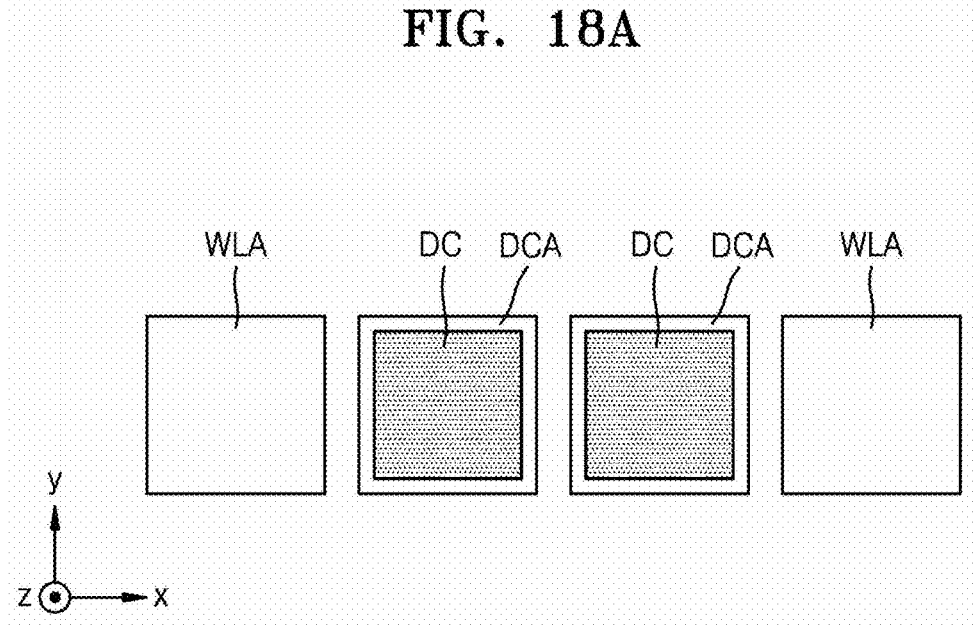
FIGS. 18A to 18C are plan views illustrating the arrangement of a driving circuit area and a wiring area, according to various embodiments.
Figure 18B:
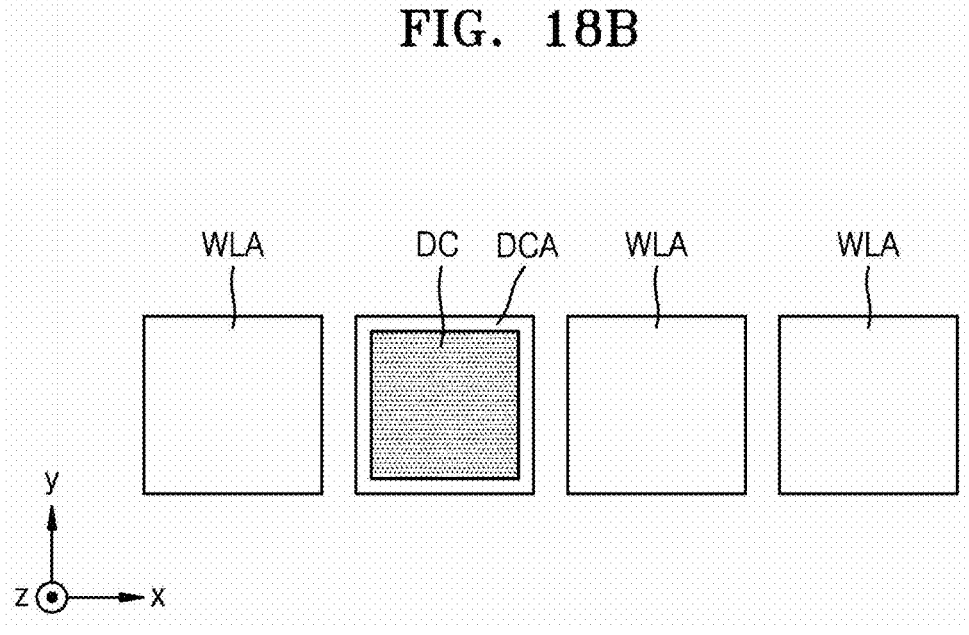
Figure 18C:
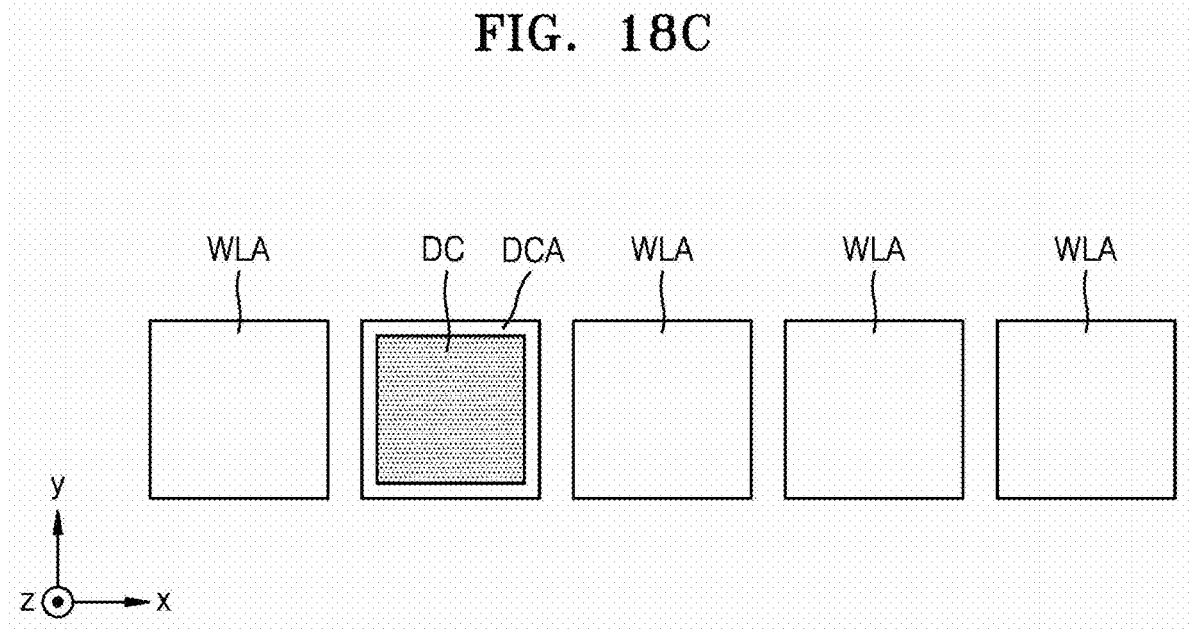

FIGS. 18A to 18C are plan views illustrating the arrangement of a driving circuit area DCA and a wiring area WLA, according to various embodiments.

Referring to FIGS. 18A to 18C, a display device may include a substrate and a circuit layer. The substrate may include a display area and a non-display area, and the non-display area may include a driving circuit area DCA and a wiring area WLA. In an embodiment, a plurality of wiring areas WLA may be provided. The driving circuit area DCA may be disposed between the plurality of wiring areas WLA. The circuit layer may be disposed on the substrate. The circuit layer may include a driving circuit DC overlapping the driving circuit area DCA.

Referring to FIG. 18A, a plurality of driving circuit areas DCA may be provided. The plurality of driving circuit areas DCA may be adjacent to each other in a first direction (e.g., an x direction or a −x direction).

Referring to FIG. 18B, a plurality of wiring areas WLA may be provided. The plurality of wiring areas WLA may be adjacent to each other in the first direction (e.g., the x direction or the −x direction). In an embodiment, a wiring area WLA, a driving circuit area DCA, and two wiring areas WLA may be sequentially arranged in the x direction, for example.

Referring to FIG. 18C, a plurality of wiring areas WLA may be provided. The plurality of wiring areas WLA may be adjacent to each other in the first direction (e.g., the x direction or the −x direction). In an embodiment, a wiring area WLA, a driving circuit area DCA, and three wiring areas WLA may be sequentially arranged in the x direction, for example.

Figure 19:
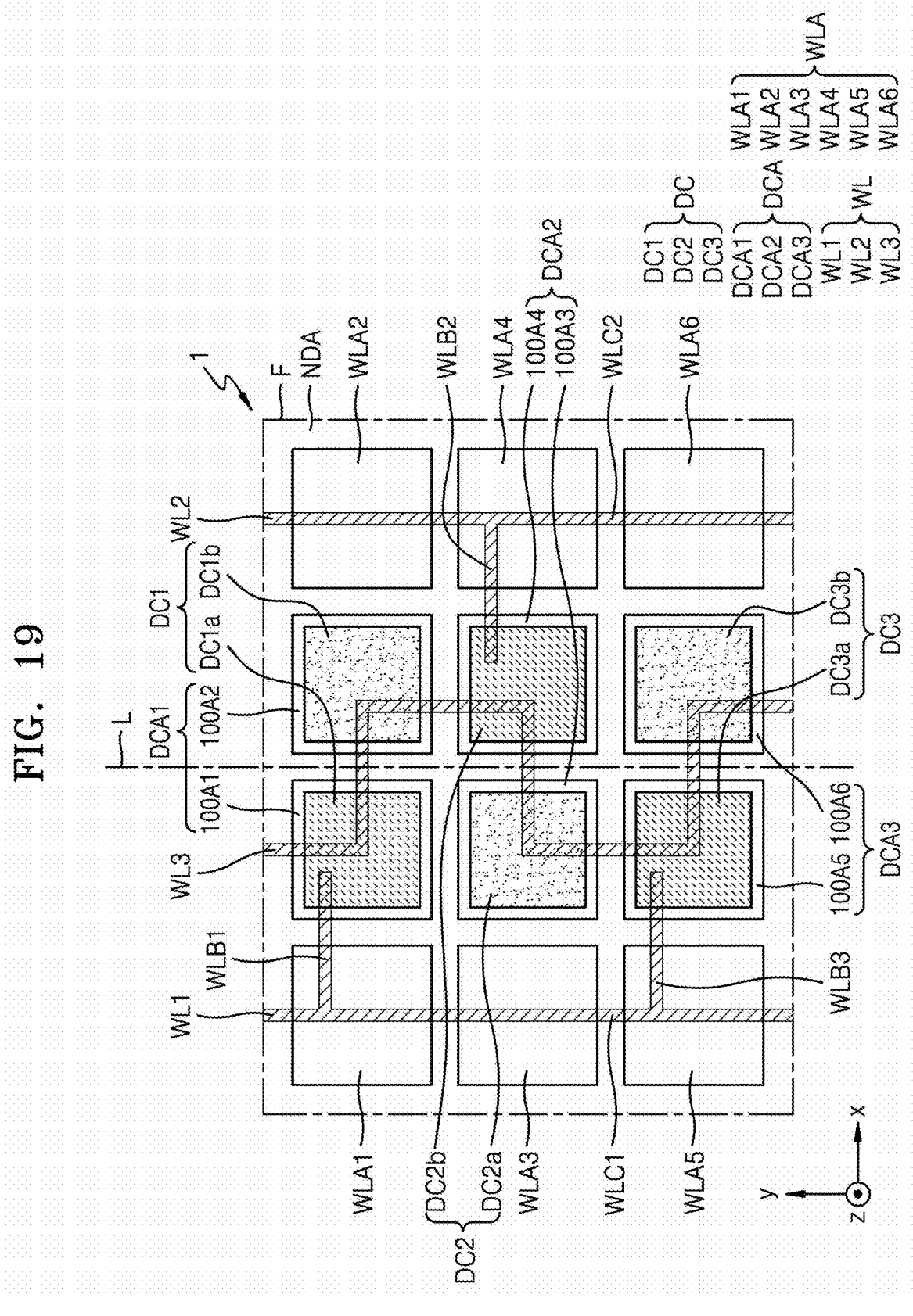
FIG. 19 is an enlarged plan view illustrating another embodiment of the portion F of the display device of FIG. 3.

FIG. 19 is an enlarged plan view illustrating another embodiment of the portion F of the display device 1 of FIG. 3. In FIG. 19, the same reference numerals as those of FIG. 12 denote the same members, and thus repeated descriptions will be omitted.

Referring to FIG. 19, the display device 1 may include a substrate and a circuit layer. The substrate may include a display area and a non-display area NDA. The non-display area NDA may include a driving circuit area DCA and a wiring area WLA.

The driving circuit area DCA may include a first driving circuit area DCA1, a second driving circuit area DCA2, and a third driving circuit area DCA3. The first driving circuit area DCA1, the second driving circuit area DCA2, and the third driving circuit area DCA3 may be sequentially arranged in a second direction (e.g., a y direction or a −y direction).

The driving circuit area DCA may include a plurality of partial driving circuit areas. The first driving circuit area DCA1 may include a first partial driving circuit area 100A1 and a second partial driving circuit area 100A2. In an embodiment, the first partial driving circuit area 100A1 and the second partial driving circuit area 100A2 may be arranged in a first direction (e.g., an x direction or a −x direction). The second driving circuit area DCA2 may include a third partial driving circuit area 100A3 and a fourth partial driving circuit area 100A4. In an embodiment, the third partial driving circuit area 100A3 and the fourth partial driving circuit area 100A4 may be arranged in the first direction (e.g., the x direction or the −x direction). The third driving circuit area DCA3 may include a fifth partial driving circuit area 100A5 and a sixth partial driving circuit area 100A6. In an embodiment, the fifth partial driving circuit area 100A5 and the sixth partial driving circuit area 100A6 may be arranged in the first direction (e.g., the x direction or the −x direction).

The wiring area WLA may be adjacent to the driving circuit area DCA in the first direction (e.g., the x direction or the −x direction). In an embodiment, the wiring area WLA includes a first wiring area WLA1, a second wiring area WLA2, a third wiring area WLA3, a fourth wiring area WLA4, a fifth wiring area WLA5, and a sixth wiring area WLA6. The first wiring area WLA1, the third wiring area WLA3, and the fifth wiring area WLA5 may be sequentially arranged in the second direction (e.g., the y direction or the −y direction). The second wiring area WLA2, the fourth wiring area WLA4, and the sixth wiring area WLA6 may be sequentially arranged in the second direction (e.g., the y direction or the −y direction). The first partial driving circuit area 100A1 and the second partial driving circuit area 100A2 may be disposed between the first wiring area WLA1 and the second wiring area WLA2. The third partial driving circuit area 100A3 and the fourth partial driving circuit area 100A4 may be disposed between the third wiring area WLA3 and the fourth wiring area WLA4. The fifth partial driving circuit area 100A5 and the sixth partial driving circuit area 100A6 may be disposed between the fifth wiring area WLA5 and the sixth wiring area WLA6.

The circuit layer may be disposed on the substrate. The circuit layer may include a driving circuit DC and a wiring line WL. The driving circuit DC may include a first driving circuit DC1, a second driving circuit DC2, and a third driving circuit DC3.

The first driving circuit DC1 may include a first partial driving circuit DC1a and a second partial driving circuit DC1b. The first partial driving circuit DC1a and the second partial driving circuit DC1b may constitute one driving circuit. The first partial driving circuit DC1a may overlap the first partial driving circuit area 100A1. The second partial driving circuit DC1b may overlap the second partial driving circuit area 100A2. In an embodiment, the first partial driving circuit DC1a may be a main circuit portion of the first driving circuit DC1 and the second partial driving circuit DC1b may be a buffer circuit portion of the first driving circuit DC1. The second partial driving circuit DC1b may adjust the magnitude of a signal generated by the first partial driving circuit DC1a.

The second driving circuit DC2 may include a third partial driving circuit DC2a and a fourth partial driving circuit DC2b. The third partial driving circuit DC2a may overlap the third partial driving circuit area 100A3. The fourth partial driving circuit DC2b may overlap the fourth partial driving circuit area 100A4. The third partial driving circuit DC2a and the fourth partial driving circuit DC2b may constitute one driving circuit. In an embodiment, the third partial driving circuit DC2a may be a buffer circuit portion of the second driving circuit DC2 and the fourth partial driving circuit DC2b may be a main circuit portion of the second driving circuit DC2. The third partial driving circuit DC2a may adjust the magnitude of a signal generated by the fourth partial driving circuit DC2b.

The third driving circuit DC3 may include a fifth partial driving circuit DC3a and a sixth partial driving circuit DC3b. The fifth partial driving circuit DC3a may overlap the fifth partial driving circuit area 100A5. The sixth partial driving circuit DC3b may overlap the sixth partial driving circuit area 100A6. The fifth partial driving circuit DC3a and the sixth partial driving circuit DC3b may constitute one driving circuit. In an embodiment, the fifth partial driving circuit DC3a may be a main circuit portion of the third driving circuit DC3 and the sixth partial driving circuit DC3b may be a buffer circuit portion of the third driving circuit DC3. The sixth partial driving circuit DC3b may adjust the magnitude of a signal generated by the fifth partial driving circuit DC3a.

The main circuit portion may include at least one transistor and at least one storage capacitor, and the buffer circuit portion may include at least one transistor. In an embodiment, the buffer circuit portion may not include a storage capacitor. The buffer circuit portion may adjust the magnitude of a signal generated by the main circuit portion.

In the illustrated embodiment, the main circuit portion and the buffer circuit portion may be separately disposed. Accordingly, the area of the buffer circuit portion may increase and the capacity of the buffer circuit portion may increase. In this case, a signal generated by the driving circuit DC may be charged or discharged within a preset time without delay. Accordingly, the display device 1 capable of performing high-speed driving may be implemented. In an alternative embodiment, the area of the driving circuit area DCA may be reduced, and the area of a pixel area having the same area as that of the driving circuit area DCA may also be reduced. Accordingly, the display device 1 having a high resolution may be implemented.

An imaginary straight line L may extend between the first partial driving circuit area 100A1 and the second partial driving circuit area 100A2. The imaginary straight line L may extend between the third partial driving circuit area 100A3 and the fourth partial driving circuit area 100A4. The imaginary straight line L may extend between the fifth partial driving circuit area 100A5 and the sixth partial driving circuit area 100A6. In an embodiment, the shapes of the components of the first partial driving circuit DC1a and the shapes of the components of the fourth partial driving circuit DC2b may be opposite to each other based on the imaginary straight line L. In an embodiment, the shapes of the components of the second partial driving circuit DC1b and the shapes of the components of the third partial driving circuit DC2a may be opposite to each other based on the imaginary straight line L. In an embodiment, the shapes of the components of the fourth partial driving circuit DC2b and the shapes of the components of the fifth partial driving circuit DC3a may be opposite to each other based on the imaginary straight line L. In an embodiment, the shapes of the components of the third partial driving circuit DC2a and the shapes of the components of the sixth partial driving circuit DC3b may be opposite to each other based on the imaginary straight line L. In this case, a component of the partial driving circuit may be an electrode or a semiconductor layer constituting the partial driving circuit.

The wiring line WL may overlap the wiring area WLA. The wiring line WL may include a first wiring line WL1, a second wiring line WL2, and a third wiring line WL3. The first wiring line WL1 may extend from the first wiring area WLA1 to the third wiring area WLA3. The first wiring line WL1 may extend from the third wiring area WLA3 to the fifth wiring area WLA5.

The first wiring line WL1 may include a first central portion WLC1, a first branch WLB1, and a third branch WLB3. The first central portion WLC1 may extend from the first wiring area WLA1 to the third wiring area WLA3 and may extend from the third wiring area WLA3 to the fifth wiring area WLA5. The first branch WLB1 may extend to or from the first central portion WLC1, and therefore an electrical path may be defined between the first branch WLB1 and the first central portion WLC1. The first branch WLB1 may extend from the first wiring area WLA1 to the first partial driving circuit area 100A1. The first branch WLB1 may be electrically connected to the first partial driving circuit DC1a. Accordingly, the first wiring line WL1 may be electrically connected to the first driving circuit DC1. The third branch WLB3 may extend to or from the first central portion WLC1, and therefore an electrical path may be defined between the third branch WLB3 and the first central portion WLC1. The third branch WLB3 may extend from the fifth wiring area WLA5 to the fifth partial driving circuit area 100A5. The third branch WLB3 may be electrically connected to the fifth partial driving circuit DC3a. Accordingly, the first wiring line WL1 may be electrically connected to the third driving circuit DC3.

The second wiring line WL2 may include a second central portion WLC2 and a second branch WLB2. The second central portion WLC2 may extend from the second wiring area WLA2 to the fourth wiring area WLA4 and may extend from the fourth wiring area WLA4 to the sixth wiring area WLA6. The second branch WLB2 may extend to or from the second central portion WLC2, and therefore an electrical path may be defined between the second branch WLB2 and the second central portion WLC2. The second branch WLB2 may extend from the fourth wiring area WLA4 to the fourth partial driving circuit area 100A4. The second branch WLB2 may be electrically connected to the fourth partial driving circuit DC2b. Accordingly, the second wiring line WL2 may be electrically connected to the second driving circuit DC2. As described above, driving circuits DC arranged in an odd row may be electrically connected to the first wiring line WL1, and driving circuits DC arranged in an even row may be electrically connected to the second wiring line WL2.

The third wiring line WL3 may extend from the first driving circuit area DCA1 to the second driving circuit area DCA2. In an embodiment, the third wiring line WL3 may extend from the first partial driving circuit area 100A1 to the second partial driving circuit area 100A2, for example. The third wiring line WL3 may extend from the second partial driving circuit area 100A2 to the fourth partial driving circuit area 100A4. The third wiring line WL3 may extend from the fourth partial driving circuit area 100A4 to the third partial driving circuit area 100A3.

The third wiring line WL3 may extend from the second driving circuit area DCA2 to the third driving circuit area DCA3. In an embodiment, the third wiring line WL3 may extend from the third partial driving circuit area 100A3 to the fifth partial driving circuit area 100A5, for example. The third wiring line WL3 may extend from the fifth partial driving circuit area 100A5 to the sixth partial driving circuit area 100A6. The third wiring line WL3 may be electrically connected to the driving circuit DC. Although FIG. 19 illustrates a case in which the third wiring line WL3 extends in a zigzag shape, the invention is not limited thereto. In other embodiments, the third wiring line WL3 may extend in various shapes.

Any one of the first wiring line WL1, the second wiring line WL2, and the third wiring line WL3 may be a voltage line. The other of the first wiring line WL1, the second wiring line WL2, and the third wiring line WL3 may be a clock signal line. In an embodiment, the first wiring line WL1 and the second wiring line WL2 may be voltage lines, and the third wiring line WL3 may be a clock signal line, for example. When the first wiring line WL1 and the second wiring line WL2 are voltage lines, the third wiring line WL3 is a clock signal line, and the third wiring line WL3 extends from the first driving circuit area DCA1 to the second driving circuit area DCA2 and from the second driving circuit area DCA2 to the third driving circuit area DCA3, the load resistance may be reduced.

Figure 20:
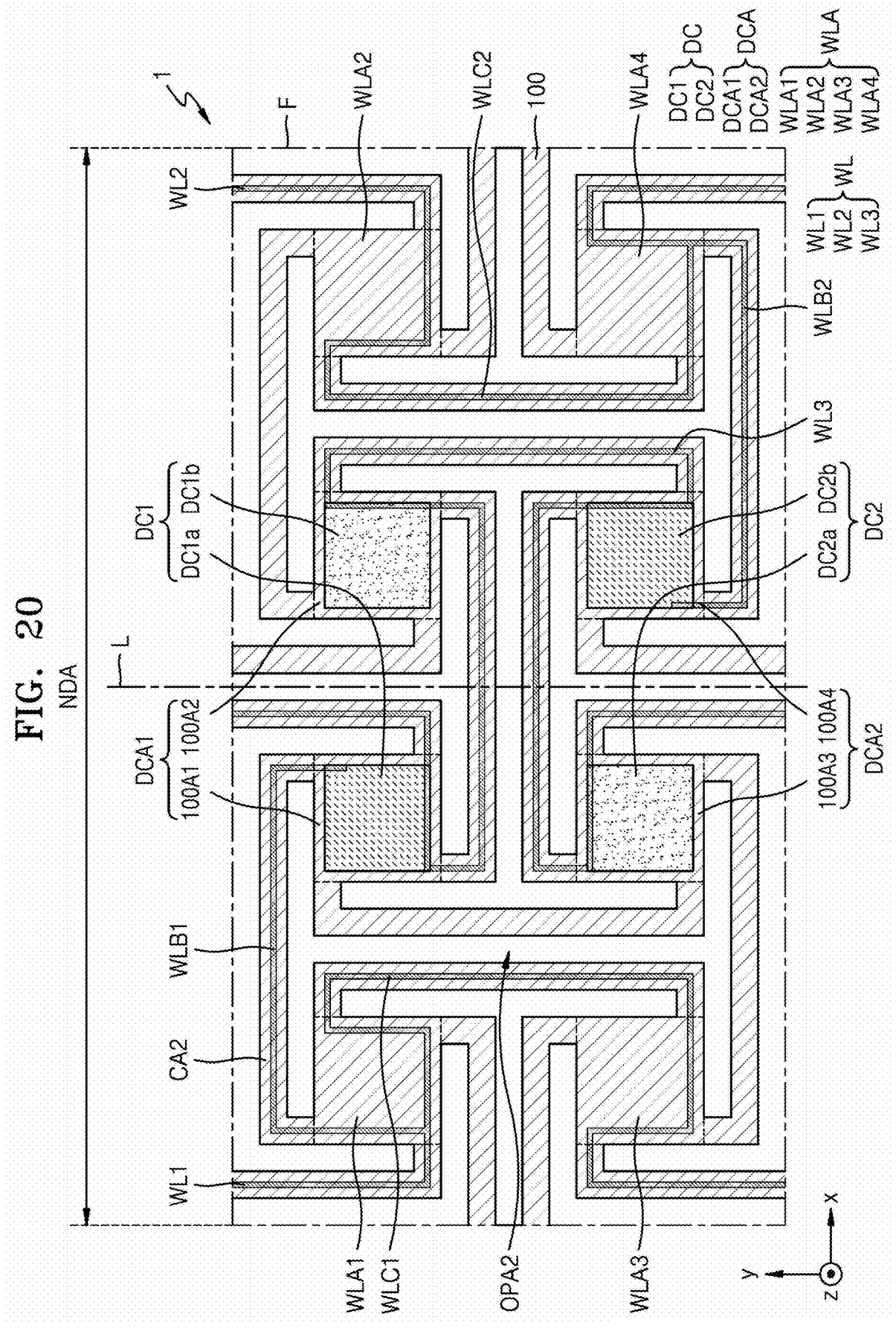
FIG. 20 is an enlarged plan view illustrating another embodiment of the portion F of the display device of FIG. 3.

FIG. 20 is an enlarged plan view illustrating another embodiment of the portion F of the display device 1 of FIG. 3. In FIG. 20, the same reference numerals as those of FIG. 13A denote the same members, and thus repeated descriptions will be omitted.

Referring to FIG. 20, the display device 1 may include a substrate 100 and a circuit layer. The substrate 100 may include a display area and a non-display area NDA. The non-display area NDA may include a driving circuit area DCA, a wiring area WLA and a second connection area CA2, and a second opening area OPA2 may be defined in the non-display area NDA. In an embodiment, the driving circuit area DCA and the wiring area WLA may be adjacent to each other in a first direction (e.g., an x direction or a -x direction). In an embodiment, the wiring area WLA may include a first wiring area WLA1 and a second wiring area WLA2 disposed on opposite sides of the driving circuit area DCA in the first direction (e.g., the x direction or the -x direction). A plurality of driving circuit areas DCA may be provided, and a plurality of wiring areas WLA may be provided. In an embodiment, the plurality of driving circuit areas DCA may be arranged in a second direction (e.g., a y direction or a -y direction), for example. The plurality of wiring areas WLA may be arranged in the second direction (e.g., the y direction or the -y direction).

The driving circuit area DCA may include a plurality of partial driving circuit areas. The driving circuit area DCA may include a first driving circuit area DCA1 and a second driving circuit area DCA2. The first driving circuit area DCA1 may include a first partial driving circuit area 100A1 and a second partial driving circuit area 100A2. The first partial driving circuit area 100A1 and the second partial driving circuit area 100A2 may have the same area as each other. In an embodiment, the first partial driving circuit area 100A1 and the second partial driving circuit area 100A2 may be arranged in the first direction (e.g., the x direction or the -x direction). The second driving circuit area DCA2 may include a third partial driving circuit area 100A3 and a fourth partial driving circuit area 100A4. The third partial driving circuit area 100A3 and the fourth partial driving circuit area 100A4 may have the same area as each other. In an embodiment, the third partial driving circuit area 100A3 and the fourth partial driving circuit area 100A4 may be arranged in the first direction (e.g., the x direction or the -x direction).

The second connection area CA2 may be a second bridge area in the non-display area NDA. The second connection area CA2 may extend from the driving circuit area DCA or the wiring area WLA to an adjacent driving circuit area DCA or an adjacent wiring area WLA. The second connection area CA2 may extend from the wiring area WLA to an adjacent partial driving circuit area. The second connection area CA2 may extend from a partial driving circuit area to an adjacent partial driving circuit area. The partial driving circuit area may extend to or from four second connection areas CA2. One wiring area WLA may extend to or from four second connection areas CA2. Each of the four second connection areas CA2 may extend to or from an adjacent partial driving circuit area or an adjacent wiring area WLA.

The second opening area OPA2 may be an empty area in which components of the display device 1 are not disposed in the non-display area NDA. The second opening area OPA2 may be defined between a driving circuit area DCA and a wiring area WLA which are adjacent to each other. The second opening area OPA2 may be defined between adjacent partial driving circuit areas. In an alternative embodiment, the second opening area OPA2 may be defined between adjacent wiring areas WLA. In an embodiment, the second opening area OPA2 may be defined between a partial driving circuit area and a wiring area WLA.

The wiring area WLA may be adjacent to the driving circuit area DCA in the first direction (e.g., the x direction or the –x direction). In an embodiment, the wiring area WLA may include a first wiring area WLA1, a second wiring area WLA2, a third wiring area WLA3, and a fourth wiring area WLA4. The first wiring area WLA1 and the third wiring area WLA3 may be sequentially arranged in the second direction (e.g., the y direction or the –y direction). The second wiring area WLA2 and the fourth wiring area WLA4 may be sequentially arranged in the second direction (e.g., the y direction or the –y direction). The first partial driving circuit area 100A1 and the second partial driving circuit area 100A2 may be disposed between the first wiring area WLA1 and the second wiring area WLA2. The third partial driving circuit area 100A3 and the fourth partial driving circuit area 100A4 may be disposed between the third wiring area WLA3 and the fourth wiring area WLA4.

The circuit layer may be disposed on the substrate 100. The circuit layer may include a driving circuit DC and a wiring line WL. The driving circuit DC may include a first driving circuit DC1 and a second driving circuit DC2.

The first driving circuit DC1 may include a first partial driving circuit DC1a and a second partial driving circuit DC1b. The first partial driving circuit DC1a and the second partial driving circuit DC1b may constitute one driving circuit. The first partial driving circuit DC1a may overlap the first partial driving circuit area 100A1. The second partial driving circuit DC1b may overlap the second partial driving circuit area 100A2. In an embodiment, the first partial driving circuit DC1a may be a main circuit portion of the first driving circuit DC1 and the second partial driving circuit DC1b may be a buffer circuit portion of the first driving circuit DC1. The second partial driving circuit DC1b may adjust the magnitude of a signal generated by the first partial driving circuit DC1a.

The second driving circuit DC2 may include a third partial driving circuit DC2a and a fourth partial driving circuit DC2b. The third partial driving circuit DC2a may overlap the third partial driving circuit area 100A3. The fourth partial driving circuit DC2b may overlap the fourth partial driving circuit area 100A4. The third partial driving circuit DC2a and the fourth partial driving circuit DC2b may constitute one driving circuit. In an embodiment, the third partial driving circuit DC2a may be a buffer circuit portion of the second driving circuit DC2 and the fourth partial driving circuit DC2b may be a main circuit portion of the second driving circuit DC2. The fourth partial driving circuit DC2b may adjust the magnitude of a signal generated by the third partial driving circuit DC2a.

In the illustrated embodiment, the main circuit portion and the buffer circuit portion may be separately disposed. Accordingly, the area of the buffer circuit portion may increase and the capacity of the buffer circuit portion may increase. In this case, a signal generated by the driving circuit DC may be charged or discharged within a preset time without delay. Accordingly, the display device 1 capable of performing high-speed driving may be implemented. In an alternative embodiment, the area of the driving circuit area DCA may be reduced, and the area of a pixel area having the same area as that of the driving circuit area DCA may also be reduced. Accordingly, the display device 1 having a high resolution may be implemented.

An imaginary straight line L may extend between the first partial driving circuit area 100A1 and the second partial driving circuit area 100A2. The imaginary straight line L may extend between the third partial driving circuit area 100A3 and the fourth partial driving circuit area 100A4. In an embodiment, the shapes of the components of the first partial driving circuit DC1a and the shapes of the components of the fourth partial driving circuit DC2b may be opposite to each other based on the imaginary straight line L. In an embodiment, the shapes of the components of the second partial driving circuit DC1b and the shapes of the components of the third partial driving circuit DC2a may be opposite to each other based on the imaginary straight line L.

The wiring line WL may overlap the wiring area WLA. The wiring line WL may include a first wiring line WL1, a second wiring line WL2, and a third wiring line WL3. The first wiring line WL1 may extend from the first wiring area WLA1 to the third wiring area WLA3. In an embodiment, the first wiring line WL1 may include a first central portion WLC1 and a first branch WLB1. The first central portion WLC1 may extend from the first wiring area WLA1 to the third wiring area WLA3 via the second connection area CA2 extending to or from both of the first wiring area WLA1 and the third wiring area WLA3. The first branch WLB1 may extend from the first wiring area WLA1 to the first partial driving circuit area 100A1 via the second connection area CA2 extending to or from both of the first wiring area WLA1 and the first partial driving circuit area 100A1. The first branch WLB1 may be electrically connected to the first partial driving circuit DC1a. Accordingly, the first wiring line WL1 may be electrically connected to the first driving circuit DC1.

The second wiring line WL2 may include a second central portion WLC2 and a second branch WLB2. The second central portion WLC2 may extend from the second wiring area WLA2 to the fourth wiring area WLA4 via the second connection area CA2 extending to or from both of the second wiring area WLA2 and the fourth wiring area WLA4. The second branch WLB2 may extend from the fourth wiring area WLA4 to the fourth partial driving circuit area 100A4 via the second connection area CA2 extending to or from both of the fourth wiring area WLA4 and the fourth partial driving circuit area 100A4. The second branch WLB2 may extend to or from the second central portion WLC2 in the fourth wiring area WLA4, and therefore an electrical path may be defined between the second branch WLB2 and the second central portion WLC2. The second branch WLB2 may be electrically connected to the fourth partial driving circuit DC2b. Accordingly, the second wiring line WL2 may be electrically connected to the second driving circuit DC2. As described above, driving circuits DC arranged in an odd row may be electrically connected to the first wiring line WL1, and driving circuits DC arranged in an even row may be electrically connected to the second wiring line WL2.

The third wiring line WL3 may extend from the first driving circuit area DCA1 to the second driving circuit area DCA2. In an embodiment, the third wiring line WL3 may extend from the first partial driving circuit area 100A1 to the second partial driving circuit area 100A2 via the second connection area CA2 extending to or from both of the first partial driving circuit area 100A1 and the second partial driving circuit area 100A2, for example. The third wiring line WL3 may extend from the second partial driving circuit area 100A2 to the fourth partial driving circuit area 100A4 via the second connection area CA2 extending to or from both of the second partial driving circuit area 100A2 and the fourth partial driving circuit area 100A4. The third wiring line WL3 may extend from the fourth partial driving circuit area 100A4 to the third partial driving circuit area 100A3 via the second connection area CA2 extending to or from both of the fourth partial driving circuit area 100A4 and the third partial driving circuit area 100A3.

Any one of the first wiring line WL1, the second wiring line WL2, and the third wiring line WL3 may be a voltage line. The other of the first wiring line WL1, the second wiring line WL2, and the third wiring line WL3 may be a clock signal line. In an embodiment, the first wiring line WL1 and the second wiring line WL2 may be voltage lines, and the third wiring line WL3 may be a clock signal line, for example. When the first wiring line WL1 and the second wiring line WL2 are voltage lines, the third wiring line WL3 is a clock signal line, and the third wiring line WL3 extends from the first driving circuit area DCA1 to the second driving circuit area DCA2, the load resistance may be reduced.

FIGS. 21A, 21B, 22A, and 22B are plan views illustrating the arrangement of a first partial driving circuit area 100A1, a second partial driving circuit area 100A2, a third partial driving circuit area 100A3, and a fourth partial driving circuit area 100A4, according to various embodiments.

Referring to FIGS. 21A, 21B, 22A, and 22B, a display device may include a substrate and a circuit layer. The substrate may include a display area and a non-display area, and the non-display area may include a driving circuit area. The driving circuit area may include the first partial driving circuit area 100A1, the second partial driving circuit area 100A2, the third partial driving circuit area 100A3, and the fourth partial driving circuit area 100A4. In an embodiment, the first partial driving circuit area 100A1 and the second partial driving circuit area 100A2 may be adjacent to each other in a first direction (e.g., an x direction or a −x direction). The third partial driving circuit area 100A3 and the fourth partial driving circuit area 100A4 may be adjacent to each other in the first direction (e.g., the x direction or the −x direction). The first partial driving circuit area 100A1 and the third partial driving circuit area 100A3 may be adjacent to each other in a second direction (e.g., a y direction or a −y direction). The second partial driving circuit area 100A2 and the fourth partial driving circuit area 100A4 may be adjacent to each other in the second direction (e.g., the y direction or the −y direction).

The circuit layer may be disposed on the substrate. The circuit layer may include a driving circuit. In an embodiment, the driving circuit may include a first driving circuit and a second driving circuit. The first driving circuit may include a first partial driving circuit DC1a and a second partial driving circuit DC1b. The first partial driving circuit DC1a and the second partial driving circuit DC1b may constitute one driving circuit. The first partial driving circuit DC1a may be a main circuit portion of the first driving circuit, and the second partial driving circuit DC1b may be a buffer circuit portion of the first driving circuit. The second partial driving circuit DC1b may adjust the magnitude of a signal generated by the first partial driving circuit DC1a. The first partial driving circuit DC1a may overlap the first partial driving circuit area 100A1. The second partial driving circuit DC1b may overlap the second partial driving circuit area 100A2.

The second driving circuit may include a third partial driving circuit DC2a and a fourth partial driving circuit DC2b. The third partial driving circuit DC2a and the fourth partial driving circuit DC2b may constitute one driving circuit. The third partial driving circuit DC2a may be a main circuit portion of the second driving circuit, and the fourth partial driving circuit DC2b may be a buffer circuit portion of the second driving circuit. The fourth partial driving circuit DC2b may adjust the magnitude of a signal generated by the third partial driving circuit DC2a. The third partial driving circuit DC2a may overlap the third partial driving circuit area 100A3. The fourth partial driving circuit DC2b may overlap the fourth partial driving circuit area 100A4.

Figure 21A:
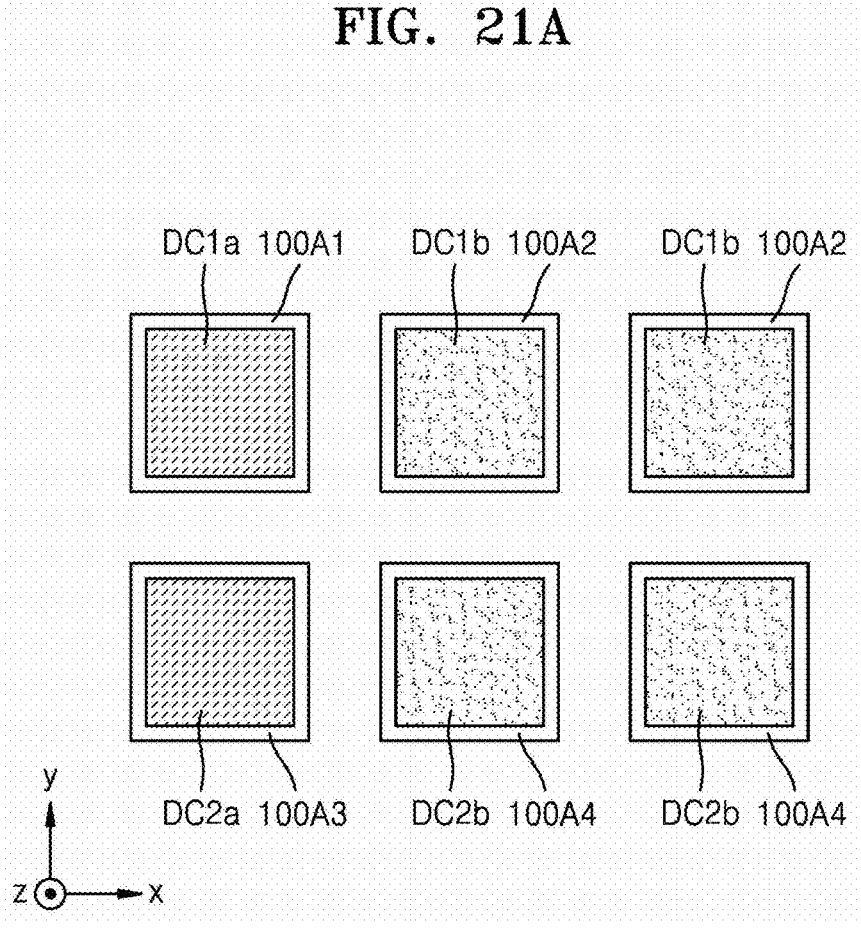
FIGS. 21A, 21B, 22A, and 22B are plan views illustrating the arrangement of a first partial driving circuit area, a second partial driving circuit area, a third partial driving circuit area, and a fourth partial driving circuit area, according to various embodiments.
Figure 21B:
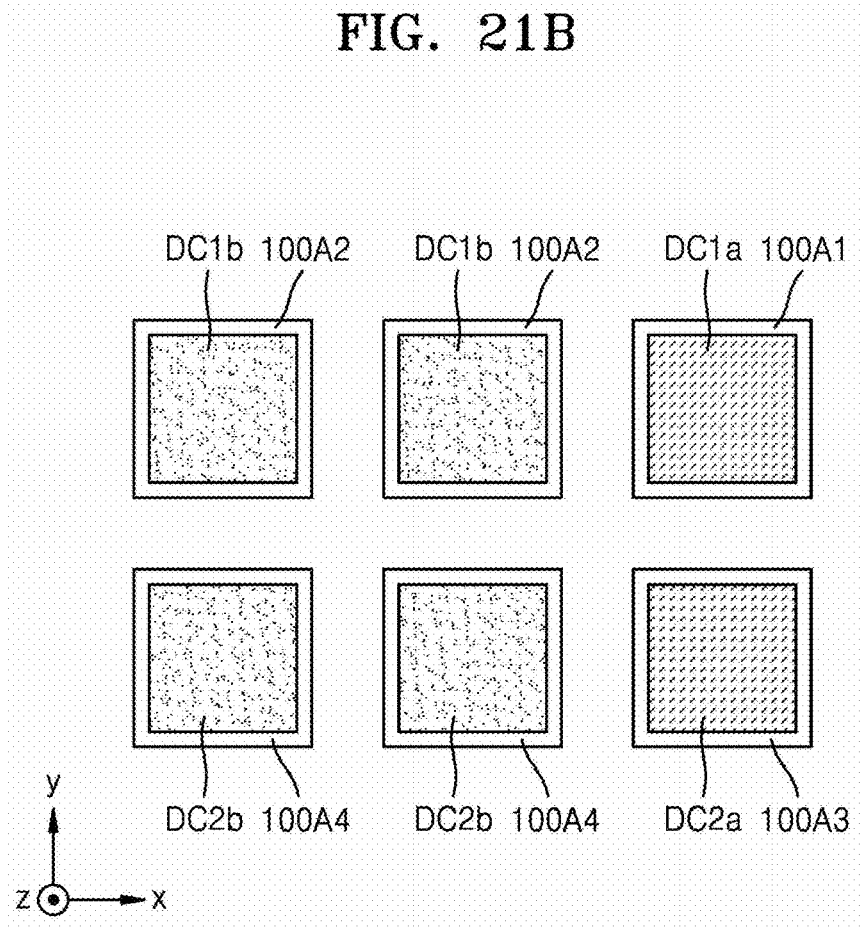

Referring to FIGS. 21A and 21B, a plurality of second partial driving circuit areas 100A2 and a plurality of fourth partial driving circuit areas 100A4 may be provided. The plurality of second partial driving circuit areas 100A2 may be adjacent to each other in the first direction (e.g., the x direction or the −x direction). The plurality of fourth partial driving circuit areas 100A4 may be adjacent to each other in the first direction (e.g., the x direction or the −x direction). A plurality of second partial driving circuits DC1b and a plurality of fourth partial driving circuits DC2b may be provided.

Referring to FIG. 21A, a first partial driving circuit area 100A1 and a plurality of second partial driving circuit areas 100A2 may be sequentially arranged in the x direction. A third partial driving circuit area 100A3 and a plurality of fourth partial driving circuit areas 100A4 may be sequentially arranged in the x direction.

Referring to FIG. 21B, a plurality of second partial driving circuit areas 100A2 and a first partial driving circuit area 100A1 may be sequentially arranged in the x direction. A plurality of fourth partial driving circuit areas 100A4 and a third partial driving circuit area 100A3 may be sequentially arranged in the x direction.

Figure 22A:
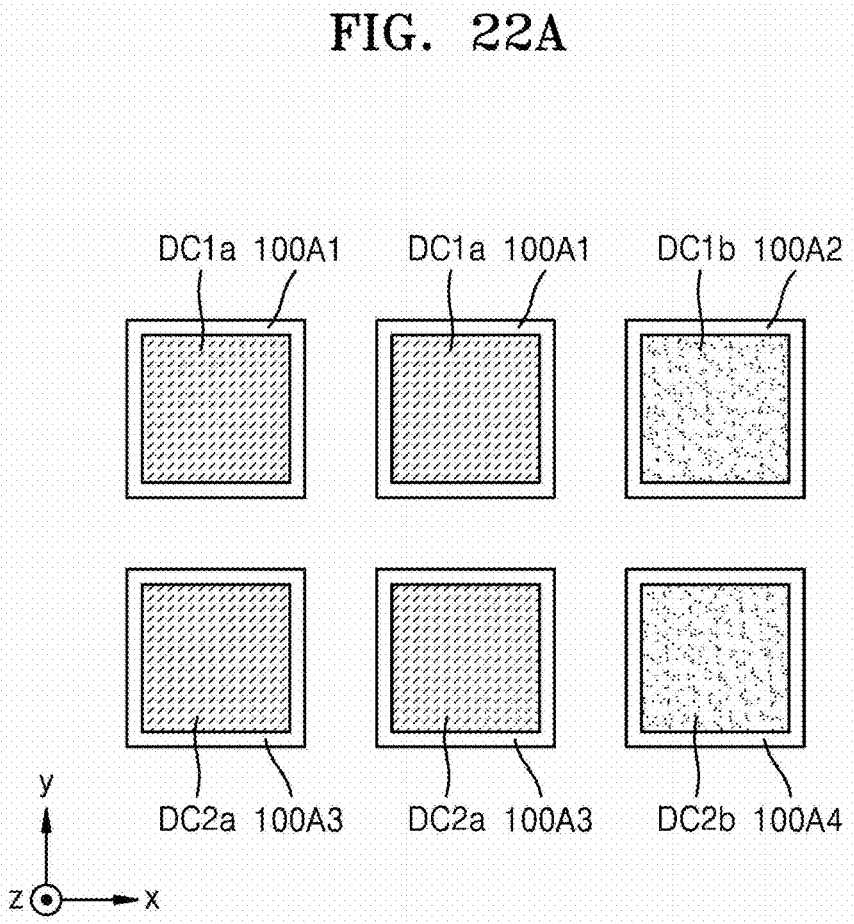
Figure 22B:
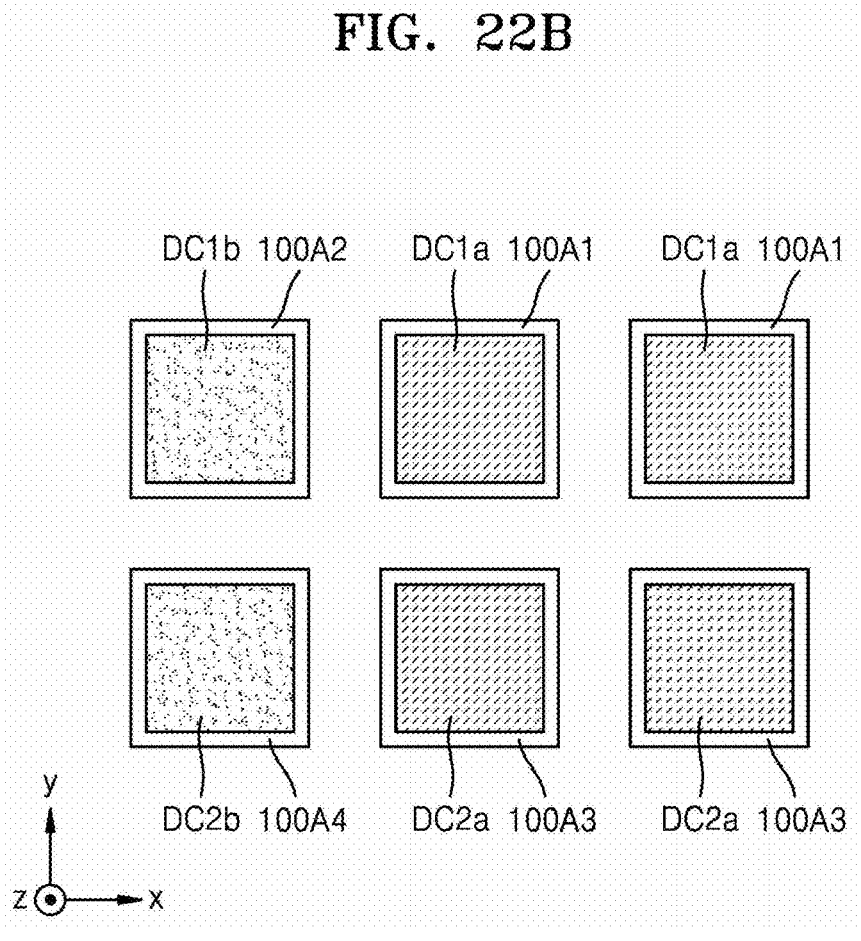

Referring to FIGS. 22A and 22B, a plurality of first partial driving circuit areas 100A1 and a plurality of third partial driving circuit area 100A3 may be provided. The plurality of first partial driving circuit areas 100A1 may be adjacent to each other in the first direction (e.g., the x direction or the −x direction). The plurality of third partial driving circuit areas 100A3 may be adjacent to each other in the first direction (e.g., the x direction or the −x direction). A plurality of first partial driving circuits DC1a and a plurality of third partial driving circuits DC2a may be provided.

Referring to FIG. 22A, a plurality of first partial driving circuit areas 100A1 and a second partial driving circuit area 100A2 may be sequentially arranged in the x direction. A plurality of third partial driving circuit areas 100A3 and a fourth partial driving circuit area 100A4 may be sequentially arranged in the x direction.

Referring to FIG. 22B, a second partial driving circuit area 100A2 and a plurality of first partial driving circuit areas 100A1 may be sequentially arranged in the x direction.

A fourth partial driving circuit area 100A4 and a plurality of third partial driving circuit areas 100A3 may be sequentially arranged in the x direction.

Figure 23A:
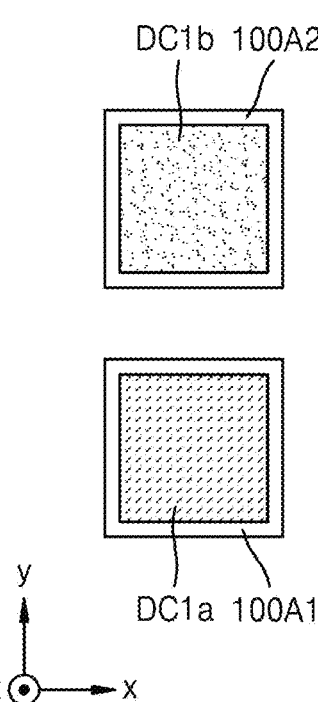
FIGS. 23A and 23B are plan views illustrating the arrangement of a first partial driving circuit area and a second partial driving circuit area, according to various embodiments.
Figure 23B:
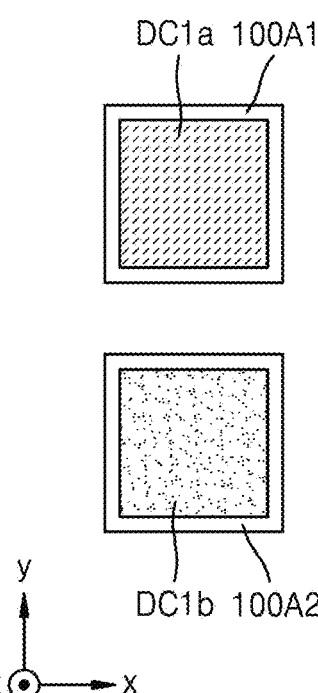

FIGS. 23A and 23B are plan views illustrating the arrangement of a first partial driving circuit area 100A1 and a second partial driving circuit area 100A2, according to various embodiments.

Referring to FIGS. 23A and 23B, a display device may include a substrate and a circuit layer. The substrate may include a display area and a non-display area, and the non-display area may include a driving circuit area. The driving circuit area may include the first partial driving circuit area 100A1 and the second partial driving circuit area 100A2. In an embodiment, the first partial driving circuit area 100A1 and the second partial driving circuit area 100A2 may be adjacent to each other in a second direction (e.g., a y direction or a −y direction).

The circuit layer may be disposed on the substrate. The circuit layer may include a first driving circuit. The first driving circuit may include a first partial driving circuit DC1*a* and a second partial driving circuit DC1*b*. The first partial driving circuit DC1*a* and the second partial driving circuit DC1*b* may constitute one driving circuit. The first partial driving circuit DC1*a* may be a main circuit portion of the first driving circuit, and the second partial driving circuit DC1*b* may be a buffer circuit portion of the first driving circuit. The second partial driving circuit DC1*b* may adjust the magnitude of a signal generated by the first partial driving circuit DC1*a*. The first partial driving circuit DC1*a* may overlap the first partial driving circuit area 100A1. The second partial driving circuit DC1*b* may overlap the second partial driving circuit area 100A2.

Referring to FIG. 23A, the first partial driving circuit area 100A1 and the second partial driving circuit area 100A2 may be sequentially arranged in the y direction.

Referring to FIG. 23B, the first partial driving circuit area 100A1 and the second partial driving circuit area 100A2 may be sequentially arranged in the −y direction.

As described above, in a display device in an embodiment, a first opening area may be defined in a display area, and a second opening area may be defined in a non-display area between a driving circuit area and a wiring area. Accordingly, the display area and the non-display area may be deformed into various shapes without damage.

Also, the display device in the embodiment may include a driving circuit area and a wiring area, which have the same width, and the wiring area may include a first wiring area and a second wiring area, disposed on opposite sides of the driving circuit area. Accordingly, wiring lines electrically connected to a driving circuit may be disposed in the wiring area, and damage to the display device may be reduced when the shape of the display device is deformed in the non-display region.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display device comprising:
a substrate including:
a display area; and
a non-display area including:
a driving circuit area; and
a wiring area including a first wiring area and a second wiring area respectively disposed on opposite sides of the driving circuit area in a first direction; and
a circuit layer disposed on the substrate, the circuit layer including:
a driving circuit overlapping the driving circuit area; and
a wiring line overlapping the wiring area and electrically connected to the driving circuit,
wherein a first opening area is defined in the display area, and a second opening area is defined between the driving circuit area and the wiring area, and
wherein a width of the driving circuit area and a width of the wiring area are equal to each other.

2. The display device of claim 1, further comprising a light-emitting element layer disposed on the circuit layer, the light-emitting element layer including a first light-emitting element and a second light-emitting element,
wherein the display area further includes a first pixel area, a second pixel area adjacent to the first pixel area in the first direction, and a first connection area extending from the first pixel area to the second pixel area, the circuit layer further includes a first pixel circuit overlapping the first pixel area and a second pixel circuit overlapping the second pixel area, the first light-emitting element overlaps the first pixel area and the second light-emitting element overlaps the second pixel area, the first opening area is defined between the first pixel area and the second pixel area, and the non-display area further includes a second connection area extending from the driving circuit area to the wiring area,
wherein, in a plan view, an edge of the first pixel area, an edge of the second pixel area, and an edge of the first connection area define at least a portion of the first opening area, and in the plan view, an edge of the driving circuit area, an edge of the wiring area, and an edge of the second connection area define at least a portion of the second opening area, and
wherein a width of the first connection area and a width of the second connection area are equal to each other.

3. The display device of claim 1, wherein the driving circuit area includes a first driving circuit area and a second driving circuit area, arranged in a second direction crossing the first direction, the driving circuit includes a first driving circuit overlapping the first driving circuit area and a second driving circuit overlapping the second driving circuit area, and the wiring area further includes a third wiring area and a fourth wiring area, and
wherein the first wiring area and the third wiring area are arranged in the second direction, the second wiring area and the fourth wiring area are arranged in the second direction, the first driving circuit area is disposed between the first wiring area and the second wiring area, and the second driving circuit area is disposed between the third wiring area and the fourth wiring area.

4. The display device of claim 3, wherein the wiring line includes a first wiring line extending from the first wiring area to the third wiring area and a second wiring line extending from the second wiring area to the fourth wiring area, and
wherein the first wiring line includes a first branch extending from the first wiring area to the first driving circuit area and electrically connected to the first driving circuit, and the second wiring line includes a second branch extending from the fourth wiring area to the second driving circuit area and electrically connected to the second driving circuit.

5. The display device of claim 4, wherein the wiring line further includes a third wiring line extending from the first driving circuit area to the second driving circuit area, and wherein the first wiring line and the second wiring line are voltage lines, and the third wiring line is a clock signal line.

6. The display device of claim 4, wherein the wiring line further includes a signal line electrically connected to the first driving circuit and extending from the first driving circuit area to the second wiring area, and wherein the signal line extends from the first driving circuit area to the second driving circuit area and is electrically connected to the second driving circuit.

7. The display device of claim 4, wherein the driving circuit area further includes a third driving circuit area arranged in the second direction together with the second driving circuit area, the driving circuit further includes a third driving circuit overlapping the third driving circuit area, and the wiring area further includes a fifth wiring area and a sixth wiring area, and wherein the fifth wiring area is arranged in the second direction together with the third wiring area, the sixth wiring area is arranged in the second direction together with the fourth wiring area, the third driving circuit area is disposed between the fifth wiring area and the sixth wiring area, and the first wiring line further includes a third branch extending from the fifth wiring area to the third driving circuit area and electrically connected to the third driving circuit.

8. The display device of claim 3, wherein the driving circuit area further includes a third driving circuit area and a fourth driving circuit area, arranged in the second direction together with the second driving circuit area, the driving circuit further includes a third driving circuit overlapping the third driving circuit area and a fourth driving circuit overlapping the fourth driving circuit area, and the wiring area further includes a fifth wiring area, a sixth wiring area, a seventh wiring area, and an eighth wiring area, wherein the fifth wiring area and the seventh wiring area are arranged in the second direction, the sixth wiring area and the eighth wiring area are arranged in the second direction, the third driving circuit area is disposed between the fifth wiring area and the sixth wiring area, the fourth driving circuit area is disposed between the seventh wiring area and the eighth wiring area, and the wiring line includes a first wiring line extending from the first wiring area to the third wiring area and a second wiring line extending from the sixth wiring area to the eighth wiring area, and wherein the first wiring line includes a first branch extending from the first wiring area to the first driving circuit area and electrically connected to the first driving circuit, and a second branch extending from the third wiring area to the second driving circuit area and electrically connected to the second driving circuit, and the second wiring line includes a third branch extending from the third wiring area to the third driving circuit area and electrically connected to the third driving circuit, and a fourth branch extending from the eighth wiring area to the fourth driving circuit area and electrically connected to the fourth driving circuit.

9. The display device of claim 3, wherein the first driving circuit area includes a first partial driving circuit area and a second partial driving circuit area adjacent to each other in the first direction and having a same area size as each other, and the second driving circuit area includes a third partial driving circuit area and a fourth partial driving circuit area adjacent to each other in the first direction and having a same area size as each other, and wherein the first driving circuit includes a first partial driving circuit overlapping the first partial driving circuit area and a second partial driving circuit overlapping the second partial driving circuit area, and the second driving circuit includes a third partial driving circuit overlapping the third partial driving circuit area and a fourth partial driving circuit overlapping the fourth partial driving circuit area.

10. The display device of claim 9, wherein the first partial driving circuit includes a transistor and a storage capacitor, and the second partial driving circuit includes a transistor and adjusts a magnitude of a signal generated by the first partial driving circuit.

\* \* \* \* \*